(12) United States Patent
Bruder et al.

(10) Patent No.: US 9,741,954 B2
(45) Date of Patent: Aug. 22, 2017

(54) OPTICAL DETECTOR AND METHOD FOR MANUFACTURING THE SAME

(71) Applicant: BASF SE, Ludwigshafen (DE)

(72) Inventors: Ingmar Bruder, Neuleiningen (DE); Robert Send, Karlsruhe (DE); Stephan Irle, Siegen (DE); Erwin Thiel, Siegen (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/787,909

(22) PCT Filed: Jun. 5, 2014

(86) PCT No.: PCT/EP2014/061688
§ 371 (c)(1),
(2) Date: Oct. 29, 2015

(87) PCT Pub. No.: WO2014/198625
PCT Pub. Date: Dec. 18, 2014

(65) Prior Publication Data
US 2016/0099429 A1  Apr. 7, 2016

(30) Foreign Application Priority Data

Jun. 13, 2013 (EP) .................................... 13171898
Mar. 19, 2014 (DE) ........................ 10 2014 007 775

(51) Int. Cl.
*H04N 5/335* (2011.01)
*H01L 51/44* (2006.01)
(Continued)

(52) U.S. Cl.
CPC ............ *H01L 51/441* (2013.01); *G01S 17/06* (2013.01); *H01L 27/307* (2013.01);
(Continued)

(58) Field of Classification Search
None
See application file for complete search history.

(56) References Cited

U.S. PATENT DOCUMENTS 3,035,176 A  5/1962  Kis et al.
3,384,752 A  5/1968  Odone
(Continued)

FOREIGN PATENT DOCUMENTS

CA  2196563     12/1996
CN  1677053 A   10/2005
(Continued)

OTHER PUBLICATIONS

International Search Report Issued Sep. 9, 2014 in PCT/EP2014/061688 filed Jun. 5, 2014.

(Continued)

*Primary Examiner* — Stephen Coleman
(74) *Attorney, Agent, or Firm* — Oblon, McClelland, Maier & Neustadt, L.L.P.

(57) ABSTRACT

An optical detector (110) is disclosed. The optical detector (110) comprises: —an optical sensor (112), having a substrate (116) and at least one photosensitive layer setup (118) disposed thereon, the photosensitive layer setup (118) having at least one first electrode (120), at least one second electrode (130) and at least one photovoltaic material (140) sandwiched in between the first electrode (120) and the second electrode (130), wherein the photovoltaic material (140) comprises at least one organic material, wherein the first electrode (120) comprises a plurality of first electrode stripes (124) and wherein the second electrode (130) comprises a plurality of second electrode stripes (134), wherein the first electrode stripes (124) and the second electrode stripes (134) intersect such that a matrix (142) of pixels (144) is formed at intersections of the first electrode stripes (124) and the second electrode stripes (134); and —at least (Continued)

one readout device (114), the readout device (114) comprising a plurality of electrical measurement devices (154) being connected to the second electrode stripes (134) and a switching device (160) for subsequently connecting the first electrode stripes (124) to the electrical measurement devices (154).

22 Claims, 6 Drawing Sheets

(51) Int. Cl.
*H01L 27/30* (2006.01)
*H04N 5/378* (2011.01)
*G01S 17/06* (2006.01)
*H01L 51/42* (2006.01)
*H04N 5/225* (2006.01)
*H01L 27/28* (2006.01)
*H01L 31/0256* (2006.01)

(52) U.S. Cl.
CPC ....... *H01L 51/4213* (2013.01); *H04N 5/2254* (2013.01); *H04N 5/378* (2013.01); *H01L 27/285* (2013.01); *H01L 2031/0344* (2013.01)

(56) References Cited

U.S. PATENT DOCUMENTS

| | | |
|---|---|---|
| 3,562,785 A | 2/1971 | Craig |
| 3,937,950 A | 2/1976 | Hosoe et al. |
| 3,954,340 A | 5/1976 | Blomqvist et al. |
| 4,023,033 A | 5/1977 | Bricot et al. |
| 4,053,240 A | 10/1977 | Aizawa et al. |
| 4,079,247 A | 3/1978 | Briscot et al. |
| 4,256,513 A * | 3/1981 | Yoshida ............ H01L 31/02242 106/1.14 |
| 4,469,945 A | 9/1984 | Hoeberechts et al. |
| 4,524,276 A | 6/1985 | Ohtombe |
| 4,603,258 A | 7/1986 | Sher et al. |
| 4,647,193 A | 3/1987 | Rosenfeld |
| 4,675,535 A | 6/1987 | Tsunekawa et al. |
| 4,767,211 A | 8/1988 | Munakata et al. |
| 4,927,721 A | 5/1990 | Gratzel et al. |
| 5,216,476 A | 6/1993 | Lanckton |
| 5,350,644 A | 9/1994 | Graetzel et al. |
| 6,266,142 B1 | 7/2001 | Junkins et al. |
| 6,359,211 B1 | 3/2002 | Spitler et al. |
| 6,930,297 B1 | 8/2005 | Nakamura |
| 6,995,445 B2 | 2/2006 | Forrest et al. |
| 7,022,966 B2 | 4/2006 | Gonzo et al. |
| 7,049,601 B2 | 5/2006 | Agano |
| 7,196,317 B1 | 3/2007 | Meissner et al. |
| 7,417,716 B2 | 8/2008 | Nagasaka et al. |
| 7,626,569 B2 | 12/2009 | Lanier |
| 7,677,742 B2 | 3/2010 | Hillmer et al. |
| 7,768,498 B2 | 8/2010 | Wey |
| 8,144,173 B2 | 3/2012 | Baba |
| 8,228,299 B1 | 7/2012 | Maloney et al. |
| 8,231,809 B2 | 7/2012 | Pschirer et al. |
| 8,363,526 B2 | 1/2013 | Hotta et al. |
| 8,477,580 B2 | 7/2013 | Yamamoto et al. |
| 8,563,855 B2 | 10/2013 | Pschirer et al. |
| 8,593,565 B2 | 11/2013 | Shuster |
| 8,902,354 B2 | 12/2014 | Shuster |
| 8,908,157 B2 | 12/2014 | Eisele et al. |
| 9,389,315 B2 | 7/2016 | Bruder et al. |
| 9,557,856 B2 | 1/2017 | Send et al. |
| 2001/0025938 A1 * | 10/2001 | Imai ................ G03G 5/00 250/591 |
| 2002/0011576 A1 | 1/2002 | Cho et al. |
| 2003/0017360 A1 | 1/2003 | Tai et al. |
| 2003/0094607 A1 | 5/2003 | Guenther et al. |
| 2003/0132391 A1 | 7/2003 | Agano |
| 2003/0227635 A1 | 12/2003 | Muller |
| 2004/0178325 A1 | 9/2004 | Forrest et al. |
| 2004/0216625 A1 | 11/2004 | Birnstock et al. |
| 2005/0052120 A1 | 3/2005 | Gupta et al. |
| 2005/0184301 A1 | 8/2005 | Nagasaka et al. |
| 2005/0217720 A1 | 10/2005 | Rey-Mermet et al. |
| 2005/0268957 A1 | 12/2005 | Enomoto et al. |
| 2005/0269616 A1 * | 12/2005 | Andriessen .......... H01G 9/2031 257/296 |
| 2006/0049397 A1 | 3/2006 | Pfeiffer et al. |
| 2006/0082546 A1 | 4/2006 | Wey |
| 2007/0008515 A1 | 1/2007 | Otani et al. |
| 2007/0010924 A1 | 1/2007 | Otani et al. |
| 2007/0080925 A1 | 4/2007 | Radivojevic et al. |
| 2007/0122927 A1 | 5/2007 | Li et al. |
| 2007/0176165 A1 | 8/2007 | Forrest et al. |
| 2008/0080789 A1 * | 4/2008 | Marks .................. A63F 13/06 382/296 |
| 2008/0259310 A1 | 10/2008 | Wada |
| 2008/0269482 A1 | 10/2008 | Pschirer et al. |
| 2008/0297487 A1 | 12/2008 | Hotelling et al. |
| 2009/0046543 A1 | 2/2009 | De Hoog et al. |
| 2009/0097010 A1 | 4/2009 | Yamaguchi |
| 2009/0231582 A1 | 9/2009 | Aebischer |
| 2010/0091263 A1 | 4/2010 | Kumagai et al. |
| 2010/0141964 A1 | 6/2010 | Horsch |
| 2010/0194942 A1 | 8/2010 | Wada |
| 2010/0231513 A1 | 9/2010 | Deliwala |
| 2010/0258179 A1 * | 10/2010 | Wieting ............ H01L 31/02242 136/256 |
| 2010/0279458 A1 * | 11/2010 | Yeh ................ H01L 31/02242 438/98 |
| 2010/0282309 A1 | 11/2010 | Pschirer et al. |
| 2010/0283868 A1 | 11/2010 | Clark et al. |
| 2010/0297405 A1 | 11/2010 | Flores et al. |
| 2011/0055846 A1 | 3/2011 | Perez et al. |
| 2011/0096319 A1 | 4/2011 | Otani et al. |
| 2011/0099105 A1 | 4/2011 | Mennie et al. |
| 2011/0103215 A1 | 5/2011 | Hotta et al. |
| 2011/0123188 A1 | 5/2011 | Cardwell et al. |
| 2011/0194097 A1 | 8/2011 | Yamaguchi et al. |
| 2011/0297235 A1 | 12/2011 | Bergmann |
| 2011/0306413 A1 | 12/2011 | Bickerstaff et al. |
| 2012/0063287 A1 | 3/2012 | Yamamoto et al. |
| 2012/0206336 A1 | 8/2012 | Bruder |
| 2012/0242867 A1 | 9/2012 | Shuster |
| 2012/0249998 A1 | 10/2012 | Eisele et al. |
| 2012/0250137 A1 | 10/2012 | Maxik et al. |
| 2012/0262365 A1 | 10/2012 | Mallinson |
| 2012/0289672 A1 | 11/2012 | Kastler et al. |
| 2013/0076695 A1 | 3/2013 | Gomez et al. |
| 2013/0135604 A1 | 5/2013 | Gogolla et al. |
| 2013/0222551 A1 | 8/2013 | Shamir et al. |
| 2013/0271818 A1 | 10/2013 | Maxik et al. |
| 2014/0078376 A1 | 3/2014 | Shuster |
| 2014/0132724 A1 | 5/2014 | Choi et al. |
| 2014/0211295 A1 | 7/2014 | Maxik et al. |
| 2014/0291480 A1 | 10/2014 | Bruder et al. |
| 2015/0085166 A1 | 3/2015 | Shuster |
| 2015/0124241 A1 | 5/2015 | Eisele et al. |
| 2015/0124268 A1 | 5/2015 | Bruder et al. |
| 2015/0286340 A1 | 10/2015 | Send et al. |
| 2016/0099429 A1 | 4/2016 | Bruder et al. |
| 2016/0124074 A1 | 5/2016 | Wonneberger et al. |
| 2016/0127664 A1 | 5/2016 | Bruder et al. |
| 2016/0139243 A1 | 5/2016 | Send et al. |
| 2016/0266257 A1 | 9/2016 | Bruder et al. |
| 2016/0364015 A1 | 12/2016 | Send et al. |

FOREIGN PATENT DOCUMENTS

| | | |
|---|---|---|
| CN | 1809801 A | 7/2006 |
| CN | 1896686 A | 1/2007 |
| CN | 101290348 A | 10/2008 |
| CN | 101650173 A | 2/2010 |
| CN | 102096962 | 6/2011 |
| CN | 201897828 | 7/2011 |
| CN | 102549381 A | 7/2012 |
| CN | 102737435 | 10/2012 |

(56) References Cited

FOREIGN PATENT DOCUMENTS

| | | |
|---|---|---|
| CN | 103492835 | 1/2014 |
| DE | 2 417 854 A1 | 10/1974 |
| DE | 25 01 124 | 8/1975 |
| DE | 32 25 372 | 2/1983 |
| DE | 10 2005 043 627 A1 | 3/2007 |
| DE | 10 2005 053 995 | 5/2007 |
| DE | 10 2007 037 875 A1 | 2/2009 |
| EP | 0 185 450 | 6/1986 |
| EP | 0 185 450 A2 | 6/1986 |
| EP | 0 754 930 A2 | 1/1997 |
| EP | 1 176 646 | 1/2002 |
| EP | 1 191 819 | 3/2002 |
| EP | 1 330 117 | 7/2003 |
| EP | 1 667 246 | 6/2006 |
| EP | 2 205 657 | 7/2010 |
| EP | 2 220 141 | 8/2010 |
| EP | 2 507 286 | 10/2012 |
| EP | 2 527 866 A1 | 11/2012 |
| EP | 2 813 324 | 12/2014 |
| GB | 2 432 723 | 5/2007 |
| JP | 8-159714 | 6/1996 |
| JP | 8-292586 A | 11/1996 |
| JP | 10-26513 A | 1/1998 |
| JP | 10-221064 | 8/1998 |
| JP | 2005-241340 A | 9/2005 |
| WO | 99 09603 | 2/1999 |
| WO | WO 01/29576 A1 | 4/2001 |
| WO | 02 101838 | 12/2002 |
| WO | 03/012371 A1 | 2/2003 |
| WO | WO 2004/114112 A1 | 12/2004 |
| WO | WO 2005/106965 A1 | 11/2005 |
| WO | WO 2006/134370 | 12/2006 |
| WO | 2007 054470 | 5/2007 |
| WO | 2009 013282 | 1/2009 |
| WO | WO 2009/053291 A1 | 4/2009 |
| WO | WO 2009/058115 A1 | 5/2009 |
| WO | 2010 094636 | 8/2010 |
| WO | WO 2010/088032 A2 | 8/2010 |
| WO | WO 2011/067192 A2 | 6/2011 |
| WO | WO 2012/001628 A1 | 1/2012 |
| WO | WO 2012/046181 A1 | 4/2012 |
| WO | WO 2012/049038 A1 | 4/2012 |
| WO | 2012 085803 | 6/2012 |
| WO | WO 2012/085803 A1 | 6/2012 |
| WO | 2012 110924 | 8/2012 |
| WO | WO 2012/110924 | 8/2012 |
| WO | WO 2012/139354 | 10/2012 |
| WO | 2012/152812 A1 | 11/2012 |
| WO | 2012/168395 A1 | 12/2012 |
| WO | WO 2013/091016 A1 | 6/2013 |
| WO | 2013/118037 A1 | 8/2013 |
| WO | WO 2013/144177 A1 | 10/2013 |
| WO | 2013/170982 A1 | 11/2013 |
| WO | 2014 097181 | 6/2014 |
| WO | WO 2014/097181 A1 | 6/2014 |
| WO | 2014/198623 A1 | 12/2014 |
| WO | 2014/198625 A1 | 12/2014 |
| WO | 2014/198626 A1 | 12/2014 |
| WO | 2014/198629 A1 | 12/2014 |
| WO | 2015/024871 A1 | 2/2015 |

OTHER PUBLICATIONS

Written Opinion of the International Searching Authority Issued Sep. 9, 2014 in PCT/EP2014/061688 filed Jun. 5, 2014.
Kumara, G. et al., "Fabrication of Dye-Sensitized Solar Cells Using Triethylamine Hydrothiocyanate as a CuI Crystal Growth Inhibitor ", Langmuir, vol. 18, No. 26, pp. 10493-10495, 2002.
Leijtens, T. et al., "Hole Transport Materials with Low Glass Transition Temperatures and High Solubility for Application in Solid-State Dye-Sensitized Solar Cells ", ACS Nano, vol. 6, No. 2, pp. 1455-1462, 2012.
Paul Pargas, "Phenomena of Image Sharpness Recognition of CdS and CdSe Photoconductors" Journal of the Optical Society of America, vol. 54, No. 4, Apr. 1964, pp. 516-519.
Paul Pargas, "A Lens Measuring Method Using Photoconductive Cells" Journal of the SMPTE, vol. 74, Jun. 1965, pp. 501-504.
Jack T. Billings, "An Improved Method for Critical Focus of Motion-Picture Optical Printers" Journal of the SMPTE, vol. 80, Aug. 1971, pp. 624-628.
International Preliminary Report on Patentability and Written Opinion issued Dec. 23, 2015 in PCT/EP2014/061688 filed on Jun. 5, 2014.
O'Rogan, B. et al., "A low-cost, high-efficiency solar cell based on dye-sensitized colloidal $TiO_2$ films ", Nature, vol. 353, pp. 737-740, 1991.
Bach, U. et al., "Solid-state dye-sensitized mesoporous $TiO_2$ solar cells with high photon-to-electron conversion efficiencies", Nature, vol. 395, pp. 583-585, 1998.
Peng, B. et al., "Systematic investigation of the role of compact $TiO_2$ layer in solid state dye-sensitized TiO2 solar cells", Coordination Chemistry Reviews, vol. 248, pp. 1479-1489, 2004.
Saragi, T. P. I. et al., "Comparison of Charge-Carrier Transport in Thin Films of Spiro-Linked Compounds and Their Corresponding Parent Compounds", Advanced Functional Materials, vol. 16, pp. 966-974, 2006.
Schmidt-Mende, L. et al., "Organic Dye for Highly Efficient Solid-State Dye-Sensitized Solar Cells", Advanced Materials, vol. 17, No. 7 pp. 813-815, 2005.
Perera, V. P. S. et al., "Dye-Sensitized Solid-State Photovoltaic Cells Based on Dye Multilayer-Semiconductor Nanostructures", J. Phys. Chem. B., vol. 107, pp. 13758-13761, 2003.
International Search Report and Written Opinion issued May 31, 2012 in PCT/IB2012/050592 filed on Feb. 9, 2012.
Erwin Bacher. et al., "Synthesis and Characterization of Photo-Cross-Linkable Hole-Conducting Polymers", Macromolecules, vol. 38, 2005, pp. 1640-1647.
H. Bruce Goodbrand, et al., "Ligand-Accelerated Catalysis of the Ullmann Condensation: Application to Hole Conducting Triarylamines", J. Org. Chem., vol. 64, 1999, pp. 670-674.
John P. Wolfe, et al., "Rational Development of Practical Catalysts for Aromatic Carbon-Nitrogen Bond Formation", Acc. Chem. Res. vol. 31, 1998, pp. 805-818.
Felix E. Goodson, et al., "Palladium-Catalyzed Synthesis of Pure, Regiodefined Polymeric Triarylarnines", J. Am. Chem. Soc., vol. 121, 1999, pp. 7527-7539.
John F. Hartwig, "Transition Metal Catalyzed Synthesis of Arylamines and Aryl Ethers from Aryl Halides and Triflates: Scope and Mechanism", Angew. Chem. Int. Ed., vol. 37, 1998, pp. 2046-2067.
Sheila I. Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.
Ping-Hsin Huang, et al., "Synthesis and Characterization of new fluorescent two-photon absorption chromophores", J. Mater. Chem., vol. 16, 2006, pp. 850-857.
Qinglan Huang. et al., "Molecularly 'Engineered' Anode Adsorbates for Probing OLED Interfacial Structure -Charge Injection/Luminance Relationships: Large, Structure-Dependent Effects", J. Am. Chem. Soc., vol. 125. 2003. pp. 14704-14705.
A. Balionyte. et al., "Carbazolyl-substituted triphenyldiamine derivatives as novel photoconductive amorphous molecular materials". Journal of Photochemistry and Photobiology A: Chemistry, vol. 162, 2004. pp. 249-252.
Bryant H. Yang, et al., "Palladium-Catalyzed amination of aryl halides and sulfonates", Journal of Organometallic Chemistry, vol. 576, 1999, pp. 125-146.
Zhong Hui Li, et al., "Synthesis and Functional Properties of Strongly Luminescent Diphenylamino End-Capped Oligophenylenes", J. Org. Chem., vol. 69, 2004, pp. 921-927.
James Lindley, "Copper Assisted Nucleophilic Substitution of Aryl Halogen", Tetrahedron, vol. 40, No. 9, 1984, pp. 1433-1456.
Yunqi Liu, et al., "Synthesis and characterization of a novel bipolar polymer for light-emitting diodes", Chem. Commun., vol. 24, 1998, pp. 2747-2748.

(56) References Cited

OTHER PUBLICATIONS

Narukuni Hirata, et al., "Interface engineering for solid-state dye-sensitised nanocrystalline solar cells: the use of an organic redox cascade", Chem. Commun.. vol. 5, 2006. pp. 535-537.
Qingjiang Yu, et al., "High-Efficiency Dye-Sensitized Solar Cells: The Influence of Lithium Ions on Excitors Dissociation. Charge Recombination, and Surface States", ACS Nano. vol. 4, No. 10, 2010, pp. 6032-6038.
Jiun Yi Shen, et al., "High $T_g$ blue emitting materials for electroluminescent devices", J. Mater. Chem., vol. 15, 2005, pp. 2455-2463.
DLP-Techoolgie, www.dlp.com/de/technology/how-dlp-works.
Leysop Ltd,. Manfacturers and Suppliers of Electro-Optic Components, http://www.leysop.com/integrated_pockels_cell.htm.
M. R. Andersen, et al., "Kinect Depth Sensor Evaluation for Computer Vision Applications",Electrical and Computer Engineering, Technical Report ECE-TR-6, Aarhus University, 2012, 39 pages.
Takumi Kinoshita, et al., "Wideband dye-sensitized solar cells employing a phosphine-coordinated ruthenium sensitizer", Nature Photonics, vol. 7, 2013, pp. 535-239.
International Search Report and Written Opinion issued Oct. 31, 2014 in PCT/EP2014/067466 filed Aug. 15, 2014.
Seigo Ito, et al., "High-Efficiency Organic-Dye-Sensitized Solar Cells Controlled by Nanocrystalline-$TiO_2$ Electrode Thickness", Adv. Mater., vol. 18, 2006, pp. 1202-1205.
Atte Haapalinna, et al., "Measurement of the Absolute Linearity of Photodetectors with a Diode Laser." Meas. Sci. Technol.. 10, (1999) 1075-1078.
International Search Report and Written Opinion of the International Searching Authority issued May 16, 2014 in PCT/IB2013/061095.
Volker Viereck, et al., "Large-area applications of optical MEMS: micromirror arrays guide daylight, optimize indoor illumination" Optical Components. Photonik International 2. 2009, pp. 48-49.
C.U. Murade, et al., "High speed adaptive liquid microlens array", Optics Express, vol. 20, No. 16, Jul. 2012, pp. 18180-18187.
Jason Heikenfeld. et al., "Recent Progress in Arrayed Electrowetting Optics", Optics & Photonics News. Jan. 2009, 7 pages, www.osa-opn.org.
Tao Peng, "Algorithms and models for 3-D shape measurement using digital fringe projections", Dissertation, University of AY Maryland (College Park, Md.), Jan. 16, 2007, 268 pages (http://drum.lib.umd.edu//handle/1903/6654; http://en.wikipedia.org/wiki/Gray_code; http://en.wikipedia.org/wiki/Structured-light_3D_scanner).
Jie-Ci Yang, et al., "An Intelligent Automated Door Control System Based on a Smart Camera", Sensors, 2013. 13(5), pp. 5923-5936.
D. Scaramuzza, et al., "Extrinsic Self Calibration of a Camera and a 3D Laser Range Finder from Natural Scenes" 2007 IEEE/RSJ International Conference on Intelligent Robots and Systems, 2007, 8 pages.
Denis Klimentjew, et al., "Multi Sensor Fusion of Camera and 3D Laser Range Finder for Object Recognition" 2010 IEEE International Conference on Multisensor Fusion and Integration for Intelligent Systems, 2010, pp. 236-241.
Hiura Shinsaku et al., "Depth Measurement by the Multi-Focus Camera," Computer Vision and Pattern Recognition, 1998. Proceedings. 1998 IEEE Computer Society Conference on Santa Barbara, CA, USA, Jun. 23-25, 1998, pp. 953-959.
Kuthirummal, S., et al., "Flexible Depth of Field Photography," IEEE Transactions on Pattern Analysis and Machine Intelligence, vol. 33, No. 1 (2011), pp. 58-71.
"So funktioniert die DLP-Technologie" DLP-Technologie—www.dlp.com/de/technology/how-dlp-works, 2014, 2 Pages.
"New-Ultra-Compact Pockels Cells with Brewster Polarizer and Waveplate for Laser Q-Switching" Leysop Ltd, Manfacturers and Suppliers of Electro-Optic Components—http://www.leysop.com/integrated_pockels_cell.htm. Aug. 4, 2013, 2 Pages.
Extended Search Report issued Aug. 23, 2011 in Europe Application No. 11154531.5 (With English Translation of Category of Cited Documents).
Supplementary European Search Report issued Nov. 19, 2014, issued in corresponding European Patent Application No. EP 12 74 6808.
Office Action issued Apr. 22, 2015 in Chinese Patent Application No. 201280018328.5 (submitting English translation only).
International Search Report and Written Opinion issued Sep. 3, 2014 in PCT/EP2014/061691.
International Search Report issued Sep. 24, 2014 in PCT/EP2014/061682.
International Preliminary Report on Patentability and Written Opinion issued Dec. 15, 2015 in PCT/EP2014/061682.
International Preliminary Report on Patentability and Written Opinion issued Dec. 23, 2015 in PCT/EP2014/061695.
International Preliminary Report on Patentability issued Sep. 25, 2015 in PCT/EP2014/061691.
International Search Report and Written Opinion issued Oct. 31, 2014 in PCT/EP2014/067466.
International Search Report and Written Opinion issued Nov. 21, 2014 in PCT/EP2014/067465.
International Search Report and Written Opinion of the International Searching Authority Issued Mar. 12, 2015 in PCT/EP2014/078155 Filed Dec. 17, 2014.
International Search Report issued Aug. 28, 2015, in PCT/IB2015/052769, filed Apr. 16, 2015.
International Search Report and Written Opinion Issued Jun. 30, 2015 in PCT/IB15/052233 Filed Mar. 26, 2015.
International Search Report issued on Sep. 22, 2015, in Application No. PCT/IB2015/052785, filed on Apr. 16, 2015.
International Search Report issued Nov. 27, 2015, in PCT/IB2015/055121, filed Jul. 7, 2015.
International Search Report and Written Opinion issued Mar. 29, 2016, in PCT/IB2015/054536, filed Jun. 16, 2015.

* cited by examiner

OPTICAL DETECTOR AND METHOD FOR MANUFACTURING THE SAME

FIELD OF THE INVENTION

The present invention is based on previous European patent application number 13171898.3, the full content of which is herewith included by reference. The invention relates to an optical detector, a detector system, a human-machine interface, an entertainment device, a tracking system, a camera, a method for manufacturing an optical detector, a method of taking at least one image of an object and to various uses of the optical detector according to the present invention. The devices and methods according to the present invention are mainly used in the field of imaging and camera technology, such as for detecting at least one object and/or for taking an image of at least one object. Thus, the optical detector according to the present invention specifically may be used in the field of photography and/or for purposes of human-machine-interfaces or gaming. Other applications, however, are feasible.

PRIOR ART

A large number of optical sensors and photovoltaic devices are known from the prior art. While photovoltaic devices are generally used to convert electromagnetic radiation, for example, ultraviolet, visible or infrared light, into electrical signals or electrical energy, optical detectors are generally used for picking up image information and/or for detecting at least one optical parameter, for example, a brightness.

It is generally known that optical sensors may be based on the use of inorganic and/or organic sensor materials. Examples of such sensors are disclosed in US 2007/0176165 A1, U.S. Pat. No. 6,995,445 B2, DE 2501124 A1, DE 3225372 A1 or else in numerous other prior art documents. To an increasing extent, in particular for cost reasons and for reasons of large-area processing, sensors comprising at least one organic sensor material are being used, as described for example in US 2007/0176165 A1. In particular, so-called dye solar cells are increasingly of importance here, which are described generally, for example in WO 2009/013282 A1.

A plurality of detectors for detecting at least one object are known, which are based on such optical sensors. Such detectors can be embodied in various ways, depending on the respective purpose of use. Examples of such detectors are imaging devices, for example, cameras and/or microscopes. High-resolution confocal microscopes are known, for example, which can be used in particular in the field of medical technology and biology in order to examine biological samples with high optical resolution. Further examples of detectors for optically detecting at least one object are distance measuring devices based, for example, on propagation time methods of corresponding optical signals, for example laser pulses. Further examples of detectors for optically detecting objects are triangulation systems, by means of which distance measurements can likewise be carried out.

In US 20070080925 A1, a low power consumption display device is disclosed. Therein, photoactive layers are utilized that both respond to electrical energy to allow a display device to display information and that generate electrical energy in response to incident radiation. Display pixels of a single display device may be divided into displaying and generating pixels. The displaying pixels may display information and the generating pixels may generate electrical energy. The generated electrical energy may be used to provide power to drive an image. A technically complex driving electronics of the generating pixels and the displaying pixels is required.

In EP 1 667 246 A1, a sensor element capable of sensing more than one spectral band of electromagnetic radiation with the same spatial location is disclosed. The element consists of a stack of sub-elements each capable of sensing different spectral bands of electromagnetic radiation. The sub-elements each contain a non-silicon semiconductor where the non-silicon semiconductor in each sub-element is sensitive to and/or has been sensitized to be sensitive to different spectral bands of electromagnetic radiation.

In WO 2012/110924 A1, the content of which is herewith included by reference, a detector for optically detecting at least one object is proposed. The detector comprises at least one optical sensor. The optical sensor has at least one sensor region. The optical sensor is designed to generate at least one sensor signal in a manner dependent on an illumination of the sensor region. The sensor signal, given the same total power of the illumination, is dependent on a geometry of the illumination, in particular on a beam cross section of the illumination on the sensor area. The detector furthermore has at least one evaluation device. The evaluation device is designed to generate at least one item of geometrical information from the sensor signal, in particular at least one item of geometrical information about the illumination and/or the object.

U.S. provisional applications 61/739,173, filed on Dec. 19, 2012, 61/749,964, filed on Jan. 8, 2013, and 61/867,169, filed on Aug. 19, 2013, and international patent application PCT/IB2013/061095, filed on Dec. 18, 2013, the full content of all of which is herewith included by reference, disclose a method and a detector for determining a position of at least one object, by using at least one transversal optical sensor and at least one optical sensor. Specifically, the use of sensor stacks is disclosed, in order to determine a longitudinal position of the object with a high degree of accuracy and without ambiguity.

Despite the advantages implied by the above-mentioned devices and detectors, specifically by the detectors disclosed in WO 2012/110924 A1, U.S. 61/739,173 and 61/749,964, several technical challenges remain. Thus, generally, a need exists for optical detectors which are capable of capturing an image of an object, specifically a 3D image, and which are both reliable and, still, may be manufactured at low cost. Further, for various purposes, it is desirable to provide optical detectors which are both transparent and capable of capturing an image of an object.

Problem Addressed by the Invention

It is therefore an object of the present invention to provide an optical detector and a method for manufacturing the same which address the above-mentioned technical challenges. Specifically, an optical detector shall be disclosed which is capable of taking an image of an object, preferably at high resolution, which is both reliable and may be manufactured at a low cost.

DESCRIPTION OF THE INVENTION

This problem is solved by the invention with the features of the independent patent claims. Advantageous developments of the invention, which can be realized individually or in combination, are presented in the dependent claims and/or in the following specification and detailed embodiments.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A. Further, as used herein, the expressions "specifically", "preferably", "more preferably" or "most preferably" are used in order to mark specific options for realizing certain optional features of the present invention, notwithstanding the fact that other embodiments are feasible. It shall be noted that no restriction of the scope of the claims shall be intended by the use of these expressions.

Further, as used in the following, the terms "preferably", "more preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restrictions regarding the scope of the invention and without any restriction regarding the possibility of combining the features introduced in such way with other optional or non-optional features of the invention.

In a first aspect of the present invention, an optical detector is disclosed. As used herein, an optical detector is a device capable of measuring at least one optical signal. Specifically, the optical detector shall be adapted for taking at least one image of an object. As further used herein, the term "image" generally refers to an array of information values, specifically a two-dimensional or even three-dimensional or higher-dimensional array of information values, wherein each information value indicates a signal generated by an imaging element of an array of imaging elements, wherein the imaging elements of the array of imaging elements, in the following, are also referred to as "pixels". Consequently, the expression "imaging" generally refers to the action of taking an image as defined above.

The optical detector according to the present invention may be used for various purposes. Thus, as an example, the optical detector may be used in the field of photography, specifically in the field of digital photography and/or in a digital camera. Additionally or alternatively, the optical detector may be used in human-machine-interfaces, in order to translate a position and/or orientation of a user and/or an object into an information and/or command readable by a machine. Specifically, the optical detector may be used in a human-machine-interface in the field of computer gaming, such as for recognizing a position and/or an orientation of a user, a body part of a user and/or a control element which may be held and/or influenced by a user. Other applications are feasible.

The optical detector comprises at least one optical sensor. As used herein, the term "optical sensor" generally refers to an element having a plurality of imaging elements, which, as will be outlined in further detail below, are also referred to as "pixels". Thus, an optical sensor comprises a plurality, preferably a matrix of, imaging elements, such as light-sensitive imaging elements, such as a matrix of pixels.

The optical sensor comprises at least one substrate and at least one photosensitive layer setup disposed thereon. As used herein, the expression "substrate" generally refers to a carrier element providing mechanical stability to the optical sensor. As will be outlined in further detail below, the substrate may be a transparent substrate and/or an intransparent substrate. As an example, the substrate may be a plate-shaped substrate, such as a slide and/or a foil. The substrate generally may have a thickness of 100 µm to 5 mm, preferably a thickness of 500 µm to 2 mm. However, other thicknesses are feasible.

As further used herein, a photosensitive layer setup generally refers to an entity having two or more layers which, generally, has light-sensitive properties. Thus, the photosensitive layer setup is capable of converting light in one or more of the visible, the ultraviolet or the infrared spectral range into an electrical signal. For this purpose, a large number of physical and/or chemical effects may be used, such as photo effects and/or excitation of organic molecules and/or formation of excited species within the photosensitive layer setup.

The photosensitive layer setup has at least one first electrode, at least one second electrode and at least one photovoltaic material sandwiched in between the first electrode and the second electrode. As will be outlined in further detail below, the photosensitive layer setup may be embodied such that the first electrode is closest to the substrate and, thus, is embodied as a bottom electrode. Alternatively, the second electrode may be closest to the substrate and, thus, may be embodied as a bottom electrode. Generally, the expressions "first" and "second", as used herein, are used for identification purposes only, without intending any ranking and/or without intending to denote any order of the photosensitive layer setup. Generally, the term "electrode" refers to an element of the photosensitive layer setup capable of electrically contacting the at least one photovoltaic material sandwiched in between the electrodes. Thus, each electrode may provide one or more layers and/or fields of an electrically conductive material contacting the photovoltaic material. Additionally, each of the electrodes may provide additional electrical leads, such as one or more electrical leads for contacting the first electrode and/or the second electrode. Thus, each of the first and second electrodes may provide one or more contact pads for contacting the first electrode and/or the second electrode, respectively. As will be outlined in further detail below, at least one electrode contact pad may be provided for each of the first electrode stripes and/or for each of the second electrode stripes which will be defined in further detail below.

As used herein, a photovoltaic material generally is a material or a combination of materials providing the above-mentioned photosensitivity of the photosensitive layer setup. Thus, the photovoltaic material may provide one or more layers of material which, under illumination by light in one or more of the visible, the ultraviolet or the infrared spectral range, are capable of generating an electrical signal, preferably an electrical signal indicating an intensity of illumination. Thus, the photovoltaic material may comprise one or more photovoltaic material layers which, by itself or in combination, are capable of generating positive and/or negative charges in response to the illumination, such as electrons and/or holes.

As used herein, the term "sandwiched" generally refers to the fact that the photovoltaic material, at least partially, is located in an intermediate space in between the first electrode and the second electrode, notwithstanding the fact that other regions of the photovoltaic material may exist, which are located outside the intermediate space in between the first electrode and the second electrode.

The photovoltaic material comprises at least one organic material. Further, the first electrode comprises a plurality of first electrode stripes, and the second electrode comprises a plurality of second electrode stripes. As used herein, the term "stripe generally refers to an elongated sheet, an elongated layer of material or an elongated combination of layers of materials, having a length or elongation which is larger than its width, such as by at least a factor of 2, more preferably at least a factor of 5, most preferably at least a factor of 10 or at least a factor of 15. Thus, a stripe may be an elongated rectangular stripe. Additionally or alternatively, the stripe may comprise one or more bents, curves or other non-linear elements. Thus, generally, the stripes may be linear stripes or may fully or partially be embodied as curved or bent stripes, such as meander shaped stripes. A plurality of stripes preferably may, at least partially, be oriented in a parallel way. Thus, as an example, the first electrode stripes may be parallel first electrode stripes. Similarly, the second electrode stripes may be parallel second electrode stripes. In case the electrode stripes are bent and/or curved, the parallel orientation may be present at least for sections of these electrode stripes. Other orientations are feasible. Further, the stripes may have a uniform width all over the elongation of each stripe. Thus, the width may be constant from a beginning of each stripe to the end of the stripe. Additionally or alternatively, the stripes each may have at least one section with a varying width. Preferably, however, the width of each stripe, over the full elongation of the stripe, does not change by more than 50%, more preferably by no more than 20% and, most preferably, by no more than 10% or even no more than 5%.

Thus, as an example, the electrode stripes may have a rectangular, elongated shape. Preferably, the first electrode stripes are parallel to each other, and the second electrode stripes are parallel to each other, at least in a part of their longitudinal extension. Further, preferably, the first electrode stripes are located in a first electrode plane, whereas the second electrode stripes are located in a second electrode plane, wherein, preferably, the first electrode plane and the second electrode plane are oriented parallel to each other. Thus, preferably, the photovoltaic material at least partially is located in a space in between the first electrode plane and the second electrode plane.

The first electrode stripes and the second electrode stripes intersect such that a matrix of pixels is formed at intersections of the first electrode stripes and the second electrode stripes. As used herein, the term "intersect" refers to the fact that, in a direction of view perpendicular to the substrate surface, the first electrode plane and the second electrode plane and/or in a direction parallel to an optical axis of the optical sensor, the first and second electrode stripes overlap. Each pixel comprises a portion of a first electrode stripe and an opposing portion of a second electrode stripe and an amount of the photovoltaic material located in between the portion of the first electrode stripe and the second electrode stripe. As an example, specifically in case the electrode stripes are elongated rectangular electrode stripes, the pixels may have a rectangular shape and/or a shape of a parallelogram, specifically in a direction of view perpendicular to a substrate surface. Thus, each of the pixels forms an imaging element, comprising the portion of the first electrode stripe, the portion of the second electrode stripe and the at least one photovoltaic material embedded in between these portions.

As further used herein, a matrix generally refers to a two-dimensional arrangement of pixels. Thus, the matrix preferably may be a rectangular matrix having rows and columns of pixels, as will be outlined in further detail below. Still, other shapes of the matrix of pixels are feasible.

Further, each of the first electrode stripes and/or each of the second electrode stripes may have at least one contacting portion, such as at least one contact pad, for electrically contacting the respective electrode stripe. This at least one contacting portion preferably may be located outside the matrix of pixels, such as close to a rim of the substrate. However, other embodiments are feasible.

The optical detector further comprises at least one readout device. As used herein, the term "readout device" generally refers to a device or combination of devices adapted for generating a plurality of measurement values and/or information values by using the pixels of the matrix of pixels of the optical sensor. Thus, generally, the readout device may be a device which is capable of generating an image from electrical signals captured by using the matrix of pixels. Thus, as will be outlined in further detail below, the at least one readout device may comprise a plurality of electrical measurement devices, such as a plurality of voltmeters and/or a plurality of amperemeters. Further, the readout device may comprise additional elements, such as a data memory, for storing the information values generated that way, such as for storing one image and/or for storing a plurality of images and/or an image sequence. Further, additionally or alternatively, the at least one readout device may comprise one or more electrical interfaces for data transfer, such as for transferring information values to one or more external devices, such as to one or more data processing devices, wherein the at least one interface may be a wireless interface and/or may fully or partially be embodied as a wire-bound interface.

The readout device also may be referred to as an evaluation device, may be part of a larger evaluation device or may comprise at least one evaluation device. As used herein, the term evaluation device generally refers to an arbitrary device adapted to evaluate one or more sensor signals provided by the at least one optical sensor and/or for performing one or more further evaluation algorithms. The evaluation device specifically may comprise at least one data processing device and, more preferably, by using at least one processor. Thus, as an example, the at least one evaluation device may comprise at least one data processing device having a software code stored thereon comprising a number of computer commands.

The evaluation device may be or may comprise one or more integrated circuits, such as one or more application-specific integrated circuits (ASICs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the sensor signals, such as one or more AD-converters and/or one or more filters. Further, the evaluation device may comprise one or more measurement devices, such as one or more measurement devices for measuring electrical currents and/or electrical voltages. Thus, as an example, the evaluation device may comprise one or more measurement devices for measuring electrical currents through and/or electrical voltages of the pixels. Further, the evaluation device may comprise one or more data storage devices. Further, the evaluation device may comprise one or more interfaces, such as one or more wireless interfaces and/or one or more wire-bound interfaces.

The at least one evaluation device may be adapted to perform at least one computer program, such as at least one computer program adapted for performing or supporting one or more or even all of the method steps of the method according to the present invention. As an example, one or more algorithms may be implemented which, by using the sensor signals as input variables, may determine the position of the object.

The evaluation device can be connected to or may comprise at least one further data processing device that may be used for one or more of displaying, visualizing, analyzing, distributing, communicating or further processing of information, such as information obtained by the optical sensor and/or by the evaluation device. The data processing device, as an example, may be connected or incorporate at least one of a display, a projector, a monitor, an LCD, a TFT, a loudspeaker, a multichannel sound system, an LED pattern, or a further visualization device. It may further be connected or incorporate at least one of a communication device or communication interface, a connector or a port, capable of sending encrypted or unencrypted information using one or more of email, text messages, telephone, bluetooth, Wi-Fi, infrared or internet interfaces, ports or connections. It may further be connected or incorporate at least one of a processor, a graphics processor, a CPU, an Open Multimedia Applications Platform (OMAP™), an integrated circuit, a system on a chip such as products from the Apple A series or the Samsung S3C2 series, a microcontroller or microprocessor, one or more memory blocks such as ROM, RAM, EEPROM, or flash memory, timing sources such as oscillators or phase-locked loops, counter-timers, real-time timers, or power-on reset generators, voltage regulators, power management circuits, or DMA controllers. Individual units may further be connected by buses such as AMBA buses.

The evaluation device and/or the data processing device may be connected by or have further external interfaces or ports such as one or more of serial or parallel interfaces or ports, USB, Centronics Port, FireWire, HDMI, Ethernet, Bluetooth, RFID, Wi-Fi, USART, or SPI, or analog interfaces or ports such as one or more of ADCs or DACs, or standardized interfaces or ports to further devices such as a 2D-camera device using an RGB-interface such as Camera-Link. The evaluation device and/or the data processing device may further be connected by one or more of interprocessor interfaces or ports, FPGA-FPGA-interfaces, or serial or parallel interfaces ports. The evaluation device and the data processing device may further be connected to one or more of an optical disc drive, a CD-RW drive, a DVD+RW drive, a flash drive, a memory card, a disk drive, a hard disk drive, a solid state disk or a solid state hard disk.

The evaluation device and/or the data processing device may be connected by or have one or more further external connectors such as one or more of phone connectors, RCA connectors, VGA connectors, hermaphrodite connectors, USB connectors, HDMI connectors, 8P8C connectors, BCN connectors, IEC 60320 C14 connectors, optical fiber connectors, D-subminiature connectors, RF connectors, coaxial connectors, SCART connectors, XLR connectors, and/or may incorporate at least one suitable socket for one or more of these connectors.

Possible embodiments of a single device incorporating one or more of the optical detectors according to the present invention, the evaluation device or the data processing device, such as incorporating one or more of the optical sensor, optical systems, evaluation device, communication device, data processing device, interfaces, system on a chip, display devices, or further electronic devices, are: mobile phones, personal computers, tablet PCs, televisions, game consoles or further entertainment devices. In a further embodiment, the 3D-camera functionality which will be outlined in further detail below may be integrated in devices that are available with conventional 2D-digital cameras, without a noticeable difference in the housing or appearance of the device, where the noticeable difference for the user may only be the functionality of obtaining and or processing 3D information.

Specifically, an embodiment incorporating the optical detector and/or a part thereof such as the evaluation device and/or the data processing device may be: a mobile phone incorporating a display device, a data processing device, the optical sensor, optionally the sensor optics, and the evaluation device, for the functionality of a 3D camera. The detector according to the present invention specifically may be suitable for integration in entertainment devices and/or communication devices such as a mobile phone.

A further embodiment of the present invention may be an incorporation of the optical detector or a part thereof such as the evaluation device and/or the data processing device in a device for use in automotive, for use in autonomous driving or for use in car safety systems such as Daimler's Intelligent Drive system, wherein, as an example, a device incorporating one or more of the optical sensors, optionally one or more optical systems, the evaluation device, optionally a communication device, optionally a data processing device, optionally one or more interfaces, optionally a system on a chip, optionally one or more display devices, or optionally further electronic devices may be part of a vehicle, a car, a truck, a train, a bicycle, an airplane, a ship, a motorcycle. In automotive applications, the integration of the device into the automotive design may necessitate the integration of the optical sensor, optionally optics, or device at minimal visibility from the exterior or interior. The detector or a part thereof such as the evaluation device and/or the data processing device may be especially suitable for such integration into automotive design.

The readout device comprises a plurality of electrical measurement devices being connected to the second electrode stripes and a switching device for subsequently connecting the first electrode stripes to the electrical measurement devices.

As used herein, an electrical measurement device generally refers to a device which is capable of performing at least one electrical measurement, such as for performing at least one current measurement and/or for performing at least one voltage measurement. Thus, each electrical measurement device may comprise at least one voltmeter and/or at least one amperemeter. Other embodiments are feasible.

Preferably, at least one electrical measurement device is provided for each of the second electrode stripes. Thus, as an example, each second electrode stripe may be connected permanently or releasably to one or more measurement devices dedicated to the respective second electrode stripe. The measurement devices, however, may be comprised within a single device, such as within one integrated circuit. Preferably, the electrical measurement devices are adapted for simultaneously measuring electrical signals assigned to the respective second electrode stripes.

As further used herein, a switching device generally is a device which is adapted for subsequently connecting the first electrode stripes to the electrical measurement devices. Thus, generally, at a specific moment in time, one specific first electrode stripe may be connected to all of the measurement devices and/or to a plurality of the measurement devices. Thus, as an example, each measurement device may have a first measurement port and a second measurement port, wherein the first measurement port of the measurement devices or of a plurality of the measurement devices is connected to one and the same first electrode stripe selected by the switching device, whereas the second ports of the measurement devices each are connected to their respective second electrode stripes. The switching device, at a subsequent moment in time, may be adapted to connect the measurement devices to another one of the first electrode stripes, such as to a subsequent one of the first electrode stripes. Thus, the switching device preferably may be adapted to perform a multiplexing scheme, thereby subsequently switching through all of the first electrode stripes and/or through a predetermined number of the first electrode stripes.

It shall further be noted that the switching may be performed uniformly for all first electrode stripes. Alternatively, the optical sensor may be split such that at least two switching devices may be provided, each switching device being assigned to a plurality of the first electrode stripes. Thus, the optical sensor may be sub-divided into different regions of first electrode stripes, each region being assigned to a dedicated switching device. Additionally or alternatively, an interleaving switching scheme may be used, such that every $n^{th}$ one of the first electrode stripes is assigned to a specific switching device. Various embodiments are feasible.

The optical detector further may comprise at least one optical element for optically imaging at least one object onto the optical sensor. As used herein, an optical element generally refers to an element having focusing and/or defocusing properties. Thus, as an example, the at least one optical element may comprise at least one lens for imaging an object onto the at least one optical sensor. Additional elements may be comprised within the optical element, such as at least one diaphragm and/or at least one mirror. Additionally or alternatively, one or more wavelength-selective elements may be comprised, such as one or more optical filters and/or one or more prisms and/or one or more dichroitic mirrors.

The matrix of pixels, as outlined above, preferably may have rows defined by the first electrode stripes and columns defined by the second electrode stripes. Thus, the pixels may be arranged in rows and columns, wherein each pixel may be identified by a row number and/or a number of the first electrode stripe forming the row and by a column number and/or a number of the second electrode stripe forming the row. Each measurement device preferably may be connected to a column, such that electrical signals for the pixels of each row may be measured simultaneously. Thus, in one measurement step, each of the measurement devices may provide at least one measurement signal for the pixels contained in the row, such that measurement values for all pixels of the row and/or at least for a plurality of the pixels of the row may be measured simultaneously. Subsequently, as outlined above, the switching device may switch to another row, such as to a subsequent row, and may allow for the measurement devices to measure electrical signals of the pixels of this newly selected row, simultaneously. Thus, by subsequently switching through the rows, such as by subsequently switching through all rows of the matrix of pixels and/or through a plurality of the rows of the matrix of pixels, measurement values for the pixels may be generated. By assembling the measurement values, an image may be generated.

The switching device may be adapted to subsequently connect the rows to the electrical measurement devices.

As outlined above, the electrical measurement devices each may comprise at least one of a current measurement device and a voltage measurement device. Generally, it shall be noted that the electrical measurement devices may be adapted to generate electrical measurement signals which may be used as "raw" electrical measurement signals, without any further processing. Additionally or alternatively, the measurement signals may fully or partially be subject to one or more signal processing steps, such as one or more of a filtering step, an analogue-digital conversion step, an averaging step, such as averaging measurement signals over a number of measurement values and/or over a specific time span. The at least one readout device may, accordingly, provide one or more signal processing devices. The signal processing devices may be adapted to generate processed measurement signals. In the following, no difference will be made between raw measurement signals and processed measurement signals, such that, wherever measurement signals are mentioned, both options are feasible.

The measurement devices generally may be digital measurement devices and/or analogue measurement devices. In case the measurement devices are fully or partially designed as analogue measurement devices, preferably, the electrical measurement devices further comprise at least one analogue-digital converter. Thus, as an example, each of the electrical measurement devices may comprise at least one analogue-digital converter. Additionally or alternatively, two or more or even all of the electrical measurement devices may use one and the same analogue-digital converter.

As outlined above, the readout device may further comprise at least one data memory, such as at least one volatile and/or at least one non-volatile data memory, for storing measurement values for the pixels of the matrix.

It shall be noted that the readout device may be embodied as a single device or as a plurality of devices. Thus, the readout device may comprise one or more electrical circuit boards and/or one or more integrated circuits. Thus, as an example, the readout device may further comprise one or more application-specific integrated circuits (ASICs).

As outlined above, the switching device generally may be adapted to perform a multiplexing measurement scheme, multiplexing through the rows of the matrix of pixels. In the multiplexing measurement scheme, the first electrode stripes may iteratively be connected to the electrical measurement devices. Thus, once the at least one switching device has switched through all the rows of the matrix of pixels and/or through all the rows assigned to the specific switching device, the switching process may start anew, from the beginning, such as by switching back to the first row. Thus, generally, the at least one readout device may be adapted for driving the detector in a so-called passive-matrix detection scheme. Thus, generally, the optical detector may be a passive-matrix optical detector. The electrical signals also referred to as electrical measurement signals and/or information values, be it in a raw form and/or in a processed form, specifically may represent an intensity of illumination for each pixel. Thus, as an example, the measurement values specifically may be adapted to provide gray-scale values for each pixel. Thus, the image may provide a matrix of information values, each information value comprising a gray-scale value for a respective pixel of the matrix of pixels. Thus, as an example, for each pixel, 4-bit information values, 8-bit information values or even 16-bit information values may be provided.

It shall further be noted that other information may be provided by the optical sensor and/or the optical detector. Thus, as an example, color information may be provided, as will be outlined in further detail below. Further, it shall be noted that the optical sensor, besides the pixels, may comprise one or more additional elements, such as one or more additional light-sensitive elements. Thus, as an example, the optical sensor may provide one or more additional light-sensitive elements which are not part of the matrix. Further, one or more portions of the matrix may be exempt from the above-mentioned multiplexing scheme, such as for using these one or more portions of the optical sensor for other purposes.

As outlined above, one of the first electrode and the second electrode may form a bottom electrode closest to the substrate, and the other one may form a top electrode facing away from the substrate. Further, the first electrode may be an anode of the photosensitive layer setup, and the second electrode may be a cathode of the photosensitive layer setup or vice versa.

Specifically, one of the first electrode and the second electrode may be a bottom electrode and the other of the first electrode and the second electrode may be a top electrode. The bottom electrode may be applied to the substrate directly or indirectly, wherein the latter e.g. may imply interposing one or more buffer layers or protection layers in between the bottom electrode and the substrate. The photovoltaic material may be applied to the bottom electrode and may at least partially cover the bottom electrode. As outlined above, one or more portions of the bottom electrode may remain uncovered by the at least one photovoltaic material, such as for contacting purposes. The top electrode may be applied to the photovoltaic material, such that one or more portions of the top electrode are located on top of the photovoltaic material. As further outlined above, one or more additional portions of the top electrode may be located elsewhere, such as for contacting purposes. Thus, as an example, the bottom electrode may comprise one or more contact pads, such as at least one contact pad per electrode stripe of the bottom electrode, which remain uncovered by the photovoltaic material. Similarly, the top electrode may comprise one or more contact pads, such as at least one contact pad per electrode stripe of the top electrode, wherein the contact pad preferably is located outside an area coated by the photovoltaic material.

As outlined above, the substrate may be intransparent or at least partially transparent. As used herein, the term "transparent" refers to the fact that, in one or more of the visible spectral range, the ultraviolet spectral range or the infrared spectral range, light may penetrate the substrate at least partially. Thus, in one or more of the visible spectral range, the infrared spectral range or the ultraviolet spectral range, the substrate may have a transparency of at least 10%, preferably at least 30% or, more preferably, at least 50%. As an example, a glass substrate, a quartz substrate, a transparent plastic substrate or other types of substrates may be used as transparent substrates. Further, multi-layer substrates may be used, such as laminates.

As further used herein, the term "light" generally refers to one or more of light in the visible spectral range, the ultraviolet spectral range or the infrared spectral range. As further used herein, the visible spectral range shall be a wavelength range of 380 nm to 780 nm. The infrared spectral range generally shall refer to a spectral range of 780 nm to 1 mm, more preferably to a spectral range of 780 nm to 3.0 µm. As further used herein, the term "ultraviolet spectral range" generally shall refer to the range of 1 nm to 380 nm, preferably to the spectral range of 50 nm to 380 nm, and, more preferably, to the spectral range of 200 nm to 380 nm.

As outlined above, one or both of the bottom electrode and the top electrode may be transparent. Thus, depending on the direction of illumination of the optical sensor, the bottom electrode, the top electrode or both may be transparent. As an example, in case a transparent substrate is used, preferably, at least the bottom electrode is a transparent electrode. In case the bottom electrode is the first electrode and/or in case the bottom electrode functions as an anode, preferably, the bottom electrode comprises at least one layer of a transparent conductive oxide, such as indium-tin-oxide, zinc oxide, fluorine-doped tin oxide or a combination of two or more of these materials. In case a transparent substrate and a transparent bottom electrode are used, a direction of illumination of the optical sensor may be through the substrate. In case an intransparent substrate is used, the bottom electrode may be transparent or intransparent. Thus, as an example, an intransparent electrode may comprise one or more metal layers of generally arbitrary thickness, such as one or more layers of silver and/or other metals. As an example, the bottom electrode and/or the first electrode may have a work function of 3 eV to 6 eV.

As outlined above, the top electrode may be intransparent or transparent. In case an illumination of the optical sensor takes place through the substrate and the bottom electrode, the top electrode may be intransparent. In case an illumination takes place through the top electrode, preferably, the top electrode is transparent. Still, as will be outlined in further detail below, the whole optical sensor may be transparent, at least in one or more spectral ranges of light. In this case, both the bottom electrode and the top electrode may be transparent.

In order to create a transparent top electrode, various techniques may be used. Thus, as an example, the top electrode may comprise a transparent conductive oxide, such as zinc oxide. The transparent conductive oxide may be applied, as an example, by using appropriate physical vapor deposition techniques, such as sputtering, thermal evaporation and/or electron-beam evaporation. The top electrode, preferably the second electrode, may be a cathode. Alternatively, the top electrode may as well function as an anode. Specifically in case the top electrode functions as a cathode, the top electrode preferably comprises one or more metal layers, such as metal layers having a work function of preferably less than 4.5 eV, such as aluminum. In order to create a transparent metal electrode, thin metal layers may be used, such as metal layers having a thickness of less than 50 nm, more preferably less than 40 nm or even more preferably less than 30 nm. Using these metal thicknesses, a transparency at least in the visible spectral range may be created. In order to still provide sufficient electrical conductivity, the top electrode may, in addition to the one or more metal layers, comprise additional electrically conductive layers, such as one or more electrically conductive organic materials applied in between the metal layers and the at least one photovoltaic material. Thus, as an example, one or more layers of an electrically conductive polymer may be interposed in between the metal layer of the top electrode and the photovoltaic material.

As outlined above, both the bottom electrode and the top electrode each may comprise a plurality of electrode stripes, corresponding to the first electrode stripes and the second electrode stripes. Thus, the bottom electrode may comprise a plurality of bottom electrode stripes which form one of the first electrode stripes and the second electrode stripes. The top electrode may comprise a plurality of top electrode stripes, forming the other of the first electrode stripes and the second electrode stripes.

As an example, the top electrode may comprise a plurality of metal electrode stripes. As an example, the metal electrode stripes forming the top electrode may be made of one or more metal layers comprising one or more metals selected from the group consisting of Ag, Al, Ag, Au, Pt, Cu. Additionally or alternatively, other metals and/or combinations of metals, such as combinations of two or more of the named metals and/or other metals may be used. Further, one or more alloys may be used, containing two or more metals. As an example, one or more alloys of the group consisting of NiCr, AlNiCr, MoNb and AlNd may be used. As outlined above, however, alternatively, the top electrode may comprise a plurality of stripes made of a transparent conductive oxide, such as made of one or more of the transparent conductive oxides listed above.

In case a plurality of metal electrode stripes are used, several techniques for depositing the electrode stripes and/or patterning the metal electrode stripes may be used. Thus, as an example, one or more deposition techniques of the metal electrode stripes may be used in which the patterning of the metal electrode stripes takes place during deposition. Thus, as an example, one or more shadow masks may be used, with slit-shaped openings corresponding to the metal electrode stripes. Additionally or alternatively, however, a large-area coating may be used in order to deposit the metal electrode, followed by one or more patterning steps for forming the metal electrode stripes, such as one or more etching techniques. Again, additionally or alternatively, a self-patterning technique may be used implementing a plurality of electrically insulating separators. Thus, as an example, the metal electrode stripes may be separated by electrically insulating separators. This technique generally is known in the field of display technology. For potential separators, which are applicable for the present invention, reference may be made, e.g., to EP 1 191 819 A2, US 2005/0052120 A1, US 2003/0017360 A1 or other techniques known in the field of cathode patterning of organic light-emitting passive-matrix displays. Thus, generally, the electrically insulating separators may be photoresist structures, specifically photoresist structures having one or more negative photoresists, specifically for providing sharp edges at the top. Thus, by using insulating separators, a self-patterning of the top electrode into corresponding top electrode stripes may be performed during deposition of the top electrode.

As outlined above, the photosensitive layer setup preferably may be a photovoltaic layer setup, specifically a layer setup of one or more of an organic photodiode and/or a solar cell having one or more organic materials. Preferably, the photosensitive layer setup may be a layer setup of a dye-sensitized solar cell, more preferably of a solid dye-sensitized solar cell (sDSC). Thus, the optical sensor, specifically the photosensitive layer setup and, more preferably, the photovoltaic material, may comprise an n-semiconducting metal oxide, preferably a nano-porous n-semiconducting metal oxide, wherein the electrically insulating separators are deposited on top of the n-semiconducting metal oxide. Thus, as an example, the optical detector may comprise a layer setup of bottom electrode stripes directly or indirectly deposited on top of the substrate, followed by one or more layers of a nano-porous n-semiconducting metal oxide, such as one or more layers of titanium dioxide. The electrically insulating separators, specifically separator bars, may be deposited on top of the one or more layers of the semiconducting metal oxide. The deposition of the insulating separators may take place before or after sensitizing the n-semiconducting metal oxide with at least one dye. Thus, as an example, the separators may be deposited on top of the n-semiconducting metal oxide, before sensitizing the n-semiconducting metal oxide with the at least one dye. Subsequently, one or more additional layers may be deposited, such as one or more p-semiconducting materials, preferably one or more p-semiconducting organic materials, followed by the deposition of the top electrode which is self-patterned by the insulating separators. Thus, as an example, the optical sensor may further comprise at least one solid p-semiconducting organic material which is deposited on top of the n-semiconducting metal oxide, wherein the solid p-semiconducting organic material is sub-divided into a plurality of stripe-shaped regions by the electrically insulating separators. On top of the p-semiconducting organic material, one or more layers of the top electrode may be deposited, and the electrically insulating separators may sub-divide the top electrode into a plurality of top electrode stripes.

As outlined above, the top electrode may be intransparent or transparent. In case a transparent top electrode is provided, several techniques are applicable, as partially explained above. Thus, as an example, the top electrode may comprise one or more metal layers. The at least one metal layer may have a thickness of less than 50 nm, preferably a thickness of less than 40 nm, more preferably a thickness of less than 30 nm or even a thickness of less than 25 nm or less than 20 nm. The metal layer may comprise at least one metal selected from the group consisting of: Ag, Al, Ag, Au, Pt, Cu. Additionally or alternatively, other metals and/or combinations of metals, such as combinations of two or more of the named metals and/or other metals may be used. Further, one or more alloys may be used, containing two or more metals. As an example, one or more alloys of the group consisting of NiCr, AlNiCr, MoNb and AlNd may be used. The use of other metals, however, is possible.

The top electrode may further comprise at least one electrically conductive polymer embedded in between the photovoltaic material and the metal layer. The electrically conductive polymer may be sub-divided into stripes, in order to follow the shape of the top electrode stripes. The sub-division of the electrically conductive polymer into electrically conductive polymer stripes which, again, are covered by the metal stripes, may be performed in various ways. Thus, as an example, the deposition of the at least one electrically conductive polymer may be performed in a patterned way, such as by using appropriate patterned deposition techniques such as printing techniques. Additionally or alternatively, a subsequent patterning may be used. Again, additionally or alternatively, the above-mentioned separators may as well be used for separating the electrically conductive polymer into electrically conductive polymer stripes.

Various possibilities of electrically conductive polymers which are usable within the present invention exist. Thus, as an example, the electrically conductive polymer may be intrinsically electrically conductive. As an example, the electrically conductive polymer may comprise one or more conjugated polymers. As an example, the electrically conductive polymer may comprise at least one polymer selected from the group consisting of a poly-3,4-ethylenedioxythiophene (PEDOT), preferably PEDOT being electrically doped with at least one counter ion, more preferably PEDOT doped with sodium polystyrene sulfonate (PEDOT:PSS); a polyaniline (PANI); a polythiophene.

The optical detector may further comprise at least one encapsulation protecting one or more of the photovoltaic material, the first electrode or the second electrode at least partially from moisture. Thus, as an example, the encapsulation may comprise one or more encapsulation layers and/or may comprise one or more encapsulation caps. As an example, one or more caps selected from the group consisting of glass caps, metal caps, ceramic caps and polymer or plastic caps may be applied on top of the photosensitive layer setup in order to protect the photosensitive layer setup or at least a part thereof from moisture. Additionally or alternatively, one or more encapsulation layers may be applied, such as one or more organic and/or inorganic encapsulation layers. Still, contact pads for electrically contacting the bottom electrode stripes and/or the top electrode stripes may be located outside the cap and/or the one or more encapsulation layers, in order to allow for an appropriate electrical contacting of the electrode stripes.

As outlined above, each of the pixels may form an individual photovoltaic device, preferably an organic photovoltaic device. Thus, as an example, each pixel may form a dye-sensitized solar cell (DSC), more preferably a solid dye-sensitized solar cell (sDSC). Thus, as outlined above, the photovoltaic material preferably may comprise at least one n-semiconducting metal oxide, at least one dye and at least one solid p-semiconducting organic material. As further outlined above, the n-semiconducting metal oxide may be sub-divided into at least one dense layer or solid layer of the n-semiconducting metal oxide, functioning as a buffer layer on top of the first electrode. Additionally, the n-semiconducting metal oxide may comprise one or more additional layers of the same or another n-semiconducting metal oxide having nano-porous and/or nano-particulate properties. The dye may sensitize the latter layer, by forming a separate dye layer on top of the nano-porous n-semiconducting metal oxide and/or by soaking at least part of the n-semiconducting metal oxide layer. Thus, generally, the nano-porous n-semiconducting metal oxide may be sensitized with the at least one dye, preferably with the at least one organic dye.

The optical detector may comprise one or more of the optical sensors as disclosed above and/or as disclosed in further detail below. The optical detector, however, may comprise, additionally, one or more additional imaging devices. As used herein, an additional imaging device is imaging device which the setup of the optical sensor as disclosed above or as disclosed in further detail below. Thus, as an example, other types of optical sensors may be used as additional imaging devices which do not have the setup as disclosed above. Thus, as an example, the at least one optional additional imaging device may be or may comprise one or more conventional imaging devices. As an example, one or more semiconductor imaging devices may be present within the optical detector, such as one or more CCD chips and/or one or more CMOS chips. Thus, the optical sensor may be used alone, in combination with one or more additional optical sensors and/or in combination with one or more additional imaging devices. As an example, the optical detector may comprise a stack of at least two imaging devices, wherein at least one of the imaging devices is the optical sensor. As an example, a plurality of imaging devices may be stacked along an optical axis of the detector, such as with their respective sensitive surfaces facing parallel to the optical axis of the detector. As an example, the optical sensor may be a transparent optical sensor, and light entering the optical detector may, firstly, pass the at least one optical sensor, before finally illuminating an intransparent imaging device at an end of the stack of imaging devices facing away from the object emitting the light.

Further, in case a stack comprising at least two imaging devices is used, the imaging devices may have the same spectral sensitivity and/or may have differing spectral sensitivities. Thus, as an example, one of the imaging devices may have a spectral sensitivity in a first wavelength band, and another one of the imaging devices may have a spectral sensitivity in a second wavelength band, the first wavelength band being different from the second wavelength band. By evaluating signals and/or images generated with these imaging devices, a color information may be generated. In this context, it is preferred to use at least one transparent optical sensor within the stack of imaging devices, as discussed above. The spectral sensitivities of the imaging devices may be adapted in various ways. Thus, the at least one photovoltaic material comprised in the imaging devices may be adapted to provide a specific spectral sensitivity, such as by using different types of dyes. Thus, by choosing appropriate dyes, a specific spectral sensitivity of the imaging devices may be generated. Additionally or alternatively, other means for adjusting the spectral sensitivity of the imaging devices may be used. Thus, as an example, one or more wavelength-selective elements may be used and may be assigned to one or more of the imaging devices, such that the one or more wavelength-selective elements, by definition, become part of the respective imaging devices. As an example, one or more wavelength-selective elements may be used selected from the group consisting of a filter, preferably a color filter, a prism and a dichroitic mirror. Thus, generally, by using one or more of the above-mentioned means and/or other means, the imaging devices may be adjusted such that two or more of the imaging device is exhibit differing spectral sensitivities.

As outlined above, the optical detector specifically may comprise a stack of at least two imaging devices. Therein, one or preferably at least two of the imaging devices may be optical sensors having the setup disclosed above or disclosed in further detail below. These optical sensors may also be referred to as pixelated optical sensors or simply pixelated sensors. Thus, generally, the optical detector comprises one, two or more imaging devices, wherein one or more of the imaging devices may be embodied as or may comprise one or more optical sensors having the setup disclosed above or as disclosed in further detail below. Thus, the stack may comprise one, two or more optical sensors, such as transparent or at least partially transparent optical sensors. The stack specifically may comprise two or more optical sensors having differing spectral sensitivities. Differing spectral sensitivities specifically may be achieved by using two or more different types of dyes. Thus, the stack may comprise at least one first type of optical sensor having at least one first spectral sensitivity, such as a first absorption spectrum, such as a first absorption spectrum generated by using at least one first type of dye, and at least one second type of optical sensor, having at least one second spectral sensitivity, such as a second absorption spectrum, such as a second absorption spectrum generated by using at least one second type of dye. By evaluating sensor signals from the optical sensors having differing spectral sensitivities, the optical detector may be adapted to generate at least one item of color information regarding an object within a field of view of the optical detector and/or at least one item of color information regarding a light beam entering the optical detector, such as color coordinates or the like. For generating the at least one item of color information, the sensor signals of the optical sensors having differing spectral sensitivities specifically may be evaluated by using at least one evaluation algorithm such as an algorithm using the sensor signals as input variables and/or a lookup table or the like. The stack specifically may comprise the optical sensors having differing spectral sensitivities in an alternating sequence.

By using a stack comprising two or more optical sensors, the optical detector specifically may be adapted to acquire a three-dimensional image by evaluating sensor signals of the optical sensors. Thus, as outlined above, the pixelated optical sensors may be arranged in a plurality of focal planes, allowing for simultaneously or subsequently acquiring a stack of two-dimensional images, wherein the two-dimensional images in combination may form a three-dimensional image. The optical detector specifically may be adapted to acquire a multicolor three-dimensional image, preferably a full-color three-dimensional image, by evaluating sensor signals of the optical sensors having differing spectral properties. Thus, summarizing, the optical detector generally may be adapted to acquire a three-dimensional image of a scene within a field of view of the optical detector. A possible evaluation algorithm for aquiring 3D image information is depth from defocus, further algorithms are possible.

Additionally or alternatively, the optical detector may be adapted for determining at least one position of at least one object, such as an object within a field of view of the optical detector and/or within a scene captured by the optical detector. As used herein, the term "position" generally refers to an arbitrary item of information regarding an absolute position and/or an orientation of the object in space. As an example, the position may be determined by one or more coordinates, such as one or more Cartesian coordinates and/or rotational coordinates. Further, as an example, the position may be determined by determining a distance between the optical detector and the object.

For determining the position of the object and/or for deriving at least one item of information regarding the position, various algorithms may be used. Specifically, the optical detector may be adapted, such as by an appropriate evaluation device and/or by appropriately designing the readout device, to evaluate at least one image captured by the at least one optical sensor of the optical detector. For this purpose, various image evaluation algorithms may be used. As an example, a transversal coordinate of the object may be determined by evaluating a position of an image of the object on the optical sensor. For determining a distance between the object and the optical detector, various algorithms are known to the skilled person and generally may be used. Thus, as an example, the size of an image of the object on the optical sensor may be evaluated, in order to determine the distance between the object and the optical detector. Further, as an example, evaluation algorithms such as "blob tracking" and/or "counter tracking" are generally known to the skilled person and may be used in the context of the present invention.

As will be outlined in further detail below, the optical detector may further be adapted for acquiring a three-dimensional image of an object and/or of a scene captured by the optical detector. Thus, specifically by using a stack of pixelated optical sensors, one or more three-dimensional images may be captured. Thus, images acquired by each pixelated optical sensor may be combined to achieve one or more three-dimensional images. By evaluating the one or more three-dimensional images, further information regarding the position of at least one object may be derived. Thus, by detecting an image of the object within the three-dimensional image generated by using the optical detector, a position of the object in space may be derived. This is generally due to the fact that, by detecting the image of the object within the three-dimensional image and by using generally known imaging properties of the optical detector, position information regarding the object in space may be derived.

Thus, generally, the optical detector, may be used to record images such as at different focal planes simultaneously. Preferably the distances to the lens are as such, that different parts of the images are in focus. Thus, the images can be used in image-processing techniques known as focus stacking, z-stacking, focal plane merging. One application of these techniques is obtaining images with greater depth of field, which is especially helpful in imaging techniques with typically very shallow depth of field such as macro photography or optical microscopy. Another application is to obtain distance information using algorithms, convolution based algorithms such as depth from focus or depth from defocus. Another application is to optimize the images to obtain a greater artistic or scientific merit.

The optical detector having the plurality of pixelated sensors also may be used to record a light-field behind a lens or lens system of the detector, comparable to a plenoptic or light-field camera. Thus, specifically, the detector may be embodied as a light-field camera adapted for acquiring images in multiple focal planes, such as simultaneously. The term light-field, as used herein, generally refers to the spatial light propagation of light inside the detector such as inside camera. The detector according to the present invention, specifically having a stack of optical sensors, may have the capability of directly recording a light-field within the detector or camera, such as behind a lens. The plurality of pixelated sensors may record images at different distances from the lens. Using, e.g., convolution-based algorithms such as "depth from focus" or "depth from defocus", the propagation direction, focus points, and spread of the light behind the lens can be modeled. From the modeled propagation of light behind the lens, images at various distances to the lens can be extracted, the depth of field can be optimized, pictures that are in focus at various distances can be extracted, or distances of objects can be calculated. Further information may be extracted.

Once the light propagation inside the detector, such as behind a lens of the detector, is modeled and/or recorded, this knowledge of light propagation provides a large number of advantages. This knowledge of light propagation, as an example, allows for slightly modifying the observer position after recording an image stack using image processing techniques. In a single image, an object may be hidden behind another object and is not visible. However, if the light scattered by the hidden object reaches the lens and through the lens one or more of the sensors, the object may be made visible, by changing the distance to the lens and/or the image plane relative to the optical axis, or even using non-planar image planes. The change of the observer position may be compared to looking at a hologram, in which changing the observer position slightly changes the image. The modification of observer position may be especially beneficial in motion capture and three dimensional video recordings as an unrealistically flat perception of three dimensional objects, known as cardboard effect, is avoided.

The use of several pixelated sensors further allows for correcting lens errors in an image processing step after recording the images. Optical instruments often become expensive and challenging in construction, when lens errors need to be corrected. These are especially problematic in microscopes and telescopes. In microscopes, a typical lens error is that rays of varying distance to the optical axis are distorted differently (spherical aberration). In telescopes, varying the focus may occur from differing temperatures in the atmosphere. Static errors such as spherical aberration or further errors from production may be corrected by determining the errors in a calibration step and then using a fixed image processing such as fixed set of pixels and sensor, or more involved processing techniques using light propagation information. In cases in which lens errors are strongly time-dependent, i.e. dependent on weather conditions in telescopes, the lens errors may be corrected by using the light propagation behind the lens, calculating extended depth of field images, using depth from focus techniques, and others.

The optical detector according to the present invention, comprising the at least one optical sensor and the at least one readout device, may further be combined with one or more other types of sensors or detectors. Thus, the optical detector comprising the at least one optical sensor having the matrix of pixels (in the following also simply referred to as the pixelated optical sensor and/or the pixelated sensor) and the at least one readout device may further comprise at least one additional detector. The at least one additional detector may be adapted for detecting at least one parameter, such as at least one of: a parameter of a surrounding environment, such as a temperature and/or a brightness of a surrounding environment; a parameter regarding a position and/or orientation of the detector; a parameter specifying a state of the object to be detected, such as a position of the object, e.g. an absolute position of the object and/or an orientation of the object in space. Thus, generally, the principles of the present invention may be combined with other measurement principles in order to gain additional information and/or in order to verify measurement results or reduce measurement errors or noise.

Specifically, the detector according to the present invention may further comprise at least one time-of-flight (ToF) detector adapted for detecting at least one distance between the at least one object and the optical detector by performing at least one time-of-flight measurement. As used herein, a time-of-flight measurement generally refers to a measurement based on a time a signal needs for propagating between two objects or from one object to a second object and back. In the present case, the signal specifically may be one or more of an acoustic signal or an electromagnetic signal such as a light signal. A time-of-flight detector consequently refers to a detector adapted for performing a time-of-flight measurement. Time-of-flight measurements are well-known in various fields of technology such as in commercially available distance measurement devices or in commercially available flow meters, such as ultrasonic flow meters. Time-of-flight detectors even may be embodied as time-of-flight cameras. These types of cameras are commercially available as range-imaging camera systems, capable of resolving distances between objects based on the known speed of light.

Presently available ToF detectors generally are based on the use of a pulsed signal, optionally in combination with one or more light sensors such as CMOS-sensors. A sensor signal produced by the light sensor may be integrated. The integration may start at two different points in time. The distance may be calculated from the relative signal intensity between the two integration results.

Further, as outlined above, ToF cameras are known and may generally be used, also in the context of the present invention. These ToF cameras may contain pixelated light sensors. However, since each pixel generally has to allow for performing two integrations, the pixel construction generally is more complex and the resolutions of commercially available ToF cameras are rather low (typically 200×200 pixels). Distances below ~40 cm and above several meters typically are difficult or impossible to detect. Furthermore, the periodicity of the pulses leads to ambiguous distances, as only the relative shift of the pulses within one period is measured.

ToF detectors, as standalone devices, typically suffer from a variety of shortcomings and technical challenges. Thus, in general, ToF detectors and, more specifically, ToF cameras suffer from rain and other transparent objects in the light path, since the pulses might be reflected too early, objects behind the raindrop are hidden, or in partial reflections the integration will lead to erroneous results. Further, in order to avoid errors in the measurements and in order to allow for a clear distinction of the pulses, low light conditions are preferred for ToF-measurements. Bright light such as bright sunlight can make a ToF-measurement impossible. Further, the energy consumption of typical ToF cameras is rather high, since pulses must be bright enough to be back-reflected and still be detectable by the camera. The brightness of the pulses, however, may be harmful for eyes or other sensors or may cause measurement errors when two or more ToF measurements interfere with each other. In summary, current ToF detectors and, specifically, current ToF-cameras suffer from several disadvantages such as low resolution, ambiguities in the distance measurement, limited range of use, limited light conditions, sensitivity towards transparent objects in the light path, sensitivity towards weather conditions and high energy consumption. These technical challenges generally lower the aptitude of present ToF cameras for daily applications such as for safety applications in cars, cameras for daily use or human-machine-interfaces, specifically for use in gaming applications.

In combination with the optical detector according to the present invention, providing at least one pixelated optical sensor and the readout device, the advantages and capabilities of both systems may be combined in a fruitful way. Thus, the optical detector may provide advantages at bright light conditions, while the ToF detector generally provides better results at low-light conditions. A combined device, i.e. an optical detector according to the present invention further including at least one ToF detector, therefore provides increased tolerance with regard to light conditions as compared to both single systems. This is especially important for safety applications, such as in cars or other vehicles.

Specifically, the optical detector may be designed to use at least one ToF measurement for correcting at least one measurement performed by using the pixelated optical sensor and vice versa. Further, the ambiguity of a ToF measurement may be resolved by using the optical detector. A measurement using the pixelated optical sensor specifically may be performed whenever an analysis of ToF measurements results in a likelihood of ambiguity. Additionally or alternatively, measurements using the pixelated optical sensor may be performed continuously in order to extend the working range of the ToF detector into regions which are usually excluded due to the ambiguity of ToF measurements. Additionally or alternatively, the pixelated optical sensor may cover a broader or an additional range to allow for a broader distance measurement region. The pixelated optical sensor, specifically when used in a camera, may further be used for determining one or more important regions for measurements to reduce energy consumption or to protect eyes. Thus the pixelated optical sensor may be adapted for detecting one or more regions of interest. Additionally or alternatively, the pixelated optical sensor may be used for determining a rough depth map of one or more objects within a scene captured by the detector, wherein the rough depth map may be refined in important regions by one or more ToF measurements. Further, the pixelated optical sensor may be used to adjust the ToF detector, such as the ToF camera, to the required distance region. Thereby, a pulse length and/or a frequency of the ToF measurements may be pre-set, such as for removing or reducing the likelihood of ambiguities in the ToF measurements. Thus, generally, the pixelated optical sensor may be used for providing an autofocus for the ToF detector, such as for the ToF camera.

As outlined above, a rough depth map may be recorded by the pixelated optical sensor, which may be used as a camera or as a part of a camera. Further, the rough depth map, containing depth information or z-information regarding one or more objects within a scene captured by the detector, may be refined by using one or more ToF measurements. The ToF measurements specifically may be performed only in important regions. Additionally or alternatively, the rough depth map may be used to adjust the ToF detector, specifically the ToF camera.

Further, the use of the pixelated optical sensor in combination with the at least one ToF detector may solve the above-mentioned problem of the sensitivity of ToF detectors towards the nature of the object to be detected or towards obstacles or media within the light path between the detector and the object to be detected, such as the sensitivity towards rain or weather conditions. A combined pixelated/ToF measurement may be used to extract the important information from ToF signals, or measure complex objects with several transparent or semi-transparent layers. Thus, objects made of glass, crystals, liquid structures, phase transitions, liquid motions, etc. may be observed. Further, the combination of a pixelated detector and at least one ToF detector will still work in rainy weather, and the overall detector will generally be less dependent on weather conditions. As an example, measurement results provided by the pixelated optical sensor may be used to remove the errors provoked by rain from ToF measurement results, which specifically renders this combination useful for safety applications such as in cars or other vehicles.

The implementation of at least one ToF detector into the optical detector according to the present invention may be realized in various ways. Thus, the at least one pixelated optical sensor and the at least one ToF detector may be arranged in a sequence within the same light path. As an example, at least one transparent pixelated optical sensor may be placed in front of at least one ToF detector. Additionally or alternatively, separate light paths or split light paths for the pixelated optical sensor and the ToF detector may be used. Therein, as an example, light paths may be separated by one or more beam-splitting elements, such as one or more of the beam splitting elements listed above or listed in further detail below. As an example, a separation of beam paths by wavelength-selective elements may be performed. Thus, e.g., the ToF detector may make use of infrared light, whereas the pixelated optical sensor may make use of light of a different wavelength. In this example, the infrared light for the ToF detector may be separated off by using a wavelength-selective beam splitting element such as a hot mirror. Additionally or alternatively, light beams used for the measurement using the pixelated optical sensor and light beams used for the ToF measurement may be separated by one or more beam-splitting elements, such as one or more semitransparent mirrors, beam-splitter cubes, polarization beam splitters or combinations thereof. Further, the at least one pixelated optical sensor and the at least one ToF detector may be placed next to each other in the same device, using distinct optical pathways. Various other setups are feasible.

The at least one optional ToF detector may be combined with basically any of the embodiments of the optical detector according to the present invention. Specifically, the at least one ToF detector which may be a single ToF detector or a ToF camera, may be combined with a single optical sensor or with a plurality of optical sensors such as a sensor stack. Further, the optical detector may also comprise one or more imaging devices such as one or more inorganic imaging devices like CCD chips and/or CMOS chips, preferably one or more full-color CCD chips or full-color CMOS chips. Additionally or alternatively, the optical detector may further comprise one or more thermographic cameras.

As outlined above, the at least one optical sensor or pixelated sensor of the detector, as an example, may be or may comprise at least one organic optical sensor. As an example, the at least one optical sensor may be or may comprise at least one organic solar cell, such as at least one dye-sensitized solar cell (DSC), preferably at least one solid DSC or sDSC. Specifically, the at least one optical sensor may be or may comprise at least one optical sensor capable of showing an effect of the sensor signal being dependent on a photon density or flux of photons. In the following, these types of optical sensors are referred to as FiP sensors. In FiP sensors, given the same total power p of illumination, the sensor signal i is generally dependent on a flux F of photons, i.e. the number of photons per unit area. In other words, the at least one optical sensor may comprise at least one optical sensor which is defined as a FiP sensor, i.e. as an optical sensor capable of providing a sensor signal, the optical sensor having at least one sensor region, such as a plurality of sensor regions like e.g. pixels, wherein the sensor signal, given the same total power of illumination of the sensor region by the light beam, is dependent on a geometry of the illumination, in particular on a beam cross section of the illumination on the sensor area. This effect including potential embodiments of optical sensors exhibiting this effect (such as sDSCs) is disclosed in further detail in WO 2012/110924 A1, in U.S. provisional applications 61/739,173, filed on Dec. 19, 2012, 61/749,964, filed on Jan. 8, 2013, and 61/867,169, filed on Aug. 19, 2013, and international patent application PCT/IB2013/061095, filed on Dec. 18, 2013. The embodiments of optical sensors exhibiting the FiP effect as disclosed in these prior art documents, which all are included herewith by reference, may also be used as optical sensors in the detector according to the present invention, besides the fact that the optical sensors or at least one of the optical sensors are pixelated. Thus, the optical sensors as used in one or more of the above-mentioned prior art documents, in a pixelated fashion, may also be used in the context of the present invention. As outlined above, a pixelation may simply be achieved by an appropriate patterning of the first and/or second electrodes of these optical sensors. Thus, each of the pixels of the pixelated optical sensor exhibiting the above-mentioned FiP-effect may, by itself, form a FiP sensor.

Thus, the optical detector according to the present invention specifically may fully or partially be embodied as a pixelated FiP camera, i.e. as a camera in which the at least one optical sensor or, in case a plurality of optical sensors is provided, at least one of the optical sensors, are embodied as pixelated FiP sensors. In pixeled FiP-cameras, pictures may be recorded in a similar way as disclosed above in the setup of the light-field camera. Thus, the detector may comprise a stack of optical sensors, each optical sensor being embodied as a pixelated FiP sensor. Pictures may be recorded at different distances from the lens. A depth can be calculated from these pictures using approaches such as depth-from-focus and/or depth-from-defocus.

The FiP measurement typically necessitates two or more FiP sensors such as organic solar cells exhibiting the FiP effect. The photon density on the different cells may vary as such, that a current ratio of at least 1/100 is obtained between a cell close to focus and a cell out of focus. If the ratio is closer to 1, the measurement may be imprecise.

The at least one readout device, which may fully or partially be embodied as an evaluation device of the optical detector or which may fully or partially be part of an evaluation device of the optical detector, may specifically be embodied to compare signals generated by pixels of different optical sensors, the pixels being located on a line parallel to an optical axis of the detector. A light cone of the light beam might cover a single pixel in the focus region. In the out-of-focus region, only a small part of the light cone will cover the pixel. Thus, in a stack of pixelated FiP sensors, the signal of the pixel of the sensor being out of focus will generally be much smaller than the signal of the pixel of the sensor being in focus. Consequently, the signal ratio will improve. For a calculation of the distance between the object and the detector, more than two optical sensors may be used in order to further increase the precision.

Thus, generally, the at least one optical sensor may comprise at least one stack of optical sensors, each optical sensor having at least one sensor region and being capable of providing at least one sensor signal, wherein the sensor signal, given the same total power of illumination of the sensor region by the light beam, is dependent on a geometry of the illumination, in particular on a beam cross section of the illumination on the sensor area, wherein the evaluation device may be adapted to compare at least one sensor signal generated by at least one pixel of a first one of the optical sensors with at least one sensor signal generated by at least one pixel of a second one of the optical sensors, specifically for determining a distance between at least one object and the optical detector and/or a z-coordinate of the object. The readout device, specifically the evaluation device, may further be adapted for evaluating the sensor signals of the pixels. Thus, one or more evaluation algorithms may be used. Additionally or alternatively, other means of evaluation may be used, such as by using one or more lookup tables, such as one or more lookup tables comprising FiP sensor signal values or ratios thereof and corresponding z-coordinates of the object and/or corresponding distances between the object and the detector. An analysis of several FiP-signals, taking into account the distance to the lens and/or a distance between the optical sensors may also result in information regarding the light beam, such as the spread of the light beam and, thus, the conventional FiP-distance.

The photosensitive layer setup may comprise at least 3 first electrode stripes, preferably at least 10 first electrode stripes, more preferably at least 30 first electrode stripes and most preferably at least 50 first electrode stripes. Similarly, the photosensitive layer setup may comprise at least 3 second electrode stripes, preferably at least 10 second electrode stripes, more preferably at least 30 second electrode stripes and most preferably at least 50 second electrode stripes. Thus, as an example, the photosensitive layer setup may comprise 3-1200 first electrode stripes and 3-1200 second electrode stripes, preferably 10-1000 first electrode stripes and 10-1000 second electrode stripes and more preferably 50-500 first electrode stripes and 50-500 second electrode stripes. Other embodiments, however, are feasible.

In a further aspect of the present invention, a detector system for determining a position of at least one object is disclosed. The detector system comprises at least one optical detector according to the present invention, such as at least one optical detector as disclosed in one or more of the embodiments described above and/or as disclosed in one or more of the embodiments disclosed in further detail below. As outlined above, the optical detector comprises one, two or more imaging devices, wherein one or more of the imaging devices may be embodied as or may comprise one or more optical sensors having the setup disclosed above or as disclosed in further detail below, i.e. one or more pixelated optical sensors. Specifically, the optical detector may comprise a stack of two or more pixelated optical sensors. As outlined above, by using two or more pixelated optical sensors, such as a stack of two or more pixelated optical sensors, and by acquiring images using these pixelated optical sensors, a three-dimensional image of a scene captured by the optical detector and/or of an object may be captured. By evaluating the three-dimensional image, such as by detecting an image of the object within the three-dimensional image, and optionally by using known imaging properties of the optical detector, such as known imaging properties of at least one lens of the optical detector, a position of the object in space may be determined, such as a distance between the object and the optical detector and/or other items of information regarding the position of the object in space.

The detector system may further comprise at least one beacon device adapted to direct at least one light beam towards the detector. As used herein, a beacon device generally refers to an arbitrary device adapted to direct at least one light beam towards the optical detector. The beacon device may fully or partially be embodied as an active beacon device, comprising at least one illumination source for generating the light beam. Additionally or alternatively, the beacon device may fully or partially be embodied as a passive beacon device comprising at least one reflective element adapted to reflect a primary light beam generated independently from the beacon device towards the optical detector.

The beacon device is at least one of attachable to the object, holdable by the object and integratable into the object. Thus, the beacon device may be attached to the object by an arbitrary attachment means, such as one or more connecting elements. Additionally or alternatively, the object may be adapted to hold the beacon device, such as by one or more appropriate holding means. Additionally or alternatively, again, the beacon device may fully or partially be integrated into the object and, thus, may form part of the object or even may form the object.

Generally, with regard to potential embodiments of the beacon device, reference may be made to one or more of U.S. provisional applications 61/739,173, filed on Dec. 19, 2012, 61/749,964, filed on Jan. 8, 2013, and 61/867,169, filed on Aug. 19, 2013, and international patent application PCT/IB2013/061095, filed on Dec. 18, 2013, the full content of all of which is herewith included by reference. Other embodiments are feasible.

As outlined above, the beacon device may fully or partially be embodied as an active beacon device and may comprise at least one illumination source. Thus, as an example, the beacon device may comprise a generally arbitrary illumination source, such as an illumination source selected from the group consisting of a light-emitting diode (LED), a light bulb, an incandescent lamp and a fluorescent lamp. Other embodiments are feasible.

Additionally or alternatively, as outlined above, the beacon device may fully or partially be embodied as a passive beacon device and may comprise at least one reflective device adapted to reflect a primary light beam generated by an illumination source independent from the object. Thus, in addition or alternatively to generating the light beam, the beacon device may be adapted to reflect a primary light beam towards the detector.

The detector system may comprise none, one, two, three or more beacon devices. Thus, generally, in case the object is a rigid object which, at least on a microscope scale, does not change its shape, preferably, at least two beacon devices may be used. In case the object is fully or partially flexible or is adapted to fully or partially change its shape, preferably, three or more beacon devices may be used. Generally, the number of beacon devices may be adapted to the degree of flexibility of the object. Preferably, the detector system comprises at least three beacon devices.

The object generally may be a living or non-living object. The detector system even may comprise the at least one object, the object thereby forming part of the detector system. Preferably, however, the object may move independently from the detector, in at least one spatial dimension.

The object generally may be an arbitrary object. In one embodiment, the object may be a rigid object. Other embodiments are feasible, such as embodiments in which the object is a non-rigid object or an object which may change its shape.

As will be outlined in further detail below, the present invention may specifically be used for tracking positions and/or motions of a person, such as for the purpose of controlling machines, gaming or simulation of sports. In this or other embodiments, specifically, the object may be selected from the group consisting of: an article of sports equipment, preferably an article selected from the group consisting of a racket, a club, a bat; an article of clothing; a hat; a shoe.

In a further aspect of the present invention, a human-machine interface for exchanging at least one item of information between a user and a machine is disclosed. The human-machine interface comprises at least one detector system according to the present invention, such as to one or more of the embodiments disclosed above and/or according to one or more of the embodiments disclosed in further detail below. The beacon devices are adapted to be at least one of directly or indirectly attached to the user and held by the user. The human-machine interface is designed to determine at least one position of the user by means of the detector system. The human-machine interface further is designed to assign to the position at least one item of information.

In a further aspect of the present invention, an entertainment device for carrying out at least one entertainment function is disclosed. The entertainment device comprises at least one human-machine interface according to the present invention. The entertainment device further is designed to enable at least one item of information to be input by a player by means of the human-machine interface. The entertainment device further is designed to vary the entertainment function in accordance with the information.

In a further aspect of the present invention, a tracking system for tracking a position of at least one movable object is disclosed. The tracking system comprises at least one detector system according to the present invention, such as to one or more of the embodiments disclosed above and/or according to one or more of the embodiments disclosed in further detail below. The tracking system further comprises at least one track controller, wherein the track controller is adapted to track a series of positions of the object at specific points in time.

In a further aspect of the present invention, a method for manufacturing an optical detector is disclosed. Preferably, the optical detector is an optical detector according to the present invention, such as according to one or more of the embodiments disclosed above and/or according to one or more of the embodiments disclosed in further detail below. Thus, for potential embodiments of the optical detector, reference may be made to the disclosure of the optical detector above and/or below. Other embodiments, however, are feasible.

The method comprises the following method steps. The method steps are given in a preferred order. It shall be noted, however, that the method steps may also be performed in a different order. Further, two or more or even all of the method steps may be performed simultaneously and/or in an overlapping fashion. Further, one, two or more of the method steps may be performed repeatedly. The method may comprise additional method steps which are not listed in the following.

The method steps are as follows:
a) manufacturing an optical sensor, wherein a photosensitive layer setup is deposited onto a substrate, the photosensitive layer setup having at least one first electrode, at least one second electrode and at least one photovoltaic material sandwiched in between the first electrode and the second electrode, wherein the photovoltaic material comprises at least one organic material, wherein the first electrode comprises a plurality of first electrode stripes and wherein the second electrode comprises a plurality of second electrode stripes, wherein the first electrode stripes and the second electrode stripes intersect such that a matrix of pixels is formed at intersections of the first electrode stripes and the second electrode stripes; and
b) connecting at least one readout device to the optical sensor, the readout device comprising a plurality of electrical measurement devices being connected to the second electrode stripes, the readout device further comprising at least one switching device for subsequently connecting the first electrode stripes to the electrical measurement devices.

With regard to potential embodiments of the optical sensor and/or the readout device as well as with regard to potential deposition techniques, reference may be made to the disclosure of the optical detector as given above and/or as given in further detail below.

The connection of the at least one readout device to the optical sensor, preferably to electrical contact pads of the optical sensor contacting the electrode stripes, may be performed in a permanent way and/or in a releasable way. Thus, in a most simple fashion, contact pins and/or contact clamps may be used for electrically contacting the electrode stripes. Additionally or alternatively, permanent connection techniques may be used, such as connector techniques known in display technology, such as liquid crystal display technology and/or other display technologies. Thus, the connection may take place by using one or more electrically conductive adhesives, such as one or more anisotropic electrically conductive adhesives and/or so-called zebra connectors, i.e. adhesive stripes having conductive portions and non-conductive portions. These techniques are generally known to the skilled person.

One or both of the method steps given above may comprise two or more sub-steps. Thus, as an example, method step a) may comprise the following sub-steps:

a1. providing the substrate;
a2. depositing at least one bottom electrode onto the substrate, wherein the bottom electrode is one of the first electrode or second electrode, wherein the bottom electrode comprises a plurality of bottom electrode stripes;
a3. depositing the at least one photovoltaic material onto the bottom electrode;
a4. depositing at least one top electrode onto the photovoltaic material, wherein the top electrode is the other one of the first electrode and the second electrode as compared to method step a2., wherein the top electrode comprises a plurality of top electrode stripes, wherein the top electrode stripes are deposited such that the bottom electrode stripes and the top electrode stripes intersect such that the matrix of pixels is formed.

For potential details of the substrate and the deposition of the bottom electrode and/or the top electrode, reference may be made to the disclosure given above and/or for further optional embodiments given below. For depositing the at least one photovoltaic material, reference may be made to known deposition techniques, such as deposition techniques disclosed in one or more of WO 2012/110924 A1, U.S. provisional application No. 61/739,173 or U.S. provisional application No. 61/749,964. Other deposition techniques, however, are feasible.

As outlined above, various techniques are feasible for patterning the bottom electrode. Thus, as an example, the bottom electrode may be deposited in an unpatterned way and may subsequently be patterned, preferably by using lithographic techniques such as etching techniques. These techniques, as an example, are known in the field of display technologies, such as for patterning indium-doped tin oxide (ITO), which may also be used within the present invention. Additionally or alternatively, the bottom electrode may be deposited in a patterned way, preferably by using one or more of a deposition technique through a mask, such as a shadow mask, or a printing technique.

Method step a3. may comprise a number of sub-steps by itself. Thus, as an example, the deposition of the at least one photovoltaic material may comprise a build-up of a layer setup of a plurality of photovoltaic materials. As an example, method step a3. may comprise the following method steps:

depositing at least one layer of a dense n-semiconducting metal oxide, preferably a dense layer of $TiO_2$;
depositing at least one layer of a nano-porous n-semiconducting metal oxide, preferably at least one layer of nano-porous $TiO_2$;
sensitizing the at least one layer of the nano-porous n-semiconducting metal oxide with at least one organic dye;
depositing at least one layer of a solid p-semiconducting organic material on top of the sensitized nano-porous n-semiconducting metal oxide.

The deposition techniques used for depositing these layers generally are known to the skilled person. Thus, again, reference may be made to the above-mentioned documents. As an example, for depositing the dense layer of the n-semiconducting metal oxide, spray pyrolysis deposition or physical vapor deposition techniques may be used, such as sputtering, preferably reactive sputtering. Thus, as an example, the at least one layer of the dense n-semiconducting metal oxide may comprise one or more layers of titanium dioxide, preferably having a thickness of 10 nm-500 nm. For depositing the at least one layer of the nano-porous n-semiconducting metal oxide, various deposition techniques may be used, such as wet processing and/or printing. As an example, wet coating techniques may be used, such as doctor blading and/or spin coating, of solutions and/or dispersions containing particles of the nano-porous n-semiconducting metal oxide, such as nano-porous titanium dioxide particles. As an example, the at least one layer of the nano-porous n-semiconducting metal oxide may comprise one or more layers having a thickness, in a dry state, of 10 nm-10000 nm.

For sensitizing the at least one layer of the nano-porous n-semiconducting metal oxide, various techniques may be used, preferably wet processing techniques, such as dip-coating, spraying, spin-coating, doctor blading, printing or other techniques or simply soaking the at least one layer of the nano-porous n-semiconducting metal oxide in a solution of the at least one organic dye.

Similarly, for depositing the at least one layer of the solid p-semiconducting organic material, known deposition techniques may be used, such as physical vapor deposition, preferably vacuum evaporation techniques, and/or wet processing techniques such as printing and/or spin-coating.

It shall be noted that the layer setup disclosed above may also be inverted, by performing the mentioned method steps in a reverse order.

The deposition of the at least one top electrode, as mentioned above, may be performed in various ways. Thus, as an example, a deposition in a patterned way may be performed, preferably by depositing the top electrode onto the photovoltaic material in a patterned way, such as by using a deposition through a shadow mask and/or a printing technique. Additionally or alternatively, as outlined above, depositing the top electrode onto the photovoltaic material may be performed in an unpatterned way, followed by at least one patterning step of the top electrode, such as by laser ablation and/or another patterning step. Again, additionally or alternatively, the deposition of the top electrode may fully or partially be performed by providing at least one separator on one or more of the substrate or the photovoltaic material or a part thereof, followed by an unpatterned deposition of the top electrode, wherein the top electrode is sub-divided into the top electrode stripes by the separator. Thus, for potential insulating separators, reference may be made to the documents listed above. Preferably, the at least one separator, which preferably comprises a plurality of separator stripes, may be a photoresist structure having sharp edges at the top, for sub-dividing the top electrode into the top electrode stripes.

As outlined above, the top electrode may be a pure electrode, such as pure metal electrode comprising one or more metal layers, or may be a composite electrode comprising one or more electrically conductive layers and one or more metal layers. Thus, as an example, method step a4. may comprise depositing at least one electrically conductive polymer on top of the photovoltaic material and, preferably subsequently, depositing at least one metal layer on top of the electrically conductive polymer. In this way, as an example, transparent top electrodes may be manufactured. Thus, as an example, the metal layer may have a thickness of less than 50 nm, preferably a thickness of less than 40 nm, more preferably a thickness of less than 30 nm. As outlined above, for metal thicknesses of less than 30 nm, such as thicknesses of less than 20 nm or even less, a transparency of the metal layers may be achieved. Electrical conductivity still may be provided by providing the electrically conductive polymer underneath the at least one metal layer. The at least one electrically conductive polymer, as outlined above, may be applied in an unpatterned way, followed by one or more patterning steps. Additionally or alternatively, the at least one layer of the electrically conductive polymer may be performed in a patterned way, such as by using one or more printing techniques. Again, additionally or alternatively, the at least one layer of the electrically conductive polymer may be patterned in a self-patterning step, such as by using the above-mentioned one or more electrically insulating separators. Thus, the electrically conductive polymer may be spin-coated on top of the substrate having the one or more electrically insulating separators, wherein the one or more electrically insulating separators are adapted to sub-divide the at least one layer of the electrically conductive polymer into a plurality of electrically conductive polymer stripes. Subsequently, one or more metal layers may be deposited, which, again, may be sub-divided into metal stripes by the one or more electrically insulating separators.

In a further aspect of the present invention, a method of taking at least one image of an object is disclosed. The object generally may be an arbitrary object of which an image may be taken. The method comprises the use of the optical detector according to the present invention, such as according to one or more of the above-mentioned embodiments and/or according to one or more of the embodiments mentioned in further detail below.

The method comprises the following method steps which may be performed in the given order. A different order, however, is feasible. Further, two or more of the method steps may be performed overlapping in time and/or simultaneously. Further, one or more or even all of the method steps may be performed repeatedly. Further, the method may comprise additional method steps which are not listed.

The method comprises the following steps:
imaging the object onto the optical sensor,
subsequently connecting the first electrode stripes to the measurement devices, wherein the measurement devices, for each first electrode stripe, measure corresponding electrical signals for the pixels of the respective first electrode stripe,
composing the electrical signals of the pixels to form an image.

The electrical signals of the pixels, as outlined above, may be stored within a data memory, such as a volatile and/or a non-volatile data memory. The data memory may provide an array of values representing the electrical signals, such as digital values, more preferably gray-scale values.

As outlined above, the method may be performed by using raw or primary electrical signals which may be subject to one or more processing steps. Thus, the electrical signals may comprise primary electrical signals in an analogue format, wherein the primary electrical signals, also referred to as raw electrical signals, may be transformed into secondary electrical signals.

The secondary electrical signals may be digital electrical signals. For transforming the primary electrical signals into secondary electrical signals, one or more analogue-digital converters may be used. It shall be noted, however, that, alternatively or additionally, other processing techniques besides analogue-digital conversion may be used, such as filtering techniques and/or data compression techniques. Preferably, however, the secondary electrical signals comprise gray-scale levels for each pixel. Thus, as an example, 4-bit gray-scale levels, 8-bit gray-scale levels or even 16-bit gray-scale levels may be used. Other embodiments are feasible.

In a further aspect of the present invention, a use of the optical detector according to the present invention, such as to one or more of the embodiments disclosed above and/or according to one or more of the embodiments disclosed in further detail below, is disclosed, for a purpose of use, selected from the group consisting of: a position measurement in traffic technology; an entertainment application; a security application; a safety application; a human-machine interface application; a tracking application; a photography application, such as an application for digital photography for arts, documentation or technical purposes.

Thus, generally, the optical detector according to the present invention may be applied in various fields of uses. Specifically, the optical detector may be applied for a purpose of use, selected from the group consisting of: a position measurement in traffic technology; an entertainment application; a security application; a human-machine interface application; a tracking application; a photography application; a mapping application for generating maps of at least one space, such as at least one space selected from the group of a room, a building and a street; a mobile application; an optical head-mounted display; a webcam; an audio device, a Dolby surround audio system; a computer peripheral device; a gaming application; a camera or video application; a security application; a surveillance application; an automotive application; a transport application; a medical application; a sports' application; a machine vision application; a vehicle application; an airplane application; a ship application; a spacecraft application; a building application; a construction application; a cartography application; a manufacturing application; a use in combination with at least one time-of-flight detector. Additionally or alternatively, applications in local and/or global positioning systems may be named, especially landmark-based positioning and/or navigation, specifically for use in cars or other vehicles (such as trains, motorcycles, bicycles, trucks for cargo transportation), robots or for use by pedestrians. Further, indoor positioning systems may be named as potential applications, such as for household applications and/or for robots used in manufacturing technology.

Thus, as for the optical detectors and devices disclosed in WO 2012/110924 A1 or in U.S. provisional applications 61/739,173, filed on Dec. 19, 2012, 61/749,964, filed on Jan. 8, 2013, and 61/867,169, filed on Aug. 19, 2013, and international patent application PCT/IB2013/061095, filed on Dec. 18, 2013, the optical detector, the detector system, the human-machine interface, the entertainment device, the tracking system or the camera according to the present invention (in the following simply referred to as "the devices according to the present invention" may be used for a plurality of application purposes, such as one or more of the purposes disclosed in further detail in the following.

Thus, firstly, the devices according to the present invention may be used in mobile phones, tablet computers, wearable computers, laptops, smart panels or other stationary or mobile computer or communication applications. Thus, the devices according to the present invention may be combined with at least one active light source, such as a light source emitting light in the visible range or infrared spectral range, in order to enhance performance. Thus, as an example, the devices according to the present invention may be used as cameras and/or sensors, such as in combination with mobile software for scanning environment, objects and living beings. The devices according to the present invention may even be combined with 2D cameras, such as conventional cameras, in order to increase imaging effects. The devices according to the present invention may further be used for surveillance and/or for recording purposes or as input devices to control mobile devices, especially in combination with voice and/or gesture recognition and/or eye tracking. Thus, specifically, the devices according to the present invention acting as human-machine interfaces, also referred to as input devices, may be used in mobile applications, such as for controlling other electronic devices or components via the mobile device, such as the mobile phone. As an example, the mobile application including at least one device according to the present invention may be used for controlling a television set, a game console, a music player or music device or other entertainment devices.

Further, the devices according to the present invention may be used in webcams or other peripheral devices for computing applications. Thus, as an example, the devices according to the present invention may be used in combination with software for imaging, recording, surveillance, scanning or motion detection. As outlined in the context of the human-machine interface and/or the entertainment device, the devices according to the present invention are particularly useful for giving commands by facial expressions and/or body expressions. The devices according to the present invention can be combined with other input generating devices like e.g. a mouse, a keyboard, a touchpad, a microphone, an eye tracker etc. Further, the devices according to the present invention may be used in applications for gaming, such as by using a webcam. Further, the devices according to the present invention may be used in virtual training applications and/or video conferences.

Further, the devices according to the present invention may be used in mobile audio devices, television devices and gaming devices, as partially explained above. Specifically, the devices according to the present invention may be used as controls or control devices for electronic devices, entertainment devices or the like. Further, the devices according to the present invention may be used for eye detection or eye tracking, such as in 2D- and 3D-display techniques, especially with transparent or intransparent displays for virtual and/or augmented reality applications and/or for recognizing whether a display is being looked at and/or from which perspective a display is being looked at.

Further, the devices according to the present invention may be used in or as digital cameras such as DSC cameras and/or in or as reflex cameras such as SLR cameras. For these applications, reference may be made to the use of the devices according to the present invention in mobile applications such as mobile phones and/or smart phones, as disclosed above.

Further, the devices according to the present invention may be used for security or surveillance applications. Thus, as an example, at least one device according to the present invention can be combined with one or more digital and/or analog electronics that will give a signal if an object is within or outside a predetermined area (e.g. for surveillance applications in banks or museums). Specifically, the devices according to the present invention may be used for optical encryption. Detection by using at least one device according to the present invention can be combined with other detection devices to complement wavelengths, such as with IR, x-ray, UV-VIS, radar or ultrasound detectors. The devices according to the present invention may further be combined with at least one active infrared light source and/or at least one active structured light source to allow detection in low light surroundings. The devices according to the present invention are generally advantageous as compared to active detector systems, specifically since the devices according to the present invention avoid actively sending signals which may be detected by third parties, as is the case e.g. in radar applications, ultrasound applications, LIDAR or similar active detector devices. Thus, generally, the devices according to the present invention may be used for an unrecognized and undetectable tracking of moving objects. Additionally, the devices according to the present invention generally are less prone to manipulation and irritations as compared to conventional devices.

Further, given the ease and accuracy of 3D detection by using the devices according to the present invention, the devices according to the present invention generally may be used for facial, body and person recognition and identification. Therein, the devices according to the present invention may be combined with other detection means for identification or personalization purposes such as passwords, finger prints, iris detection, voice recognition or other means. Thus, generally, the devices according to the present invention may be used in security devices and other personalized applications.

Further, the devices according to the present invention may be used as 3D barcode readers for product identification.

In addition to the security and surveillance applications mentioned above, the devices according to the present invention generally can be used for surveillance and monitoring of spaces and areas. Thus, the devices according to the present invention may be used for surveying and monitoring spaces and areas and, as an example, for triggering or executing alarms in case prohibited areas are violated. Thus, generally, the devices according to the present invention may be used for surveillance purposes in building surveillance or museums, optionally in combination with other types of sensors, such as in combination with motion or heat sensors, in combination with image intensifiers or image enhancement devices and/or photomultipliers.

Further, the devices according to the present invention may advantageously be applied in camera applications such as video and camcorder applications. Thus, the devices according to the present invention may be used for motion capture and 3D-movie recording. Therein, the devices according to the present invention generally provide a large number of advantages over conventional optical devices. Thus, the devices according to the present invention generally require a lower complexity with regard to optical components. Thus, as an example, the number of lenses may be reduced as compared to conventional optical devices, such as by providing the devices according to the present invention having one lens only. Due to the reduced complexity, very compact devices are possible, such as for mobile use. Conventional optical systems having two or more lenses with high quality generally are voluminous, such as due to the general need for voluminous beamsplitters. As a further advantage in potential applications of devices according to the present invention for motion capturing, the simplified combination of several cameras in order to cover a scene may be named, since absolute 3D information may be obtained. This also may simplify merging scenes recorded by two or more 3D-cameras. Further, the devices according to the present invention generally may be used for focus/autofocus devices, such as autofocus cameras. Further, the devices according to the present invention may also be used in optical microscopy, especially in confocal microscopy.

Further, the devices according to the present invention generally are applicable in the technical field of automotive technology and transport technology. Thus, as an example, the devices according to the present invention may be used as distance and surveillance sensors, such as for adaptive cruise control, emergency brake assist, lane departure warning, surround view, blind spot detection, rear cross traffic alert, and other automotive and traffic applications. Further, the devices according to the present invention can also be used for velocity and/or acceleration measurements, such as by analyzing a first and second time-derivative of position information gained by using the optical detector according to the present invention. This feature generally may be applicable in automotive technology, transportation technology or general traffic technology. As an example, a specific application in an indoor positioning system may be the detection of positioning of passengers in transportation, more specifically to electronically control the use of safety systems such as airbags. The use of an airbag may be prevented in case the passenger is located as such, that the use of an airbag will cause a severe injury. Applications in other fields of technology are feasible. For use in automotive systems, devices according to the present invention may be connected to one or more electronic control units of the vehicle and may enable further connections via controller area networks and the like. For testing purposes in automotive or other complex applications, especially for use in combination with further sensors and/or actuators, the integration in hardware-in-the-loop simulation systems is possible.

In these or other applications, generally, the devices according to the present invention may be used as stand-alone devices or in combination with other sensor devices, such as in combination with radar and/or ultrasonic devices. Specifically, the devices according to the present invention may be used for autonomous driving and safety issues. Further, in these applications, the devices according to the present invention may be used in combination with infrared sensors, radar sensors, which are sonic sensors, two-dimensional cameras or other types of sensors. In these applications, the generally passive nature of the devices according to the present invention is advantageous. Thus, since the devices according to the present invention generally do not require emitting signals, the risk of interference of active sensor signals with other signal sources may be avoided. The devices according to the present invention specifically may be used in combination with recognition software, such as standard image recognition software. Thus, signals and data as provided by the devices according to the present invention typically are readily processable and, therefore, generally require lower calculation power than established stereovision systems such as LIDAR. Given the low space demand, the devices according to the present invention such as cameras may be placed at virtually any place in a vehicle, such as on a window screen, on a front hood, on bumpers, on lights, on mirrors or other places and the like. Various optical detectors according to the present invention such as one or more optical detectors based on the effect disclosed within the present invention can be combined, such as in order to allow autonomously driving vehicles or in order to increase the performance of active safety concepts. Thus, various devices according to the present invention may be combined with one or more other devices according to the present invention and/or conventional sensors, such as in the windows like rear window, side window or front window, on the bumpers or on the lights.

A combination of at least one device according to the present invention such as at least one optical detector according to the present invention with one or more rain detection sensors is also possible. This is due to the fact that the devices according to the present invention generally are advantageous over conventional sensor techniques such as radar, specifically during heavy rain. A combination of at least one device according to the present invention with at least one conventional sensing technique such as radar may allow for a software to pick the right combination of signals according to the weather conditions.

Further, the devices according to the present invention generally may be used as break assist and/or parking assist and/or for speed measurements. Speed measurements can be integrated in the vehicle or may be used outside the vehicle, such as in order to measure the speed of other cars in traffic control. Further, the devices according to the present invention may be used for detecting free parking spaces in parking lots.

Further, the devices according to the present invention may be used in the fields of medical systems and sports. Thus, in the field of medical technology, surgery robotics, e.g. for use in endoscopes, may be named, since, as outlined above, the devices according to the present invention may require a low volume only and may be integrated into other devices. Specifically, the devices according to the present invention having one lens, at most, may be used for capturing 3D information in medical devices such as in endoscopes. Further, the devices according to the present invention may be combined with an appropriate monitoring software, in order to enable tracking and analysis of movements. These applications are specifically valuable e.g. in medical treatments and long-distance diagnosis and telemedicine. Further, applications for positioning the body of patients in tomography or radiotherapy are possible, or for measuring the body shape of patients before surgery, to detect diseases, or the like.

Further, the devices according to the present invention may be applied in the field of sports and exercising, such as for training, remote instructions or competition purposes. Specifically, the devices according to the present invention may be applied in the fields of dancing, aerobic, football, soccer, basketball, baseball, cricket, hockey, track and field, swimming, polo, handball, volleyball, rugby, sumo, judo, fencing, boxing etc. The devices according to the present invention can be used to detect the position of a ball, a bat, a sword, motions, etc., both in sports and in games, such as to monitor the game, support the referee or for judgment, specifically automatic judgment, of specific situations in sports, such as for judging whether a point or a goal actually was made.

The devices according to the present invention further may be used in rehabilitation and physiotherapy, in order to encourage training and/or in order to survey and correct movements. Therein, the devices according to the present invention may also be applied for distance diagnostics.

Further, the devices according to the present invention may be applied in the field of machine vision. Thus, one or more of the devices according to the present invention may be used e.g. as a passive controlling unit for autonomous driving and or working of robots. In combination with moving robots, the devices according to the present invention may allow for autonomous movement and/or autonomous detection of failures in parts. The devices according to the present invention may also be used for manufacturing and safety surveillance, such as in order to avoid accidents including but not limited to collisions between robots, production parts and living beings. In robotics, the safe and direct interaction of humans and robots is often an issue, as robots may severely injure humans when they are not recognized. Devices according to the present invention may help robots to position objects and humans better and faster and allow a safe interaction. Given the passive nature of the devices according to the present invention, the devices according to the present invention may be advantageous over active devices and/or may be used complementary to existing solutions like radar, ultrasound, 2D cameras, IR detection etc. One particular advantage of the devices according to the present invention is the low likelihood of signal interference. Therefore multiple sensors can work at the same time in the same environment, without the risk of signal interference. Thus, the devices according to the present invention generally may be useful in highly automated production environments like e.g. but not limited to automotive, mining, steel, etc. The devices according to the present invention can also be used for quality control in production, e.g. in combination with other sensors like 2-D imaging, radar, ultrasound, IR etc., such as for quality control or other purposes. Further, the devices according to the present invention may be used for assessment of surface quality, such as for surveying the surface evenness of a product or the adherence to specified dimensions, from the range of micrometers to the range of meters. Other quality control applications are feasible. In a manufacturing environment, the devices according to the present invention are especially useful for processing natural products such as food or wood, with a complex 3-dimensional structure to avoid large amounts of waste material. Further, devices according to the present invention may be used in to monitor the filling level of tanks, silos etc.

Further, the devices according to the present invention may be used in the polls, airplanes, ships, spacecraft and other traffic applications. Thus, besides the applications mentioned above in the context of traffic applications, passive tracking systems for aircraft, vehicles and the like may be named. The use of at least one device according to the present invention, such as at least one optical detector according to the present invention, for monitoring the speed and/or the direction of moving objects is feasible. Specifically, the tracking of fast moving objects on land, sea and in the air including space may be named. The at least one device according to the present invention, such as the at least one optical detector according to the present invention, specifically may be mounted on a still-standing and/or on a moving device. An output signal of the at least one device according to the present invention can be combined e.g. with a guiding mechanism for autonomous or guided movement of another object. Thus, applications for avoiding collisions or for enabling collisions between the tracked and the steered object are feasible. The devices according to the present invention generally are useful and advantageous due to the low calculation power required, the instant response and due to the passive nature of the detection system which generally is more difficult to detect and to disturb as compared to active systems, like e.g. radar. The devices according to the present invention are particularly useful but not limited to e.g. speed control and air traffic control devices.

The devices according to the present invention generally may be used in passive applications. Passive applications include guidance for ships in harbors or in dangerous areas, and for aircraft at landing or starting. Wherein, fixed, known active targets may be used for precise guidance. The same can be used for vehicles driving in dangerous but well defined routes, such as mining vehicles.

Further, as outlined above, the devices according to the present invention may be used in the field of gaming. Thus, the devices according to the present invention can be passive for use with multiple objects of the same or of different size, color, shape, etc., such as for movement detection in combination with software that incorporates the movement into its content. In particular, applications are feasible in implementing movements into graphical output. Further, applications of the devices according to the present invention for giving commands are feasible, such as by using one or more of the devices according to the present invention for gesture or facial recognition. The devices according to the present invention may be combined with an active system in order to work under e.g. low light conditions or in other situations in which enhancement of the surrounding conditions is required. Additionally or alternatively, a combination of one or more of the devices according to the present invention with one or more IR or VIS light sources is possible. A combination of an optical detector according to the present invention with special devices is also possible, which can be distinguished easily by the system and its software, e.g. and not limited to, a special color, shape, relative position to other devices, speed of movement, light, frequency used to modulate light sources on the device, surface properties, material used, reflection properties, transparency degree, absorption characteristics, etc. The device can, amongst other possibilities, resemble a stick, a racquet, a club, a gun, a knife, a wheel, a ring, a steering wheel, a bottle, a ball, a glass, a vase, a spoon, a fork, a cube, a dice, a figure, a puppet, a teddy, a beaker, a pedal, a hat, a pair of glasses, a helmet, a switch, a glove, jewelry, a musical instrument or an auxiliary device for playing a musical instrument, such as a plectrum, a drumstick or the like. Other options are feasible.

Further, the devices according to the present invention generally may be used in the field of building, construction and cartography. Thus, generally, one or more devices according to the present invention may be used in order to measure and/or monitor environmental areas, e.g. countryside or buildings. Therein, one or more of the devices according to the present invention may be combined with other methods and devices or can be used solely in order to monitor progress and accuracy of building projects, changing objects, houses, etc. the devices according to the present invention can be used for generating three-dimensional models of scanned environments, in order to construct maps of rooms, streets, houses, communities or landscapes, both from ground or from air. Potential fields of application may be construction, cartography, real estate management, land surveying or the like.

One or more devices according to the present invention can further be used for scanning of objects, such as in combination with CAD or similar software, such as for additive manufacturing and/or 3D printing. Therein, use may be made of the high dimensional accuracy of the devices according to the present invention, e.g. in x-, y- or z-direction or in any arbitrary combination of these directions, such as simultaneously. Further, the devices according to the present invention may be used in inspections and maintenance, such as pipeline inspection gauges.

As outlined above, the devices according to the present invention may further be used in manufacturing, quality control or identification applications, such as in product identification or size identification (such as for finding an optimal place or package, for reducing waste etc.). Further, the devices according to the present invention may be used in logisitics applications. Thus, the devices according to the present invention may be used for optimized loading or packing containers or vehicles. Further, the devices according to the present invention may be used for monitoring or controlling of surface damages in the field of manufacturing, for monitoring or controlling rental objects such as rental vehicles, and/or for insurance applications, such as for assessment of damages. Further, the devices according to the present invention may be used for identifying a size of material, object or tools, such as for optimal material handling, especially in combination with robots and/or for ensuring quality or accuracy in a manufacturing process, such as the accuracy of product size or volume or the optical precision of a manufactured lens. Further, the devices according to the present invention may be used for process control in production, e.g. for observing filling level of tanks. Further, the devices according to the present invention may be used for maintenance of production assets like, but not limited to, tanks, pipes, reactors, tools etc. Further, the devices according to the present invention may be used for analyzing 3D-quality marks. Further, the devices according to the present invention may be used in manufacturing tailor-made goods such as tooth inlays, dental braces, prosthesis, clothes or the like. The devices according to the present invention may also be combined with one or more 3D-printers for rapid prototyping, 3D-copying or the like. Further, the devices according to the present invention may be used for detecting the shape of one or more articles, such as for anti-product piracy and for anti-counterfeiting purposes.

Preferred Embodiments of the Photosensitive Layer Setup

In the following, examples of the photosensitive layer setup, specifically with regard to materials which may be used within this photosensitive layer setup, are disclosed. As outlined above, the photosensitive layer setup preferably is a photosensitive layer setup of a solar cell, more preferably an organic solar cell and/or a dye-sensitized solar cell (DSC), more preferably a solid dye-sensitized solar cell (sDSC). Other embodiments, however, are feasible.

As outlined above, preferably, the photosensitive layer setup comprises at least one photovoltaic material, such as at least one photovoltaic layer setup comprising at least two layers, sandwiched between the first electrode and the second electrode. Preferably, the photosensitive layer setup and the photovoltaic material comprise at least one layer of an n-semiconducting metal oxide, at least one dye and at least one p-semiconducting organic material. As an example, the photovoltaic material may comprise a layer setup having at least one dense layer of an n-semiconducting metal oxide such as titanium dioxide, at least one nano-porous layer of an n-semiconducting metal oxide contacting the dens layer of the n-semiconducting metal oxide, such as at least one nano-porous layer of titanium dioxide, at least one dye sensitizing the nano-porous layer of the n-semiconducting metal oxide, preferably an organic dye, and at least one layer of at least one p-semiconducting organic material, contacting the dye and/or the nano-porous layer of the n-semiconducting metal oxide.

The dense layer of the n-semiconducting metal oxide, as will be explained in further detail below, may form at least one barrier layer in between the first electrode and the at least one layer of the nano-porous n-semiconducting metal oxide. It shall be noted, however, that other embodiments are feasible, such as embodiments having other types of buffer layers.

The first electrode may be one of an anode or a cathode, preferably an anode. The second electrode may be the other one of an anode or a cathode, preferably a cathode. The first electrode preferably contacts the at least one layer of the n-semiconducting metal oxide, and the second electrode preferably contacts the at least one layer of the p-semiconducting organic material. The first electrode may be a bottom electrode, contacting a substrate, and the second electrode may be a top electrode facing away from the substrate. Alternatively, the second electrode may be a bottom electrode, contacting the substrate, and the first electrode may be the top electrode facing away from the substrate. Preferably, one or both of the first electrode and the second electrode are transparent.

In the following, some options regarding the first electrode, the second electrode and the photovoltaic material, preferably the layer setup comprising two or more photovoltaic materials, will be disclosed. It shall be noted, however, that other embodiments are feasible.

a) Substrate, First Electrode and n-semiconductive Metal Oxide

Generally, for preferred embodiments of the first electrode and the n-semiconductive metal oxide, reference may be made to WO 2012/110924 A1, U.S. provisional application No. 61/739,173 or U.S. provisional application No. 61/708,058, the full content of all of which is herewith included by reference. Other embodiments are feasible.

In the following, it shall be assumed that the first electrode is the bottom electrode directly or indirectly contacting the substrate. It shall be noted, however, that other setups are feasible, with the first electrode being the top electrode.

The n-semiconductive metal oxide which may be used in the photosensitive layer setup, such as in at least one dense film (also referred to as a solid film) of the n-semiconductive metal oxide and/or in at least one nano-porous film (also referred to as a nano-particulate film) of the n-semiconductive metal oxide, may be a single metal oxide or a mixture of different oxides. It is also possible to use mixed oxides. The n-semiconductive metal oxide may especially be porous and/or be used in the form of a nanoparticulate oxide, nanoparticles in this context being understood to mean particles which have an average particle size of less than 0.1 micrometer. A nanoparticulate oxide is typically applied to a conductive substrate (i.e. a carrier with a conductive layer as the first electrode) by a sintering process as a thin porous film with large surface area.

Preferably, the optical sensor uses at least one transparent substrate. However, setups using one or more intransparent substrates are feasible.

The substrate may be rigid or else flexible. Suitable substrates (also referred to hereinafter as carriers) are, as well as metal foils, in particular plastic sheets or films and especially glass sheets or glass films. Particularly suitable electrode materials, especially for the first electrode according to the above-described, preferred structure, are conductive materials, for example transparent conductive oxides (TCOs), for example fluorine- and/or indium-doped tin oxide (FTO or ITO) and/or aluminum-doped zinc oxide (AZO), carbon nanotubes or metal films. Alternatively or additionally, it would, however, also be possible to use thin metal films which still have a sufficient transparency. In case an intransparent first electrode is desired and used, thick metal films may be used.

The substrate can be covered or coated with these conductive materials. Since generally, only a single substrate is required in the structure proposed, the formation of flexible cells is also possible. This enables a multitude of end uses which would be achievable only with difficulty, if at all, with rigid substrates, for example use in bank cards, garments, etc.

The first electrode, especially the TCO layer, may additionally be covered or coated with a solid or dense metal oxide buffer layer (for example of thickness 10 to 200 nm), in order to prevent direct contact of the p-type semiconductor with the TCO layer (see Peng et al., Coord. Chem. Rev. 248, 1479 (2004)). The use of solid p-semiconducting electrolytes, in the case of which contact of the electrolyte with the first electrode is greatly reduced compared to liquid or gel-form electrolytes, however, makes this buffer layer unnecessary in many cases, such that it is possible in many cases to dispense with this layer, which also has a current-limiting effect and can also worsen the contact of the n-semiconducting metal oxide with the first electrode. This enhances the efficiency of the components. On the other hand, such a buffer layer can in turn be utilized in a controlled manner in order to match the current component of the dye solar cell to the current component of the organic solar cell. In addition, in the case of cells in which the buffer layer has been dispensed with, especially in solid cells, problems frequently occur with unwanted recombinations of charge carriers. In this respect, buffer layers are advantageous in many cases specifically in solid cells.

As is well known, thin layers or films of metal oxides are generally inexpensive solid semiconductor materials (n-type semiconductors), but the absorption thereof, due to large bandgaps, is typically not within the visible region of the electromagnetic spectrum, but rather usually in the ultraviolet spectral region. For use in solar cells, the metal oxides therefore generally, as is the case in the dye solar cells, have to be combined with a dye as a photosensitizer, which absorbs in the wavelength range of sunlight, i.e. at 300 to 2000 nm, and, in the electronically excited state, injects electrons into the conduction band of the semiconductor. With the aid of a solid p-type semiconductor used additionally in the cell as an electrolyte, which is in turn reduced at the counter electrode, electrons can be recycled to the sensitizer, such that it is regenerated.

Of particular interest for use in organic solar cells are the semiconductors zinc oxide, tin dioxide, titanium dioxide or mixtures of these metal oxides. The metal oxides can be used in the form of nanocrystalline porous layers. These layers have a large surface area which is coated with the dye as a sensitizer, such that a high absorption of sunlight is achieved. Metal oxide layers which are structured, for example nanorods, give advantages such as higher electron mobilities or improved pore filling by the dye.

The metal oxide semiconductors can be used alone or in the form of mixtures. It is also possible to coat a metal oxide with one or more other metal oxides. In addition, the metal oxides may also be applied as a coating to another semiconductor, for example GaP, ZnP or ZnS.

Particularly preferred semiconductors are zinc oxide and titanium dioxide in the anatase polymorph, which is preferably used in nanocrystalline form.

In addition, the sensitizers can advantageously be combined with all n-type semiconductors which typically find use in these solar cells. Preferred examples include metal oxides used in ceramics, such as titanium dioxide, zinc oxide, tin(IV) oxide, tungsten(VI) oxide, tantalum(V) oxide, niobium(V) oxide, cesium oxide, strontium titanate, zinc stannate, complex oxides of the perovskite type, for example barium titanate, and binary and ternary iron oxides, which may also be present in nanocrystalline or amorphous form.

Due to the strong absorption that customary organic dyes and ruthenium, phthalocyanines and porphyrins have, even thin layers or films of the n-semiconducting metal oxide are sufficient to absorb the required amount of dye. Thin metal oxide films in turn have the advantage that the probability of unwanted recombination processes falls and that the internal resistance of the dye subcell is reduced. For the n-semiconducting metal oxide, it is possible with preference to use layer thicknesses of 100 nm up to 20 micrometers, more preferably in the range between 500 nm and approx. 3 micrometers.

b) Dye

In the context of the present invention, as usual in particular for DSCs, the terms "dye", "sensitizer dye" and "sensitizer" are used essentially synonymously without any restriction of possible configurations. Numerous dyes which are usable in the context of the present invention are known from the prior art, and so, for possible material examples, reference may also be made to the above description of the prior art regarding dye solar cells. As a preferred example, one or more of the dyes disclosed in WO 2012/110924 A1, U.S. provisional application No. 61/739,173 or U.S. provisional application No. 61/708,058 may be used, the full content of all of which is herewith included by reference. Additionally or alternatively, one or more of the dyes as disclosed in WO 2007/054470 A1 and/or WO 2012/085803 A1 may be used, the full content of which is included by reference, too.

Dye-sensitized solar cells based on titanium dioxide as a semiconductor material are described, for example, in U.S. Pat. No. 4,927,721, Nature 353, p. 737-740 (1991) and U.S. Pat. No. 5,350,644, and also Nature 395, p. 583-585 (1998) and EP-A-1 176 646. The dyes described in these documents can in principle also be used advantageously in the context of the present invention. These dye solar cells preferably comprise monomolecular films of transition metal complexes, especially ruthenium complexes, which are bonded to the titanium dioxide layer via acid groups as sensitizers.

Many sensitizers which have been proposed include metal-free organic dyes, which are likewise also usable in the context of the present invention. High efficiencies of more than 4%, especially in solid dye solar cells, can be achieved, for example, with indoline dyes (see, for example, Schmidt-Mende et al, Adv. Mater. 2005, 17, 813). U.S. Pat. No. 6,359,211 describes the use, also implementable in the context of the present invention, of cyanine, oxazine, thiazine and acridine dyes which have carboxyl groups bonded via an alkylene radical for fixing to the titanium dioxide semiconductor.

Particularly preferred sensitizer dyes in the dye solar cell proposed are the perylene derivatives, terrylene derivatives and quaterrylene derivatives described in DE 10 2005 053 995 A1 or WO 2007/054470 A1. Further, as outlined above, one or more of the dyes as disclosed in WO 2012/085803 A1 may be used. The use of these dyes, which is also possible in the context of the present invention, leads to photovoltaic elements with high efficiencies and simultaneously high stabilities.

The rylenes exhibit strong absorption in the wavelength range of sunlight and can, depending on the length of the conjugated system, cover a range from about 400 nm (perylene derivatives I from DE 10 2005 053 995 A1) up to about 900 nm (quaterrylene derivatives I from DE 10 2005 053 995 A1). Rylene derivatives I based on terrylene absorb, according to the composition thereof, in the solid state adsorbed onto titanium dioxide, within a range from about 400 to 800 nm. In order to achieve very substantial utilization of the incident sunlight from the visible into the near infrared region, it is advantageous to use mixtures of different rylene derivatives I. Occasionally, it may also be advisable also to use different rylene homologs.

The rylene derivatives I can be fixed easily and in a permanent manner to the n-semiconducting metal oxide film. The bonding is effected via the anhydride function (x1) or the carboxyl groups —COOH or —COO— formed in situ, or via the acid groups A present in the imide or condensate radicals ((x2) or (x3)). The rylene derivatives I described in DE 10 2005 053 995 A1 have good suitability for use in dye-sensitized solar cells in the context of the present invention.

It is particularly preferred when the dyes, at one end of the molecule, have an anchor group which enables the fixing thereof to the n-type semiconductor film. At the other end of the molecule, the dyes preferably comprise electron donors Y which facilitate the regeneration of the dye after the electron release to the n-type semiconductor, and also prevent recombination with electrons already released to the semiconductor.

For further details regarding the possible selection of a suitable dye, it is possible, for example, again to refer to DE 10 2005 053 995 A1. By way of example, it is possible especially to use ruthenium complexes, porphyrins, other organic sensitizers, and preferably rylenes.

The dyes can be fixed onto or into the n-semiconducting metal oxide film, such as the nano-porous n-semiconducting metal oxide layer, in a simple manner. For example, the n-semiconducting metal oxide films can be contacted in the freshly sintered (still warm) state over a sufficient period (for example about 0.5 to 24 h) with a solution or suspension of the dye in a suitable organic solvent. This can be accomplished, for example, by immersing the metal oxide-coated substrate into the solution of the dye.

If combinations of different dyes are to be used, they may, for example, be applied successively from one or more solutions or suspensions which comprise one or more of the dyes. It is also possible to use two dyes which are separated by a layer of, for example, CuSCN (on this subject see, for example, Tennakone, K. J., Phys. Chem. B. 2003, 107, 13758). The most convenient method can be determined comparatively easily in the individual case.

In the selection of the dye and of the size of the oxide particles of the n-semiconducting metal oxide, the organic solar cell should be configured such that a maximum amount of light is absorbed. The oxide layers should be structured such that the solid p-type semiconductor can efficiently fill the pores. For instance, smaller particles have greater surface areas and are therefore capable of adsorbing a greater amount of dyes. On the other hand, larger particles generally have larger pores which enable better penetration through the p-conductor.

c) p-semiconducting Organic Material

As described above, the at least one photosensitive layer setup, such as the photosensitive layer setup of the DSC or sDSC, can comprise in particular at least one p-semiconducting organic material, preferably at least one solid p-semiconducting material, which is also designated hereinafter as p-type semiconductor or p-type conductor. Hereinafter, a description is given of a series of preferred examples of such organic p-type semiconductors which can be used individually or else in any desired combination, for example in a combination of a plurality of layers with a respective p-type semiconductor, and/or in a combination of a plurality of p-type semiconductors in one layer.

In order to prevent recombination of the electrons in the n-semiconducting metal oxide with the solid p-conductor, it is possible to use, between the n-semiconducting metal oxide and the p-type semiconductor, at least one passivation layer which has a passivating material. This layer should be very thin and should as far as possible cover only the as yet uncovered sites of the n-semiconducting metal oxide. The passivation material may, under some circumstances, also be applied to the metal oxide before the dye. Preferred passivation materials are especially one or more of the following substances: $Al_2O_3$; silanes, for example $CH_3SiCl_3$; $Al^{3+}$; 4-tert-butylpyridine (TBP); MgO; GBA (4-guanidinobutyric acid) and similar derivatives; alkyl acids; hexadecylmalonic acid (HDMA).

As described above, preferably one or more solid organic p-type semiconductors are used—alone or else in combination with one or more further p-type semiconductors which are organic or inorganic in nature. In the context of the present invention, a p-type semiconductor is generally understood to mean a material, especially an organic material, which is capable of conducting holes, that is to say positive charge carriers. More particularly, it may be an organic material with an extensive $\pi$-electron system which can be oxidized stably at least once, for example to form what is called a free-radical cation. For example, the p-type semiconductor may comprise at least one organic matrix material which has the properties mentioned. Furthermore, the p-type semiconductor can optionally comprise one or a plurality of dopants which intensify the p-semiconducting properties. A significant parameter influencing the selection of the p-type semiconductor is the hole mobility, since this partly determines the hole diffusion length (cf. Kumara, G., Langmuir, 2002, 18, 10493-10495). A comparison of charge carrier mobilities in different Spiro compounds can be found, for example, in T. Saragi, Adv. Funct. Mater. 2006, 16, 966-974.

Preferably, in the context of the present invention, organic semiconductors are used (i.e. one or more of low molecular weight, oligomeric or polymeric semiconductors or mixtures of such semiconductors). Particular preference is given to p-type semiconductors which can be processed from a liquid phase. Examples here are p-type semiconductors based on polymers such as polythiophene and polyarylamines, or on amorphous, reversibly oxidizable, nonpolymeric organic compounds, such as the spirobifluorenes mentioned at the outset (cf., for example, US 2006/0049397 and the Spiro compounds disclosed therein as p-type semiconductors, which are also usable in the context of the present invention). Preference is also given to using low molecular weight organic semiconductors, such as the low molecular weight p-type semiconducting materials as disclosed in WO 2012/110924 A1, preferably spiro-MeOTAD, and/or one or more of the p-type semiconducting materials disclosed in Leijtens et al., ACS Nano, VOL. 6, NO. 2, 1455-1462 (2012). In addition, reference may also be made to the remarks regarding the p-semiconducting materials and dopants from the above description of the prior art.

The p-type semiconductor is preferably producible or produced by applying at least one p-conducting organic material to at least one carrier element, wherein the application is effected for example by deposition from a liquid phase comprising the at least one p-conducting organic material. The deposition can in this case once again be effected, in principle, by any desired deposition process, for example by spin-coating, doctor blading, knife-coating, printing or combinations of the stated and/or other deposition methods.

The organic p-type semiconductor may especially comprise at least one Spiro compound such as spiro-MeOTAD and/or at least one compound with the structural formula:

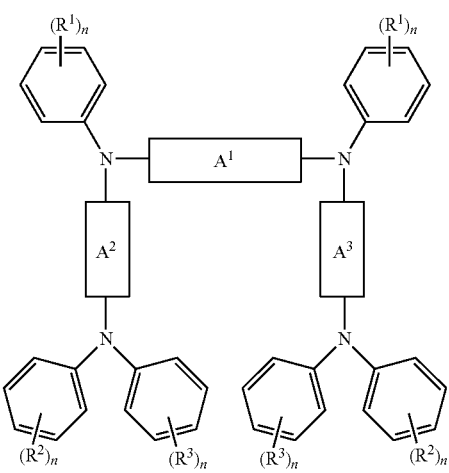

(I)

in which

A¹, A², A³ are each independently optionally substituted aryl groups or heteroaryl groups, R¹, R², R³ are each independently selected from the group consisting of the substituents —R, —OR, —NR₂, -A⁴-OR and -A⁴-NR₂, where R is selected from the group consisting of alkyl, aryl and heteroaryl, and where A⁴ is an aryl group or heteroaryl group, and where n at each instance in formula I is independently a value of 0, 1, 2 or 3, with the proviso that the sum of the individual n values is at least 2 and at least two of the R¹, R² and R³ radicals are —OR and/or —NR₂.

Preferably, A² and A³ are the same; accordingly, the compound of the formula (I) preferably has the following structure (Ia)

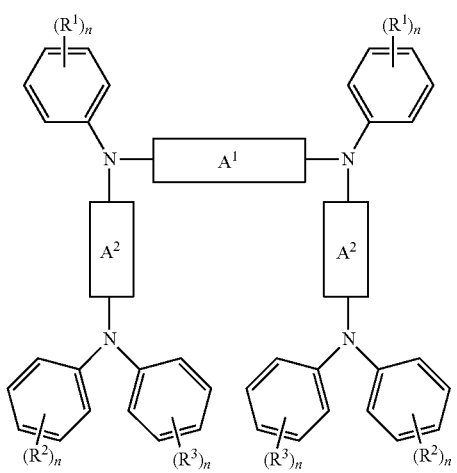

(Ia)

More particularly, as explained above, the p-type semiconductor may thus have at least one low molecular weight organic p-type semiconductor. A low molecular weight material is generally understood to mean a material which is present in monomeric, nonpolymerized or nonoligomerized form. The term "low molecular weight" as used in the present context preferably means that the p-type semiconductor has molecular weights in the range from 100 to 25 000 g/mol. Preferably, the low molecular weight substances have molecular weights of 500 to 2000 g/mol.

In general, in the context of the present invention, p-semiconducting properties are understood to mean the property of materials, especially of organic molecules, to form holes and to transport these holes and/or to pass them on to adjacent molecules. More particularly, stable oxidation of these molecules should be possible. In addition, the low molecular weight organic p-type semiconductors mentioned may especially have an extensive π-electron system. More particularly, the at least one low molecular weight p-type semiconductor may be processable from a solution. The low molecular weight p-type semiconductor may especially comprise at least one triphenylamine. It is particularly preferred when the low molecular weight organic p-type semiconductor comprises at least one Spiro compound. A Spiro compound is understood to mean polycyclic organic compounds whose rings are joined only at one atom, which is also referred to as the spiro atom. More particularly, the Spiro atom may be sp³-hybridized, such that the constituents of the spiro compound connected to one another via the Spiro atom are, for example, arranged in different planes with respect to one another.

More preferably, the Spiro compound has a structure of the following formula:

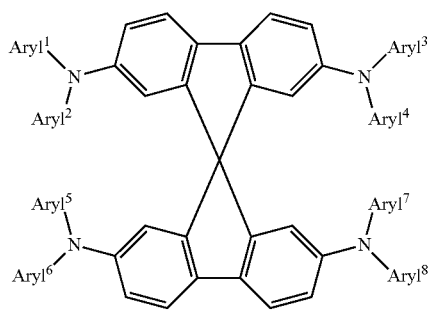

where the aryl¹, aryl², aryl³, aryl⁴, aryl⁵, aryl⁶, aryl⁷ and aryl⁸ radicals are each independently selected from substituted aryl radicals and heteroaryl radicals, especially from substituted phenyl radicals, where the aryl radicals and heteroaryl radicals, preferably the phenyl radicals, are each independently substituted, preferably in each case by one or more substituents selected from the group consisting of —O-alkyl, —OH, —F, —Cl, —Br and —I, where alkyl is preferably methyl, ethyl, propyl or isopropyl. More preferably, the phenyl radicals are each independently substituted, in each case by one or more substituents selected from the group consisting of —O-Me, —OH, —F, —Cl, —Br and —I.

Further preferably, the spiro compound is a compound of the following formula:

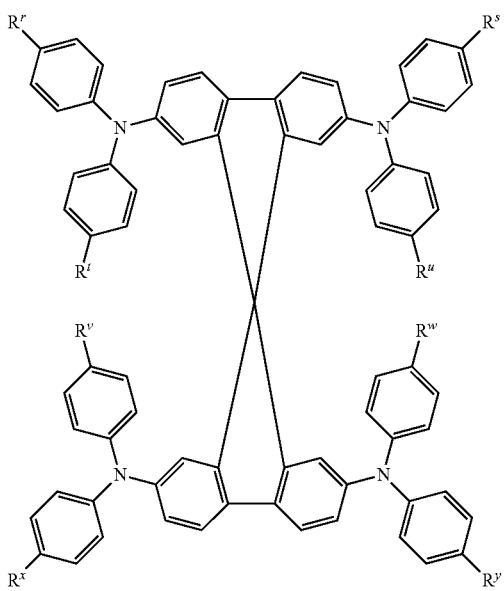

where $R^r$, $R^s$, $R^t$, $R^u$, $R^v$, $R^w$, $R^x$ and $R^y$ are each independently selected from the group consisting of —O-alkyl, —OH, —F, —Cl, —Br and —I, where alkyl is preferably methyl, ethyl, propyl or isopropyl. More preferably, $R^r$, $R^s$, $R^t$, $R^u$, $R^v$, $R^w$, $R^x$ and $R^y$ are each independently selected from the group consisting of —O-Me, —OH, —F, —Cl, —Br and —I.

More particularly, the p-type semiconductor may comprise spiro-MeOTAD or consist of spiro-MeOTAD, i.e. a compound of the formula below, commercially available from Merck KGaA, Darmstadt, Germany:

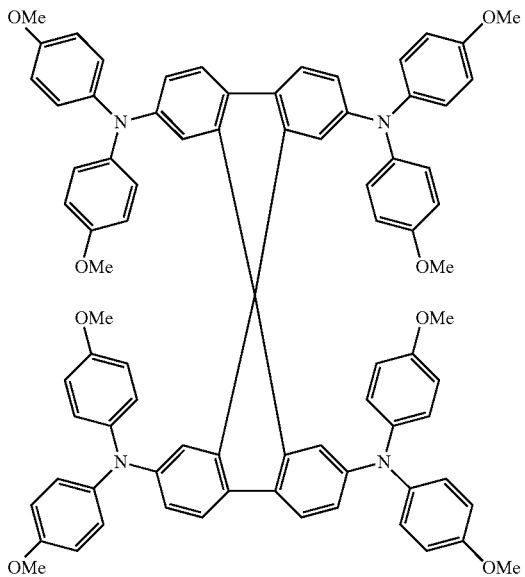 [SMILES: COc1ccc(N(c2ccc(OC)cc2)c2ccc3c(c2)C2(c4cc(N(c5ccc(OC)cc5)c5ccc(OC)cc5)ccc4-3)c3cc(N(c4ccc(OC)cc4)c4ccc(OC)cc4)ccc3-c3ccc(N(c4ccc(OC)cc4)c4ccc(OC)cc4)cc32)cc1]

Alternatively or additionally, it is also possible to use other p-semiconducting compounds, especially low molecular weight and/or oligomeric and/or polymeric p-semiconducting compounds.

In an alternative embodiment, the low molecular weight organic p-type semiconductor comprises one or more compounds of the above-mentioned general formula I, for which reference may be made, for example, to PCT application number PCT/EP2010/051826. The p-type semiconductor may comprise the at least one compound of the above-mentioned general formula I additionally or alternatively to the Spiro compound described above.

The term "alkyl" or "alkyl group" or "alkyl radical" as used in the context of the present invention is understood to mean substituted or unsubstituted $C_1$-$C_{20}$-alkyl radicals in general. Preference is given to $C_1$- to $C_{10}$-alkyl radicals, particular preference $C_1$- to $C_8$-alkyl radicals. The alkyl radicals may be either straight-chain or branched. In addition, the alkyl radicals may be substituted by one or more substituents selected from the group consisting of $C_1$-$C_{20}$-alkoxy, halogen, preferably F, and $C_6$-$C_{30}$-aryl which may in turn be substituted or unsubstituted. Examples of suitable alkyl groups are methyl, ethyl, propyl, butyl, pentyl, hexyl, heptyl and octyl, and also isopropyl, isobutyl, isopentyl, sec-butyl, tert-butyl, neopentyl, 3,3-dimethylbutyl, 2-ethylhexyl, and also derivatives of the alkyl groups mentioned substituted by $C_6$-$C_{30}$-aryl, $C_1$-$C_{20}$-alkoxy and/or halogen, especially F, for example $CF_3$.

The term "aryl" or "aryl group" or "aryl radical" as used in the context of the present invention is understood to mean optionally substituted $C_6$-$C_{30}$-aryl radicals which are derived from monocyclic, bicyclic, tricyclic or else multicyclic aromatic rings, where the aromatic rings do not comprise any ring heteroatoms. The aryl radical preferably comprises 5- and/or 6-membered aromatic rings. When the aryls are not monocyclic systems, in the case of the term "aryl" for the second ring, the saturated form (perhydro form) or the partly unsaturated form (for example the dihydro form or tetrahydro form), provided the particular forms are known and stable, is also possible. The term "aryl" in the context of the present invention thus comprises, for example, also bicyclic or tricyclic radicals in which either both or all three radicals are aromatic, and also bicyclic or tricyclic radicals in which only one ring is aromatic, and also tricyclic radicals in which two rings are aromatic. Examples of aryl are: phenyl, naphthyl, indanyl, 1,2-dihydronaphthenyl, 1,4-dihydronaphthenyl, fluorenyl, indenyl, anthracenyl, phenanthrenyl or 1,2,3,4-tetrahydronaphthyl. Particular preference is given to $C_6$-$C_{10}$-aryl radicals, for example phenyl or naphthyl, very particular preference to $C_6$-aryl radicals, for example phenyl. In addition, the term "aryl" also comprises ring systems comprising at least two monocyclic, bicyclic or multicyclic aromatic rings joined to one another via single or double bonds. One example is that of biphenyl groups.

The term "heteroaryl" or "heteroaryl group" or "heteroaryl radical" as used in the context of the present invention is understood to mean optionally substituted 5- or 6-membered aromatic rings and multicyclic rings, for example bicyclic and tricyclic compounds having at least one heteroatom in at least one ring. The heteroaryls in the context of the invention preferably comprise 5 to 30 ring atoms. They may be monocyclic, bicyclic or tricyclic, and some can be derived from the aforementioned aryl by replacing at least one carbon atom in the aryl base skeleton with a heteroatom. Preferred heteroatoms are N, O and S. The hetaryl radicals more preferably have 5 to 13 ring atoms. The base skeleton of the heteroaryl radicals is especially preferably selected from systems such as pyridine and five-membered heteroaromatics such as thiophene, pyrrole, imidazole or furan. These base skeletons may optionally be fused to one or two six-membered aromatic radicals. In addition, the term "heteroaryl" also comprises ring systems comprising at least two monocyclic, bicyclic or multicyclic aromatic rings joined to one another via single or double bonds, where at least one ring comprises a heteroatom. When the heteroaryls are not monocyclic systems, in the case of the term "heteroaryl" for at least one ring, the saturated form (perhydro form) or the partly unsaturated form (for example the dihydro form or tetrahydro form), provided the particular forms are known and stable, is also possible. The term "heteroaryl" in the context of the present invention thus comprises, for example, also bicyclic or tricyclic radicals in which either both or all three radicals are aromatic, and also bicyclic or tricyclic radicals in which only one ring is aromatic, and also tricyclic radicals in which two rings are aromatic, where at least one of the rings, i.e. at least one aromatic or one nonaromatic ring has a heteroatom. Suitable fused heteroaromatics are, for example, carbazolyl, benzimidazolyl, benzofuryl, dibenzofuryl or dibenzothiophenyl. The base skeleton may be substituted at one, more than one or all substitutable positions, suitable substituents being the same as have already been specified under the definition of $C_6$-$C_{30}$-aryl. However, the hetaryl radicals are preferably unsubstituted. Suitable hetaryl radicals are, for example, pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl and the corresponding benzofused radicals, especially carbazolyl, benzimidazolyl, benzofuryl, dibenzofuryl or dibenzothiophenyl.

In the context of the invention, the term "optionally substituted" refers to radicals in which at least one hydrogen radical of an alkyl group, aryl group or heteroaryl group has been replaced by a substituent. With regard to the type of this substituent, preference is given to alkyl radicals, for example methyl, ethyl, propyl, butyl, pentyl, hexyl, heptyl and octyl, and also isopropyl, isobutyl, isopentyl, sec-butyl, tert-butyl, neopentyl, 3,3-dimethylbutyl and 2-ethylhexyl, aryl radicals, for example $C_6$-$C_{10}$-aryl radicals, especially phenyl or naphthyl, most preferably $C_6$-aryl radicals, for example phenyl, and hetaryl radicals, for example pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl, and also the corresponding benzofused radicals, especially carbazolyl, benzimidazolyl, benzofuryl, dibenzofuryl or dibenzothiophenyl. Further examples include the following substituents: alkenyl, alkynyl, halogen, hydroxyl.

The degree of substitution here may vary from monosubstitution up to the maximum number of possible substituents.

Preferred compounds of the formula I for use in accordance with the invention are notable in that at least two of the $R^1$, $R^2$ and $R^3$ radicals are para-OR and/or —$NR_2$ substituents. The at least two radicals here may be only —OR radicals, only —$NR_2$ radicals, or at least one —OR and at least one —$NR_2$ radical.

Particularly preferred compounds of the formula I for use in accordance with the invention are notable in that at least four of the $R^1$, $R^2$ and $R^3$ radicals are para-OR and/or —$NR_2$ substituents. The at least four radicals here may be only —OR radicals, only —$NR_2$ radicals or a mixture of —OR and —$NR_2$ radicals.

Very particularly preferred compounds of the formula I for use in accordance with the invention are notable in that all of the $R^1$, $R^2$ and $R^3$ radicals are para-OR and/or —$NR_2$ substituents. They may be only —OR radicals, only —$NR_2$ radicals or a mixture of —OR and —$NR_2$ radicals.

In all cases, the two R in the —$NR_2$ radicals may be different from one another, but they are preferably the same.

Preferably, $A^1$, $A^2$ and $A^3$ are each independently selected from the group consisting of

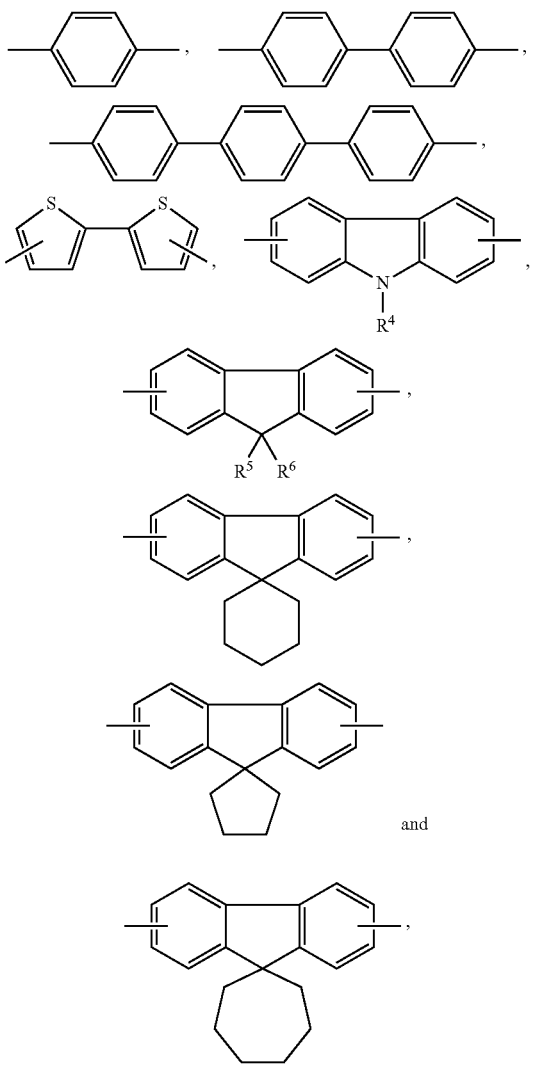

and in which m is an integer from 1 to 18, $R^4$ is alkyl, aryl or heteroaryl, where $R^4$ is preferably an aryl radical, more preferably a phenyl radical, $R^5$, $R^6$ are each independently H, alkyl, aryl or heteroaryl, where the aromatic and heteroaromatic rings of the structures shown may optionally have further substitution. The degree of substitution of the aromatic and heteroaromatic rings here may vary from monosubstitution up to the maximum number of possible substituents.

Preferred substituents in the case of further substitution of the aromatic and heteroaromatic rings include the substituents already mentioned above for the one, two or three optionally substituted aromatic or heteroaromatic groups.

Preferably, the aromatic and heteroaromatic rings of the structures shown do not have further substitution.

More preferably, $A^1$, $A^2$ and $A^3$ are each independently
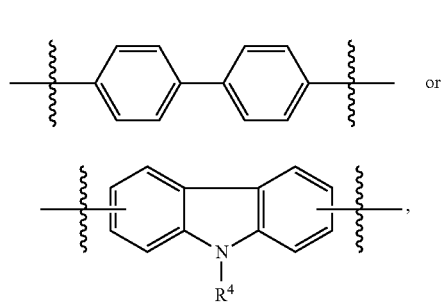 or
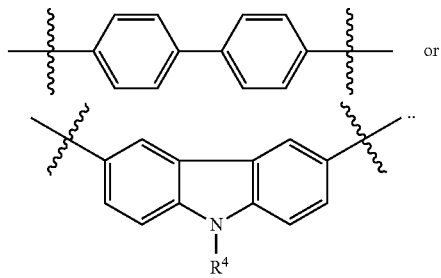 or
More preferably
More preferably, the at least one compound of the formula (I) has one of the following structures
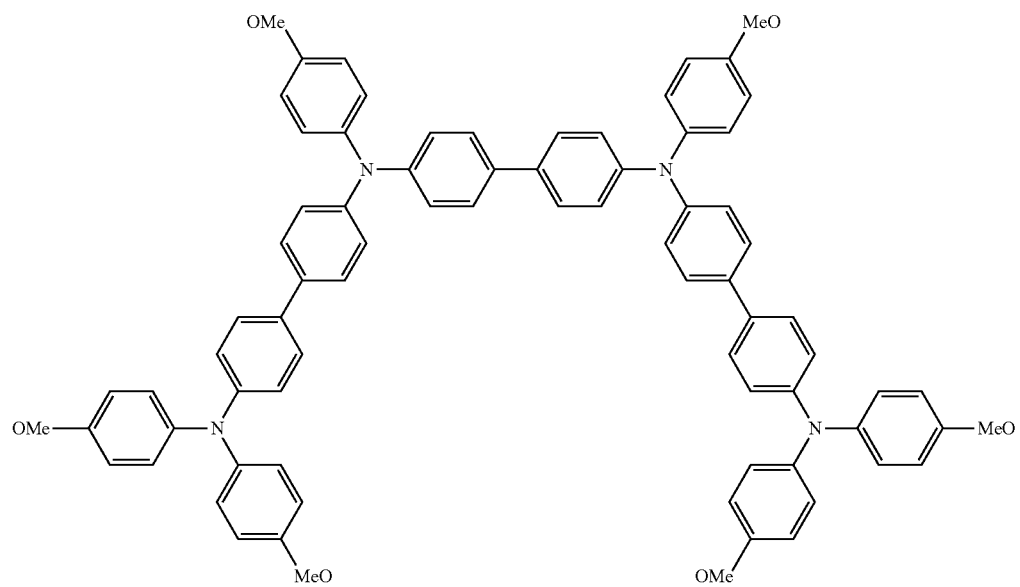
ID367
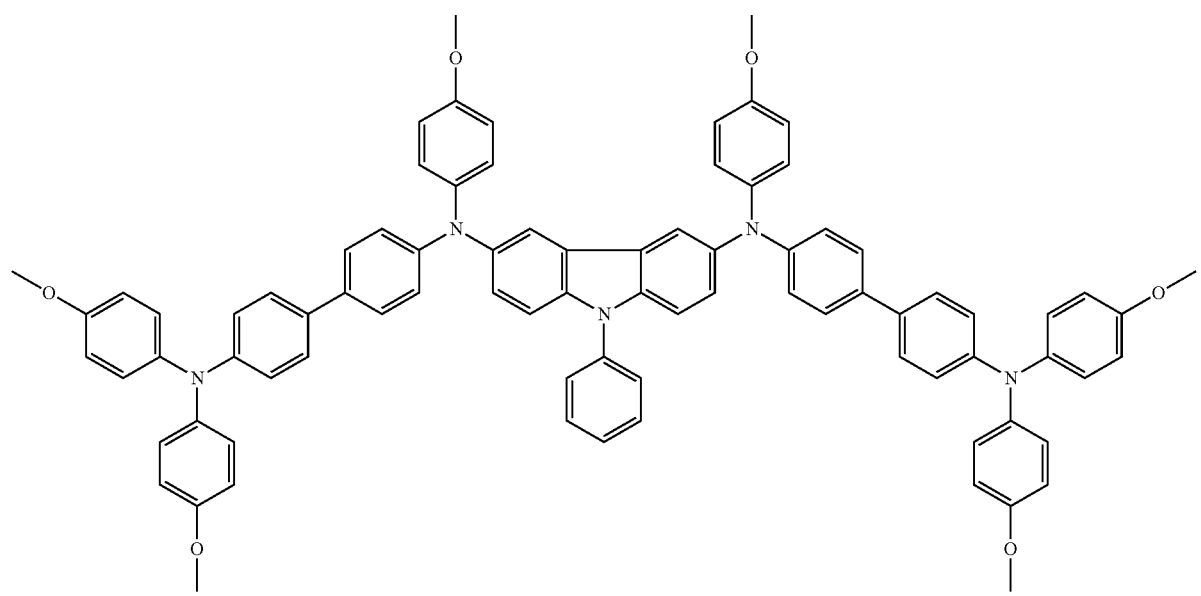
ID522

In an alternative embodiment, the organic p-type semiconductor comprises a compound of the type ID322 having the following structure:

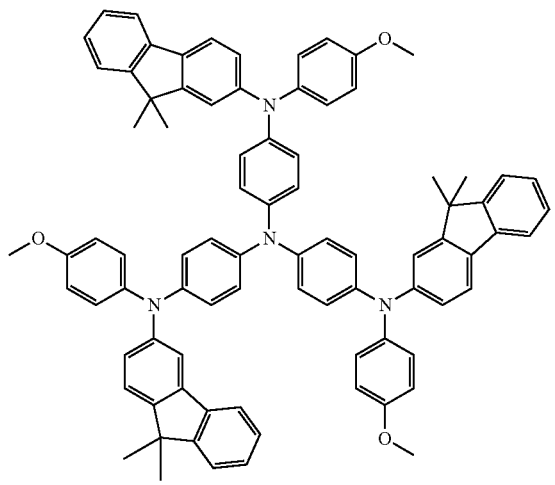 [SMILES: COc1ccc(N(c2ccc(N(c3ccc(N(c4ccc(OC)cc4)c4ccc5c(c4)C(C)(C)c4ccccc4-5)cc3)c3ccc(N(c4ccc(OC)cc4)c4ccc5c(c4)C(C)(C)c4ccccc4-5)cc3)cc2)c2ccc3c(c2)-c2ccccc2C3(C)C)cc1]

The compounds for use in accordance with the invention can be prepared by customary methods of organic synthesis known to those skilled in the art. References to relevant (patent) literature can additionally be found in the synthesis examples adduced below.

d) Second Electrode

The second electrode may be a bottom electrode facing the substrate or else a top electrode facing away from the substrate. As outlined above, the second electrode may be fully or partially transparent or, else, may be intransparent. As used herein, the term partially transparent refers to the fact that the second electrode may comprise transparent regions and intransparent regions.

One or more materials of the following group of materials may be used: at least one metallic material, preferably a metallic material selected from the group consisting of aluminum, silver, platinum, gold; at least one nonmetallic inorganic material, preferably LiF; at least one organic conductive material, preferably at least one electrically conductive polymer and, more preferably, at least one transparent electrically conductive polymer.

The second electrode may comprise at least one metal electrode, wherein one or more metals in pure form or as a mixture/alloy, such as especially aluminum or silver may be used.

Additionally or alternatively, nonmetallic materials may be used, such as inorganic materials and/or organic materials, both alone and in combination with metal electrodes. As an example, the use of inorganic/organic mixed electrodes or multilayer electrodes is possible, for example the use of LiF/Al electrodes. Additionally or alternatively, conductive polymers may be used. Thus, the second electrode of the optical sensor preferably may comprise one or more conductive polymers.

Thus, as an example, the second electrode may comprise one or more electrically conductive polymers, in combination with one or more layers of a metal. Preferably, the at least one electrically conductive polymer is a transparent electrically conductive polymer. This combination allows for providing very thin and, thus, transparent metal layers, by still providing sufficient electrical conductivity in order to render the second electrode both transparent and highly electrically conductive. Thus, as an example, the one or more metal layers, each or in combination, may have a thickness of less than 50 nm, preferably less than 40 nm or even less than 30 nm.

As an example, one or more electrically conductive polymers may be used, selected from the group consisting of: polyanaline (PANI) and/or its chemical relatives; a polythiophene and/or its chemical relatives, such as poly(3-hexylthiophene) (P3HT) and/or PEDOT:PSS (poly(3,4-ethylenedioxythiophene)poly(styrenesulfonate)). Additionally or alternatively, one or more of the conductive polymers as disclosed in EP2507286 A2, EP2205657 A1 or EP2220141 A1. For further exemplary embodiments, reference may be made to U.S. provisional application No. 61/739,173 or U.S. provisional application No. 61/708,058, the full content of all of which is herewith included by reference.

In addition or alternatively, inorganic conductive materials may be used, such as inorganic conductive carbon materials, such as carbon materials selected from the group consisting of: graphite, graphene, carbon nano-tubes, carbon nano-wires.

In addition, it is also possible to use electrode designs in which the quantum efficiency of the components is increased by virtue of the photons being forced, by means of appropriate reflections, to pass through the absorbing layers at least twice. Such layer structures are also referred to as "concentrators" and are likewise described, for example, in WO 02/101838 (especially pages 23-24).

Summarizing the findings of the present invention, the following embodiments are preferred:

Embodiment 1: An optical detector, comprising:
an optical sensor, having a substrate and at least one photosensitive layer setup disposed thereon, the photosensitive layer setup having at least one first electrode, at least one second electrode and at least one photovoltaic material sandwiched in between the first electrode and the second electrode, wherein the photovoltaic material comprises at least one organic material, wherein the first electrode comprises a plurality of first electrode stripes and wherein the second electrode comprises a plurality of second electrode stripes, wherein the first electrode stripes and the second electrode stripes intersect such that a matrix of pixels is formed at intersections of the first electrode stripes and the second electrode stripes; and
at least one readout device, the readout device comprising a plurality of electrical measurement devices being connected to the second electrode stripes and a switching device for subsequently connecting the first electrode stripes to the electrical measurement devices.

Embodiment 2: The optical detector according to the preceding embodiment, wherein the optical detector further comprises at least one optical element for optically imaging at least one object onto the optical sensor.

Embodiment 3: The optical sensor according to the preceding embodiment, wherein the at least one optical element comprises at least one lens.

Embodiment 4: The optical detector according to any one of the preceding embodiments, wherein the matrix of pixels has rows defined by the first electrode stripes and columns defined by the second electrode stripes, wherein each electrical measurement device is connected to a column, such that electrical signals for the pixels of each row may be measured simultaneously.

Embodiment 5: The optical detector according to the preceding embodiment, wherein the switching device is adapted to subsequently connect the rows to the electrical measurement devices.

Embodiment 6: The optical detector according to any one of the preceding embodiments, wherein the switching device is adapted to perform a multiplexing measurement scheme, wherein, in the multiplexing measurement scheme, the first electrode stripes are iteratively connected to the electrical measurement devices.

Embodiment 7: The optical detector according to any one of the preceding embodiments, wherein the electrical measurement devices each comprise at least one of a current measurement device and a voltage measurement device.

Embodiment 8: The optical detector according to any one of the preceding embodiments, wherein the electrical measurement devices are analogue measurement devices.

Embodiment 9: The optical detector according to the preceding embodiment, wherein the electrical measurement devices further comprise analogue-digital converters.

Embodiment 10: The optical detector according to any one of the preceding embodiments, wherein the readout device further comprises at least one data memory for storing measurement values for the pixels of the matrix of pixels.

Embodiment 11: The optical detector according to any one of the preceding embodiments, wherein one of the first electrode and the second electrode is a bottom electrode and wherein the other of the first electrode and the second electrode is a top electrode, wherein the bottom electrode is applied to a substrate, wherein the photovoltaic material is applied to the bottom electrode and at least partially covers the bottom electrode and wherein the top electrode is applied to the photovoltaic material.

Embodiment 12: The optical detector according to the preceding embodiment, wherein the substrate is a transparent substrate.

Embodiment 13: The optical detector according to any one of the two preceding embodiments, wherein at least one of the bottom electrode and the top electrode is transparent.

Embodiment 14: The optical detector according to the preceding embodiment, wherein the bottom electrode is transparent.

Embodiment 15: The optical detector according to the preceding embodiment, wherein the bottom electrode comprises a transparent conductive oxide, preferably a transparent conductive oxide selected from the group consisting of fluorine-doped tin oxide, indium-doped tin oxide and zinc oxide.

Embodiment 16: The optical detector according to any one of the preceding embodiments, wherein the top electrode comprises a plurality of metal electrode stripes.

Embodiment 17: The optical detector according to the preceding embodiment, wherein the metal electrode stripes are separated by electrically insulating separators.

Embodiment 18: The optical detector according to the preceding embodiment, wherein the electrically insulating separators are photoresist structures.

Embodiment 19: The optical detector according to any one of the two preceding embodiments, wherein the optical sensor comprises an n-semiconducting metal oxide, preferably a nano-porous n-semiconducting metal oxide, wherein the electrically insulating separators are deposited on top of the n-semiconducting metal oxide.

Embodiment 20: The optical detector according to the preceding embodiment, wherein the optical sensor further comprises at least one solid p-semiconducting organic material deposited on top of the n-semiconducting metal oxide, the solid p-semiconducting organic material being subdivided into a plurality of stripe-shaped regions by the electrically insulating separators.

Embodiment 21: The optical detector according to any one of the preceding embodiments, wherein the top electrode is transparent.

Embodiment 22: The optical detector according to the preceding embodiment, wherein the top electrode comprises at least one metal layer, the metal layer preferably having a thickness of less than 50 nm, more preferably a thickness of less than 40 nm, and most preferably a thickness of less than 30 nm.

Embodiment 23: The optical detector according to the preceding embodiment, wherein the metal layer comprises at least one metal selected from the group consisting of: Ag, Al, Ag, Au, Pt, Cu; and/or one or more alloys selected from the group consisting of NiCr, AlNiCr, MoNb and AlNd.

Embodiment 24: The optical detector according to any one of the three preceding embodiments, wherein the top electrode further comprises at least one electrically conductive polymer embedded in between the photovoltaic material and the metal layer.

Embodiment 25: The optical detector according to the preceding embodiment, wherein the electrically conductive polymer comprises at least one conjugated polymer.

Embodiment 26: The optical detector according to any one of the two preceding embodiments, wherein the electrically conductive polymer comprises at least one polymer selected from the group consisting of: a poly-3,4-ethylenedioxythiophene (PEDOT), preferably PEDOT being electrically doped with at least one counter ion, more preferably PEDOT doped with sodium polystyrene sulfonate (PEDOT: PSS); a polyaniline (PANI); a polythiophene.

Embodiment 27: The optical detector according to any one of the preceding embodiments, wherein the optical detector comprises at least one encapsulation protecting one or more of the photovoltaic material, the first electrode or the second electrode at least partially from moisture.

Embodiment 28: The optical detector according to any one of the preceding embodiments, wherein each pixel forms an individual photovoltaic device, preferably an organic photovoltaic device.

Embodiment 29: The optical detector according to the preceding embodiment, wherein each pixel forms a dye-sensitized solar cell, more preferably a solid dye-sensitized solar cell.

Embodiment 30: The optical detector according to any one of the preceding embodiments, wherein the at least one optical sensor comprises at least one optical sensor having at least one sensor region and being capable of providing at least one sensor signal, wherein the sensor signal, given the same total power of illumination of the sensor region by the light beam, is dependent on a geometry of the illumination, in particular on a beam cross section of the illumination of the sensor area.

Embodiment 31: The detector according to any one of the preceding embodiments, wherein the at least one optical sensor comprises at least one stack of optical sensors, each optical sensor having at least one sensor region and being capable of providing at least one sensor signal, wherein the sensor signal, given the same total power of illumination of the sensor region by the light beam, is dependent on a geometry of the illumination, in particular on a beam cross section of the illumination on the sensor area, wherein the evaluation device is adapted to compare at least one sensor signal generated by at least one pixel of a first one of the optical sensors with at least one sensor signal generated by at least one pixel of a second one of the optical sensors.

Embodiment 32: The optical detector according to any one of the preceding embodiments, wherein the photovoltaic material comprises at least one n-semiconducting metal oxide, at least one dye, and at least one solid p-semiconducting material, preferably at least one p-semiconducting organic material.

Embodiment 33: The optical detector according to the preceding embodiment, wherein the n-semiconducting metal oxide comprises at least one nano-porous n-semiconducting metal oxide.

Embodiment 34: The optical detector according to the preceding embodiment, wherein the nano-porous n-semiconducting metal oxide is sensitized with at least one organic dye.

Embodiment 35: The optical detector according to any one of the two preceding embodiments, wherein the n-semiconducting metal oxide further comprises at least one dense layer of the n-semiconducting metal oxide.

Embodiment 36: The optical detector according to any one of the preceding embodiments, wherein the optical detector comprises a stack of at least two imaging devices, wherein at least one of the imaging devices is the optical sensor.

Embodiment 37: The optical detector according to the preceding embodiment, wherein the stack of imaging devices further comprises at least one additional imaging device, preferably at least one additional imaging device selected from the group consisting of a CCD chip and a CMOS chip.

Embodiment 38: The optical detector according to any one of the two preceding embodiments, wherein the stack comprises at least two imaging devices having differing spectral sensitivities.

Embodiment 39: The optical detector according to any one of the three preceding embodiments, wherein the stack comprises at least two optical sensors.

Embodiment 40: The optical detector according to the preceding embodiment, wherein the stack comprises optical sensors having differing spectral sensitivities.

Embodiment 41: The optical detector according to the preceding embodiment, wherein the stack comprises the optical sensors having differing spectral sensitivities in an alternating sequence.

Embodiment 42: The optical detector according to any one of the six preceding embodiments, wherein the optical detector is adapted to acquire three-dimensional image by evaluating sensor signals of the optical sensors.

Embodiment 43: The optical detector according to the preceding embodiment, wherein the optical detector is adapted to acquire a multicolor three-dimensional image, preferably a full-color three-dimensional image, by evaluating sensor signals of the optical sensors having differing spectral properties.

Embodiment 44: The optical detector according to any one of the eight preceding embodiments, wherein the optical detector is adapted to acquire a three-dimensional image of a scene within a field of view of the optical detector.

Embodiment 45: The optical detector according to any one of the preceding embodiments, wherein the detector further comprises at least one time-of-flight detector adapted for detecting at least one distance between the at least one object and the optical detector by performing at least one time-of-flight measurement.

Embodiment 46: The optical detector according to any one of the preceding embodiments, wherein the photosensitive layer setup comprises at least 3 first electrode stripes, preferably at least 10 first electrode stripes, more preferably at least 30 first electrode stripes and most preferably at least 50 first electrode stripes.

Embodiment 47: The optical detector according to any one of the preceding embodiments, wherein the photosensitive layer setup comprises at least 3 second electrode stripes, preferably at least 10 second electrode stripes, more preferably at least 30 second electrode stripes and most preferably at least 50 second electrode stripes.

Embodiment 48: The optical detector according to any one of the preceding embodiments, wherein the photosensitive layer setup comprises 3-1200 first electrode stripes and 3-1200 second electrode stripes, preferably 10-1000 first electrode stripes and 10-1000 second electrode stripes and more preferably 50-500 first electrode stripes and 50-500 second electrode stripes.

Embodiment 49: The optical detector according to any one of the preceding embodiments, wherein the optical sensor is transparent.

Embodiment 50: A detector system for determining a position of at least one object, the detector system comprising at least one optical detector according to any one of the preceding embodiments, the detector system further comprising at least one beacon device adapted to direct at least one light beam towards the optical detector, wherein the beacon device is at least one of attachable to the object, holdable by the object and integratable into the object.

Embodiment 51: The detector system according to the preceding embodiment, wherein the beacon device comprises at least one illumination source.

Embodiment 52: The detector system according to any one of the two preceding embodiments, wherein the beacon device comprises at least one reflective device adapted to reflect a primary light beam generated by an illumination source independent from the object.

Embodiment 53: The detector system according to any one of the three preceding embodiments, wherein the detector system comprises at least two beacon devices, preferably at least three beacon devices.

Embodiment 54: The detector system according to any one of the four preceding embodiments, wherein the detector system further comprises the at least one object.

Embodiment 55: The detector system according to the preceding embodiment, wherein the object is a rigid object.

Embodiment 56: The detector system according to any one of the two preceding embodiments, wherein the object is selected from the group consisting of: an article of sports equipment, preferably an article selected from the group consisting of a racket, a club, a bat; an article of clothing; a hat; a shoe; a helmet; a pair of glasses.

Embodiment 57: A human-machine interface for exchanging at least one item of information between a user and a machine, wherein the human-machine interface comprises at least one detector system according to any one of the preceding embodiments referring to a detector system, wherein the at least one beacon device is adapted to be at least one of directly or indirectly attached to the user and held by the user, wherein the human-machine interface is designed to determine at least one position of the user by means of the detector system, wherein the human-machine interface is designed to assign to the position at least one item of information.

Embodiment 58: An entertainment device for carrying out at least one entertainment function, wherein the entertainment device comprises at least one human-machine interface according to the preceding embodiment, wherein the entertainment device is designed to enable at least one item of information to be input by a player by means of the human-machine interface, wherein the entertainment device is designed to vary the entertainment function in accordance with the information.

Embodiment 59: A tracking system for tracking a position of at least one movable object, the tracking system comprising at least one detector system according to any one of the preceding embodiments referring to a detector system, the tracking system further comprising at least one track controller, wherein the track controller is adapted to track a series of positions of the object at specific points in time.

Embodiment 60: A camera for imaging at least one object, the camera comprising at least one optical detector according to any one of the preceding embodiments referring to an optical detector.

Embodiment 61: A method for manufacturing an optical detector, the method comprising the following steps:
a) manufacturing an optical sensor, wherein a photosensitive layer setup is deposited onto a substrate, the photosensitive layer setup having at least one first electrode, at least one second electrode and at least one photovoltaic material sandwiched in between the first electrode and the second electrode, wherein the photovoltaic material comprises at least one organic material, wherein the first electrode comprises a plurality of first electrode stripes and wherein the second electrode comprises a plurality of second electrode stripes, wherein the first electrode stripes and the second electrode stripes intersect such that a matrix of pixels is formed at intersections of the first electrode stripes and the second electrode stripes; and
b) connecting at least one readout device to the optical sensor, the readout device comprising a plurality of electrical measurement devices being connected to the second electrode stripes, the readout device further comprising at least one switching device for subsequently connecting the first electrode stripes to the electrical measurement devices.

Embodiment 62: The method according to the preceding embodiment, wherein method step a) comprises the following sub-steps:
a1. providing the substrate;
a2. depositing at least one bottom electrode onto the substrate, wherein the bottom electrode is one of the first electrode or second electrode, wherein the bottom electrode comprises a plurality of bottom electrode stripes;
a3. depositing the at least one photovoltaic material onto the bottom electrode;
a4. depositing at least one top electrode onto the photovoltaic material, wherein the top electrode is the other one of the first electrode and the second electrode as compared to method step a2., wherein the top electrode comprises a plurality of top electrode stripes, wherein the top electrode stripes are deposited such that the bottom electrode stripes and the top electrode stripes intersect such that the matrix of pixels is formed.

Embodiment 63: The method according to the preceding embodiment, wherein method step a2. comprises one of the following patterning techniques:
the bottom electrode is deposited in an unpatterned way and subsequently patterned, preferably by using the lithography;
the bottom electrode is deposited in a patterned way, preferably by using one or more of a deposition technique through a mask or a printing technique.

Embodiment 64: The method according to any one of the two preceding embodiments, wherein method step a3. comprises:
depositing at least one layer of a dense n-semiconducting metal oxide, preferably $TiO_2$;
depositing at least one layer of a nano-porous n-semiconducting metal oxide, preferably at least one layer of nano-porous $TiO_2$;
sensitizing the at least one layer of the nano-porous n-semiconducting metal oxide with at least one organic dye;
depositing at least one layer of a solid p-semiconducting organic material.

Embodiment 65: The method according to any one of the three preceding embodiments, wherein method step a4 comprises one or more of the following:
depositing the top electrode onto the photovoltaic material in a patterned way, preferably by using a deposition through a shadow mask and/or a printing technique;
depositing the top electrode onto the photovoltaic material in an unpatterned way, followed by at least one patterning step;
providing at least one separator on one or more of the substrate or the photovoltaic material, followed by an unpatterned deposition of the top electrode, wherein the top electrode is sub-divided into the top electrode stripes by the separator.

Embodiment 66: The method according any of the three preceding embodiments, wherein method step a4. comprises depositing at least one electrically conductive polymer on top of the photovoltaic material and depositing at least one metal layer on top of the electrically conductive polymer.

Embodiment 65: The method according to the preceding embodiment, wherein the metal layer has a thickness of less than 50 nm, preferably a thickness of less than 40 nm, more preferably a thickness of less than 30 nm.

Embodiment 68: A method of taking at least one image of an object, the method comprising a use of the optical detector according to any one of the preceding embodiments referring to an optical detector, the method comprising the following steps:
imaging the object onto the optical sensor,
subsequently connecting the first electrode stripes to the electrical measurement devices, wherein the electrical measurement devices, for each first electrode stripe, measure electrical signals for the pixels of the respective first electrode stripe,
composing the electrical signals of the pixels to form an image.

Embodiment 69: The method according to the preceding embodiment, wherein electrical signals of the pixels are stored within a data memory, the data memory providing an array of values representing the electrical signals.

Embodiment 70: The method according to any one of the two preceding embodiments, wherein the electrical signals comprise primary electrical signals in an analogue format, the primary electrical signals being transformed into secondary electrical signals being digital electrical signals by using analogue-digital converters.

Embodiment 71: The method according to the preceding embodiment, wherein the secondary electrical signals comprise gray-scale levels for each pixel.

Embodiment 72: A use of the optical detector according to any one of the preceding embodiments relating to an optical detector, for a purpose of use, selected from the group consisting of: a position measurement in traffic technology; an entertainment application; a security application; a safety application; a human-machine interface application; a tracking application; a photography application; a use in combination with at least one time-of-flight detector.

BRIEF DESCRIPTION OF THE FIGURES

Further optional details and features of the invention are evident from the description of preferred exemplary embodiments which follows in conjunction with the dependent claims. In this context, the particular features may be implemented alone or with several in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures.

EXEMPLARY EMBODIMENTS

Figure 1:
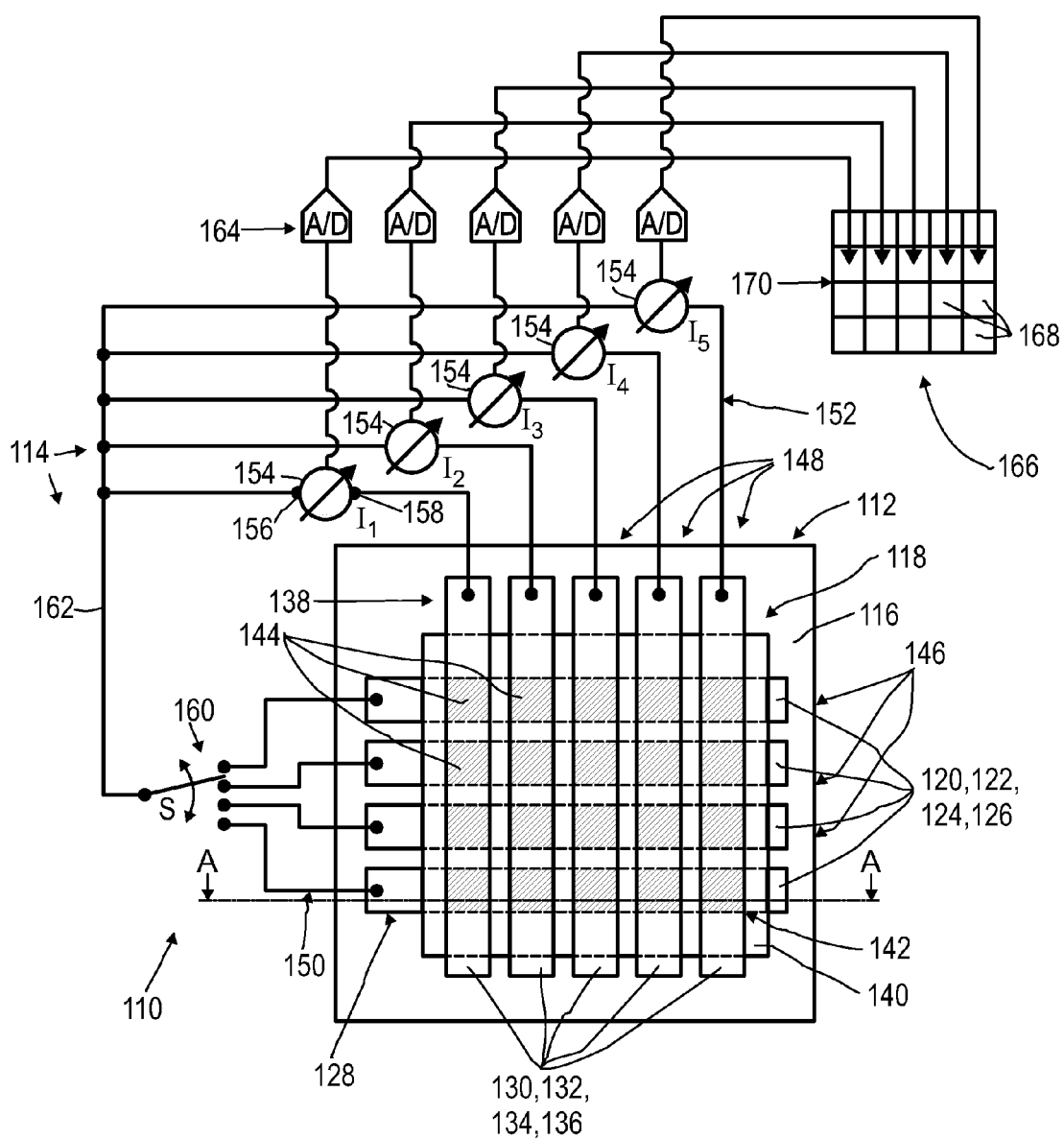
FIG. 1 shows an embodiment of an optical detector having an optical sensor and a readout device.

In FIG. 1, a top view of an embodiment of an optical detector 110 according to the present invention is shown. The optical detector 110 comprises, in this embodiment, one or more optical sensors 112 and at least one readout device 114 connected to or connectable to the optical sensor 112.

The optical sensor 112 comprises a substrate 116 and at least one photosensitive layer setup 118 disposed thereon. The photosensitive layer setup 118 comprises a first electrode 120 which, in this embodiment, may be embodied as a bottom electrode 122. It shall be noted, however, that the first electrode 120 may as well be a top electrode, as discussed above. The first electrode 120 comprises a plurality of first electrode stripes 124, which, accordingly, are embodied as bottom electrode stripes 126 and, which, alternatively, may as well be embodied as top electrode stripes. Each of the first electrode stripes 124 comprises at least one contact pad 128 for electrically contacting the respective first electrode stripe 124.

The photosensitive layer setup 118 further comprises at least one second electrode 130 which may be embodied as a top electrode 132. As outlined above, the second electrode 130, alternatively, may be embodied as a bottom electrode and, thus, the setup shown in FIG. 1 may as well be reversed. The second electrode 130 comprises a plurality of second electrode stripes 134 which, accordingly, may be embodied as top electrode stripes 136. As outlined above, a reverse setup, with the second electrode stripes 134 being bottom electrode stripes, is feasible, as well.

The second electrode stripes 134, similar to the setup of the first electrode stripes 124, may electrically be contacted via contact pads 138.

It shall be noted that, in the exemplary embodiment shown in FIG. 1, four first electrode stripes 124 and five second electrode stripes 134 are depicted. A different number of first electrode stripes 124 and/or a different number of second electrode stripes 134 is feasible, as well.

The photosensitive layer setup 118 further comprises at least one photovoltaic material 140 sandwiched in between the first electrode 120 and the second electrode 130. Preferably, the photovoltaic material 140 is applied such that the contact pads 128 remain uncovered by the photovoltaic material 140. Exemplary details of the photovoltaic material 140 will be given with regard to FIGS. 2A to 2C below.

As can be seen in FIG. 1, the first electrode stripes 124 and the second electrode stripes 134 intersect such that a matrix 142 of pixels 144 is formed. Each pixel 144 comprises a portion of a first electrode stripe 124, a portion of a second electrode stripe 134 and a portion of the photovoltaic material 140 sandwiched in between. In this exemplary embodiment shown in FIG. 1, the matrix 142 is a rectangular matrix, with the pixels 144 disposed in rows 146 (horizontal direction in FIG. 1) and columns 148 (vertical direction in FIG. 1). Thus, as an example, each of the pixels 144 may be identified by a row number and a column number.

Each of the first electrode stripes 124 and the bottom electrode stripes 126, in this embodiment, is contacted via a respective first lead 150 contacting the contact pads 128. Similarly, each of the second electrode stripes 134 and each of the top electrode stripes 136 is electrically contacted by a respective second lead 152 electrically contacting the contact pads 138. Further, the readout device 114 comprises a plurality of measurement devices 154. Preferably, one measurement device 154 is provided per column. It shall be noted that, as will be explained in further detail below, the embodiment in FIG. 1 shows a row-switching. Alternatively, a column-switching is feasible. In the latter case, preferably, one measurement device 154 is provided per row. Further, it is generally possible to combine measurement devices 154, such as by multiple columns 148 sharing a measurement device 154 and/or by combining measurement devices 154 for a plurality of columns 148 into a single integrated device, such as an ASIC.

The measurement devices 154 may be adapted to generate at least one electrical signal. Thus, preferably, the measurement devices 154 may be selected from the group consisting of current measurement devices, as indicated in FIG. 1, and/or voltage measurement devices. In the embodiment depicted in FIG. 1, current measurement devices are provided, adapted to measure electrical currents for the columns 148, indicated by $I_1, \ldots, I_5$.

The measurement devices 154 each may comprise ports 156, 158, wherein a first port 156 may be connected to a switching device 160, preferably an automatic switching device 160, and wherein a second port 158 is connected to the respective column 148 via the respective second lead 152. As may be seen in FIG. 1, the first ports 156 of the measurement devices 154 may be combined in a combined lead 162 connecting the first ports 156 to the switching device 160.

The switching device 160, also referred to as S in FIG. 1, is adapted to selectively connect the combined lead 162 and/or the first ports 156 to the first leads 150. Thus, preferably, the switching device 160 subsequently connects the first leads 150 to the combined lead 162. Thus, a subsequent switching from the top row 146 to the bottom row 146 may take place, followed by switching back to the top row. Alternative switching schemes are possible. Further, as outlined above, the optical sensor 112 and/or the readout 114 may be adapted to sub-divide the matrix 142 into sub-matrices which are switched and/or selected separately.

In each position of the switching device 160, a specific row 146 is connected to the combined lead 162 and, thus, is connected to all first ports 156 of the measurement devices 154. Thus, a specific row 146 is selected, and the measurement devices 154 are adapted to measure signals for the respective pixels 144 of the selected row. The signals may be processed, such as by using analogue-digital-converters 164 and may be stored in a data memory 166. As an example, the data memory 166 may comprise a plurality of data fields 168 which may correspond to the pixels 144 of the matrix 142. Thus, for each measurement signal, a corresponding field of the data memory 166 may be selected, and the measurement value, preferably a digital measurement value, may be stored in the respective data field 168. Thus, the data memory 166, when the switching device 160 switches through the rows 146, subsequently is filled in a row-by-row fashion with corresponding measurement values. Finally, the data memory 166, with the entity of data fields 168 and their corresponding measurement values, will represent an image 170 in an electronic format.

It shall be noted that, in this embodiment or other embodiments, the switching by the switching device 160 preferably takes place automatically, by using a predetermined multiplexing scheme. These multiplexing schemes as well as corresponding switching devices 160 generally are known in the field of display technology. In display technology, however, switching devices 160 are used for passive-matrix addressing of display pixels, such as for providing appropriate voltages and/or currents through these pixels. In the present invention, however, an inverse passive matrix scheme is used, by using the switching device 160 for measurement purposes, in order to readout electrical signals from the pixels 146.

Figure 2A:
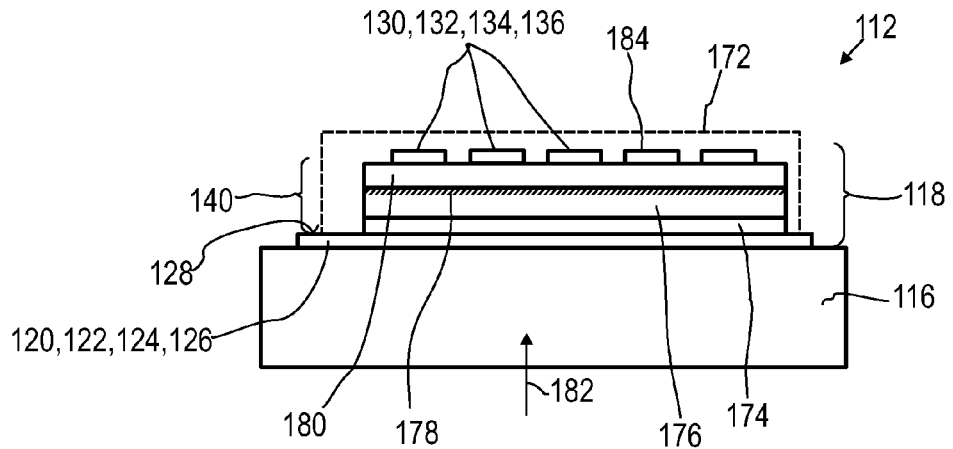
FIGS. 2A to 2C show cross-sectional views along cutting line A-A to the optical detector in FIG. 1, with various embodiments of layer setups.
Figure 2B:
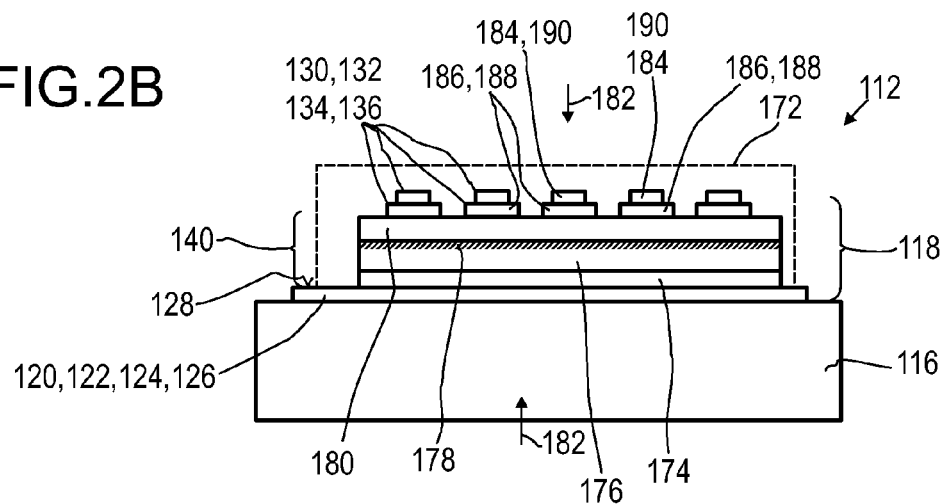
Figure 2C:
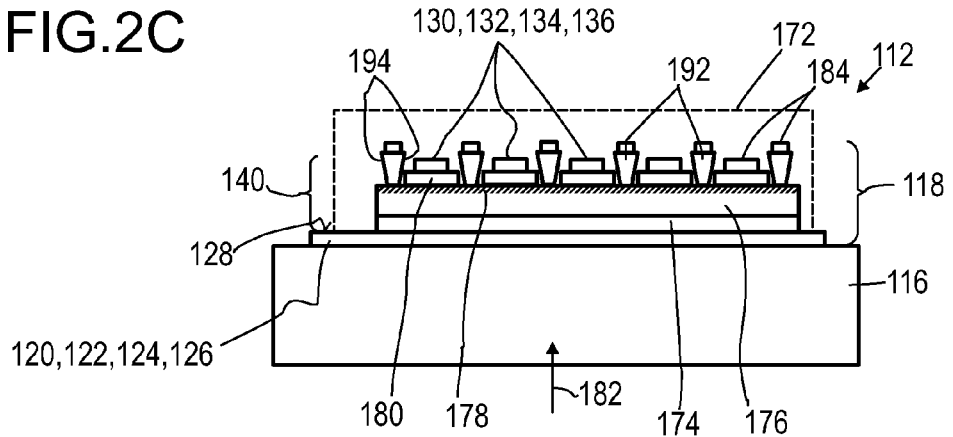

In FIGS. 2A to 2C, cross-sectional views through the optical sensor 112 along cutting line A-A in FIG. 1 are given. Therein, various possible embodiments of layer setups of the optical sensor 112 are depicted. It shall be noted, however, that other layer setups are possible. The readout device 114 and/or leads 150, 152 are not depicted in these figures.

As depicted in all embodiments shown in FIG. 2C and as discussed above, the optical sensor 112 comprises a substrate 116 with a photosensitive layer setup 118 disposed thereon. Further, the photosensitive layer setup 118 may fully or partially be covered by one or more encapsulations 172, such as at least one encapsulation element like a glass cover, a metal cover or a ceramic cover. Additionally or alternatively, one or more encapsulation layers may be coated on top of the photosensitive layer setup 118. The encapsulation 172 may be transparent or intransparent. Preferably, at least in the setup shown in FIG. 2B, the encapsulation 172 may fully or partially be transparent. The encapsulation 172 may be located such that the contact pads 128 and/or the contact pads 138 (not shown in FIGS. 2A to 2C) remain uncovered by the encapsulation 172 and, thus, are accessible for electrical contacting.

As can be seen in FIG. 1 discussed above, the first electrode 120, in all embodiments, comprises a plurality of first electrode stripes 124. As an example, fluorine-doped tin oxide (FTO) may be used. The patterning into stripes may be performed by standard lithographic techniques known from display technology, such as etching techniques. Thus, as an example, a large-area coating of the substrate 116 with FTO may be provided, and the regions of the first electrode stripes 124 may be covered with a photoresist. Subsequently, regions uncovered by the photoresist may be etched by standard etching techniques, such as wet etching and/or dry etching, in order to remove the FTO from these portions.

On top of the first electrode 120, the photovoltaic material 140 is disposed. In the embodiments shown in FIG. 2C, which are given as exemplary embodiments only, without restricting the possibility of using other types of photovoltaic materials 140 and/or other types of layer setups, the photovoltaic material 140 comprises a dense layer of an n-semiconducting metal oxide 174 disposed on top of the first electrode 120. The dense layer 174 acts as a barrier layer and may e.g. have a thickness of 10 nm to 500 nm. On top of the dense layer 174, one or more layers 176 of a nano-porous n-semiconducting metal oxide may be disposed. On top of the layer 176 and/or within the layer 176, at least one organic dye 178 may be applied, such as by doping and/or soaking the layer 176, at least partially, with the organic dye 178. Additionally or alternatively, a separate layer of the organic dye 178 may be disposed on top of the layer 176.

On top of the layer 176 and/or on top of the organic dye 178, one or more layers of a solid p-semiconducting organic material 180 are disposed. Generally, for the layers 174, 176 and 180 as well as for the organic dye 178, reference may be made to the exemplary embodiments given above. Further, with regard to processing techniques and/or materials or combinations of materials, reference may be made to one or more of WO 2012/110924 A1, U.S. 61/739,173 and U.S. 61/749,964. Despite the fact that, within the present invention, the bottom electrode 122 is a stripe-shaped bottom electrode 122, the same materials and/or processing techniques may be used.

In the embodiment shown in FIG. 2A, after subsequently depositing the layers of the photosensitive layer setup 118, the second electrode stripes 134 are deposited. For this purpose, metal stripes may be deposited by known deposition techniques, such as thermal evaporation and/or electron beam evaporation and/or sputtering. In order to generate the stripe-shaped pattern, as an example, a shadow mask may be used. Thus, regions of the surface of the setup outside the second electrode stripes 134 may be covered by the shadow mask, whereas regions in which the second electrode stripes 134 are to be deposited may be left uncovered. As an example, a steel mask may be used, with slot-shaped openings corresponding to the shape of the second electrode stripes 134. The setup, with this shadow mask on top, may be inserted into a vacuum bell, and, as an example, an aluminum layer may be deposited ton top, such as by using electron beam evaporation and/or thermal evaporation from a crucible. As an example, the at least one metal layer of the second electrode stripes 134 may have a thickness of 20 nm to 500 nm, preferably a thickness of 30 nm to 300 nm. Thus, in the embodiment shown in FIG. 2A, symbolically, an illumination is denoted by reference number 182. In this embodiment, the illumination takes place through the substrate 116, which, preferably, may be a glass substrate and/or a plastic substrate with transparent properties. Additionally or alternatively, however, an illumination from the top, i.e. from the opposite direction, may take place. In order to provide sufficient light within the photosensitive layer setup 118, in this case, the encapsulation 172 preferably is fully or partially transparent and, additionally, the second electrode stripes 134 may be provided as transparent second electrode stripes 134. In order to provide transparent second electrode stripes 134, several techniques may be used. Thus, as outlined above, thin metal layers may be used. Thus, specifically for aluminum, a sufficient transparency in the visible spectral range may be provided in case a metal layer thickness of less than 40 nm, preferably less than 30 nm or even 20 nm or less is provided. However, with decreasing metal layer thickness, an insufficient electrical conductivity along the second electrode stripes 134 may occur.

In order to circumvent this problem, the one or more metal layers of the second electrode 130 may be replaced and/or supported by fully transparent electrically conductive materials. Thus, as an example, one or more electrically conductive polymer layers may be used for the second electrode stripes 134, as shown in an alternative embodiment depicted in FIG. 2B. In this embodiment, which may be used for generating a transparent optical sensor 112 which may be illuminated from one or both sides and which may even be adapted to pass light, again, the second electrode stripes 134 comprise one or more metal layers 184, as in FIG. 2A. Additionally, however, in between the metal layers 184 of the second electrode stripes 134 and the p-semiconducting organic material 180, one or more layers 186 of an electrically conductive organic material are interposed. Preferably, the at least one layer 186 of the electrically conductive polymer is patterned, in order to provide electrically conductive polymer stripes 188 which are fully or partially covered by metal stripes 190. The stripes 188 and 190, in combination, form the second electrode stripes 134 and/or the top electrode stripes 136.

As discussed above, in this embodiment and/or in other embodiments, in order to keep the metal stripes 190 transparent, a thickness of less than 40 nm, preferably less than 30 nm, is preferred for the metal stripes 190. The layer 186 of the electrically conductive polymer provides additional electric conductivity, in order to sustain appropriate electrical currents.

As discussed above, the metal stripes 190 may be generated by various metal deposition techniques, such as physical vapor deposition, preferably sputtering and/or thermal evaporation and/or electron beam evaporation. Thus, as an example, one or more aluminum layers may be deposited. In order to pattern the electrically conductive polymer stripes 188, the electrically conductive polymer may be applied in a patterned fashion. Thus, as an example, various printing techniques for the electrically conductive polymer may be used. For exemplary embodiments of printing techniques, reference may be made to printing techniques known in the technology of organic light-emitting displays and/or printing techniques known from organic electronics. Thus, as an example, reference may be made to the screen-printing techniques as disclosed in US 2004/0216625 A1. Additionally or alternatively, other types of printing techniques may be used, such as printing techniques selected from the group consisting of screen-printing, inkjet printing, flexo printing or other techniques.

The embodiments shown in FIGS. 2A and 2B are embodiments of a patterned deposition of the top electrode 132, such as the second electrode 130. Thus, deposition techniques are used in which the top electrode 132 is deposited in a patterned fashion. As outlined above, additionally or alternatively, other techniques are feasible. Thus, generally, a large-area deposition is possible, followed by a patterning step, such as a laser ablation and/or an etching technique. Additionally or alternatively, as discussed above, self-patterning techniques may be used. Thus, the optical sensor 112 itself may comprise one or more separation elements 192, as depicted in an exemplary embodiment shown in FIG. 2C. These separation elements 192, as an example, may be longitudinal bars applied to the substrate 116 and/or to one or more layers of the photosensitive layer setup 118. In the cross-sectional view, the separation elements, also referred to as separators, run perpendicular to the plane of view, parallel to the second electrode stripes 134. The separators 192, on or close to their upper ends, may provide sharp edges 194, such as by providing a trapezoidal shape. When evaporating the one or more metal layers 184 of the top electrode 132, with or without a shadow mask limiting the area of evaporation, the metal layer 184 breaks at the sharp edges 194 and, thus, separated metal stripes in between neighboring separators 192 occur, forming the top electrode stripes 136.

This self-patterning technique generally is known from display technology. Thus, as an example, the separators 192 may fully or partially be made of photoresist structures. For patterning these photoresist structures, reference may be made to one or more of US 2003/0017360 A1, US 2005/0052120 A1, US 2003/0094607 A1 or other patterning techniques.

The self-patterning may be applied to the top electrode 132 only. However, as depicted in the embodiment in FIG. 2C, additionally, the self-patterning by the one or more separators 192 may as well be used for patterning one or more additional layers and/or elements of the optical sensor. Thus, as an example, one or more organic layers may be patterned that way. As an example, the organic dye 178 and/or the p-semiconducting organic material 180 may be patterned fully or partially by the at least one separator 192. Thus, generally, the at least one separator 192 may be applied before applying the one or more organic components of the photosensitive layer setup 118. As an example, the one or more separators 192 may be applied after preparing the at least one layer 176 of nano-porous n-semiconducting metal oxide. Since typical photoresist patterning techniques require aggressive etching steps and/or aggressive heating steps, such as heating to temperatures above 100° C., these steps might be detrimental for organic materials. Thus, the separators 192 might be created before applying the organic materials, such as before applying the at least one organic dye 178 and/or before applying the at least one p-semiconducting organic material 180. As known from display technology, an application of organic materials and a patterning of the organic materials is feasible in a homogeneous way, even though the one or more separators 192 are present on the substrate 116. Thus, the one or more organic dyes 178 and/or the one or more p-semiconducting organic materials 180 may be applied by known deposition techniques, such as vacuum evaporation (CVD and/or PVD), wet processing (such as spin coating and/or printing) or other deposition techniques. With regard to patterning of the separators 192, potential geometries of the separators 192, potential materials of the separators 192 and other details of these separators 192, reference may be made to the documents disclosed above.

It shall be noted that, in addition to the at least one metal layer 184, again, one or more layers of an electrically conductive polymer may be deposited, such as one or more layers of PEDOT:PSS, as e.g. used in the embodiment of FIG. 2B. Thus, as in FIG. 2B, a transparent top electrode 132 may be manufactured even when using the one or more separators 192.

Figure 3:
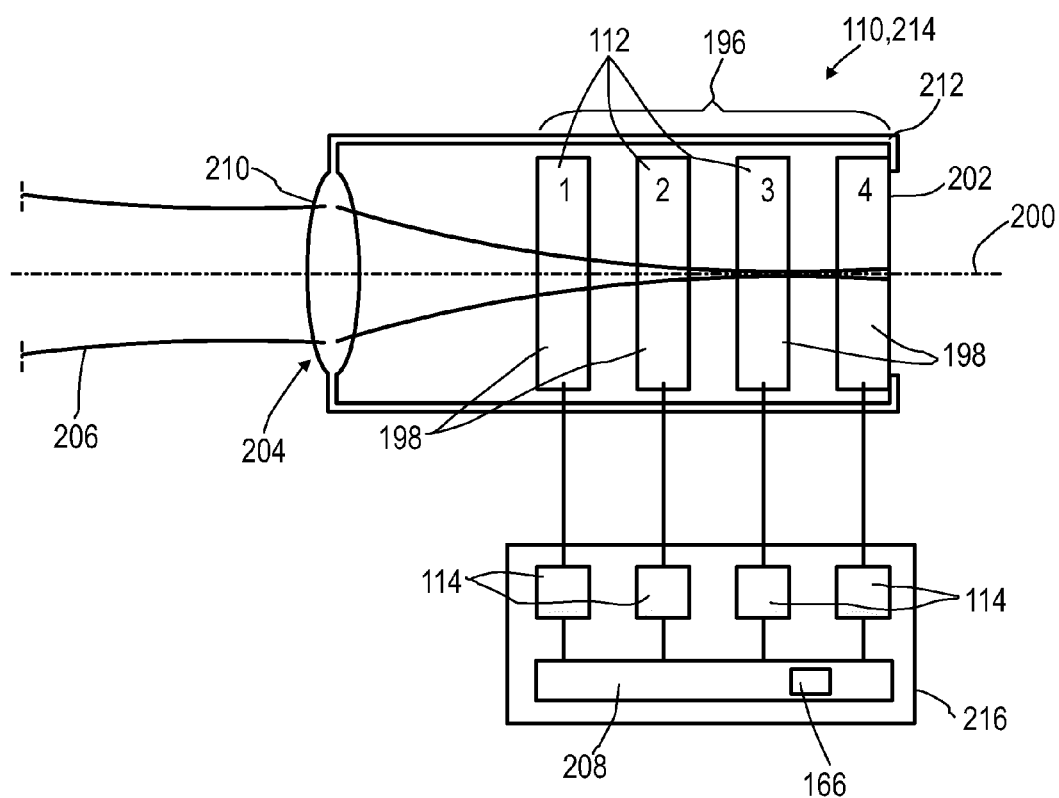
FIG. 3 shows a cross-sectional view of an optical detector having a stack of imaging devices.

The optical detector 110, besides the at least one optical sensor 112, may comprise one or more additional elements. Thus, in FIG. 3, an exemplary embodiment of the optical detector 110 is shown in a cross-sectional view. The optical detector 110, as an example, may be embodied as a camera 214 for photographic purposes. In this embodiment, the optical detector 110 comprises a stack 196 of at least two, preferably at least three, imaging devices 198. The imaging devices 198 are stacked along an optical axis 200 of the optical detector 110. At least one of the imaging devices 198 is an optical sensor 112 as defined in claim 1 and/or as disclosed in one or more of the embodiments discussed above, such as one or more of the embodiments shown in FIG. 1 or 2A to 2C. As an example, the stack 196 may comprise three optical sensors 112, such as in positions numbered 1, 2 and 3 in FIG. 3. Additionally, the stack 196 may comprise one or more additional imaging devices 202, such as in position number 4 in FIG. 3, which is the last position of the stack 196, facing away from an entry opening 204 of the optical detector 110. The at least one additional imaging device 202, which may be embodied in an alternative way as compared to the at least one optical sensor 112 as defined in claim 1, as an example, may be an organic or an inorganic or a hybrid imaging device. As an example, the additional imaging device 202 may be or may comprise an inorganic semiconductor imaging device, such as a CCD chip and/or a CMOS chip. Thus, as an example, the stack 196 may be a combination of organic and inorganic imaging devices 198. Alternatively, the stack 196 may comprise optical sensors 112 as defined in claim 1, only.

In case a stack 196 is provided, preferably, at least one of the imaging devices 198 is transparent. Thus, as an example, all imaging devices 198 except for the last imaging device 198 facing away from the entry opening 204 may be embodied as fully or partially transparent imaging devices 198. As discussed above, this transparency is easily feasible by using transparent first and second electrodes 120, 130. As for the last imaging device 198, no transparency is required. Thus, as discussed above, this last imaging device 198 (such as imaging device 198 number 4 in FIG. 3) may be an inorganic semiconductor imaging device 198, which not necessarily has to provide transparent properties. Thus, typical high-resolution imaging devices may be used, as known e.g. in camera technologies.

Further, specifically in case a stack 196 of imaging devices 198 is provided, the imaging devices 198 of the stack 196 or at least two of the imaging devices 198 may provide different spectral sensitivities. Thus, as an example, the optical sensors 112 may provide different types of organic dyes 178, having different absorption properties. Thus, as an example, the organic dye 178 of imaging device number 1 may absorb in the blue spectral range, imaging device number 2 may absorb in the green spectral range, and imaging device number 3 may absorb in the red spectral range. Alternatively, any arbitrary permutations of these absorption properties may be possible. The last imaging device 198 may have a broad-band spectral sensitivity, in order to generate an integrating signal over the whole spectral range. Thus, by comparing images from the different imaging devices 198, color information on a light beam 206 entering the optical detector 110 may be provided. As an example, signals of one imaging device 198, such as integrated signals, may be divided by sum signals of all imaging devices 198 and/or by one or more signals of the additional imaging device 202, in order to provide color information.

The optical detector 110 may be adapted to take an image of the light beam 206 at different positions along the optical axis 202, such as at different focal planes. By comparing these images, various types of information may be derived from the images generated by the imaging devices 198, such as position information on an object emitting the at least one light beam 206. In order to evaluate this information, the optical detector 110 may, besides the one or more readout devices 114, comprise one or more controllers 208 in order to evaluate images created by the imaging devices 198. The one or more controllers 208 may form an evaluation device 216 and/or may be part of an evaluation device 216 which, besides, may also comprise the one or more readout devices 114. The above-mentioned at least one data memory 166 may be part of the controller 208 and/or the evaluation device 216.

As discussed above, the optical detector 110 may further comprise one or more optical elements 210, such as one or more optical elements 210 adapted for changing beam-propagation properties of the light beam 206. As an example, the optical element 210 may comprise one or more focusing and/or defocusing lenses. The optical detector 110 may further comprise a housing 212 in which the imaging devices 198 are located, such as a light-tight housing.

Figure 4:
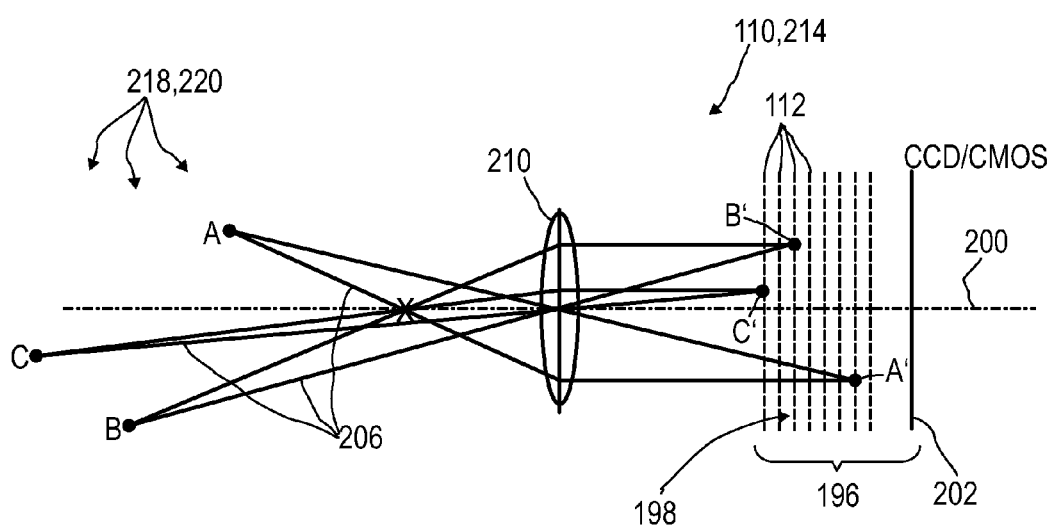
FIG. 4 shows a schematic setup of an optical detector embodied as a light-field camera.

As outlined above, the optical detector 110 may be adapted to take an image of the light beam 206 at different positions along the optical axis 202, such as at different focal planes. By comparing these images, various types of information may be derived from the images generated, such as position information on an object emitting the at least one light beam 206. This possibility is symbolically shown in FIG. 4 which, basically, repeats the setup of FIG. 3. Therein, one or more objects 218, denoted by A, B and C, and/or one or more beacon devices 220 attached to, integrated into or held by the object's 218 emit and/or reflect light beams 206 towards the optical detector 110.

The optical detector 110, in this embodiment or other embodiments, may be set up to be used as a light-field camera. Basically, the setup shown in FIG. 4 may correspond to the embodiment shown in FIG. 3 or any other embodiment of the present invention. The optical detector 110, as outlined above, comprises the stack 196 of optical sensors 112, also referred to as pixelated sensors, which specifically may be transparent. As an example, pixelated organic optical sensors may be used, such as organic solar cells, specifically sDSCs. In addition, the detector 110 and, specifically, the stack 196, may comprise at least one additional imaging device 202, such as an intransparent imaging device 202, such as a CCD and/or a CMOS imaging device. The optical detector 110 may further comprise at least one optical element 210, such as at least one lens or lens system, adapted for imaging the objects 218.

As outlined above, the detector 110 in the embodiment shown herein is suited to act as a light-field camera. Thus, light-beams 206 propagating from the one or more objects 218 or beacon devices may be focused by the optical element 210 into corresponding images, denoted by A', B' and C' in FIG. 4. By using the stack 196 of optical sensors 112, a three-dimensional image may be captured. Thus, specifically in case the optical sensors 112 are FiP-sensors, i.e. sensors for which the sensor signals are dependent on the photon density, the focal points for each of the light beams 206 may be determined by evaluating sensor signals of neighboring optical sensors 112. Thus, by evaluating the sensor signals of the stack 196, beam parameters of the various light beams 206 may be determined, such as a focal position, spreading parameters or other parameters. Thus, as an example, each light beam 206 and/or one or more light beams 206 of interest may be determined in terms of their beam parameters and may be represented by a parameter representation and/or vector representation. Thus, since the optical qualities and properties of the optical element 210 are generally known, as soon as the beam parameters of the light beams 206 are determined by using the stack 196, a scene captured by the optical detector 110, containing one or more objects 218, may be represented by a simplified set of beam parameters. For further details of the light-field camera shown in FIG. 4, reference may be made to the description of the various possibilities given above.

Further, as outlined above, the optical sensors 112 of the stack 196 of optical sensors may have identical or different wavelength sensitivities. Thus, the stack 196 may comprise two types of optical sensors 112, such as in an alternating fashion. Therein, a first type and a second type of optical sensors 112 may be provided in the stack 196. The optical sensors 112 of the first type and the second type specifically may be arranged in an alternating fashion along the optical axis 200. The optical sensors 112 of the first type may have a first spectral sensitivity, such as a first absorption spectrum, such as a first absorption spectrum defined by a first dye, and the optical sensors 112 of the second type may have a second spectral sensitivity different from the first spectral sensitivity, such as a second absorption spectrum, such as a second absorption spectrum defined by a second dye. By evaluating sensor signals of these two or more types of optical sensors 112, color information may be obtained. Thus, in addition to the beam parameters which may be derived, the two or more types of optical sensors 112 may allow for deriving additional color information, such as for deriving a full-color three-dimensional image. Thus, as an example, color information may be derived by comparing the sensor signals of the optical sensors 112 of different color with values stored in a look-up table. Thus, the setup of FIG. 4 may be embodied as a monochrome, a full-color or multicolor light-field camera 214.

Figure 5:
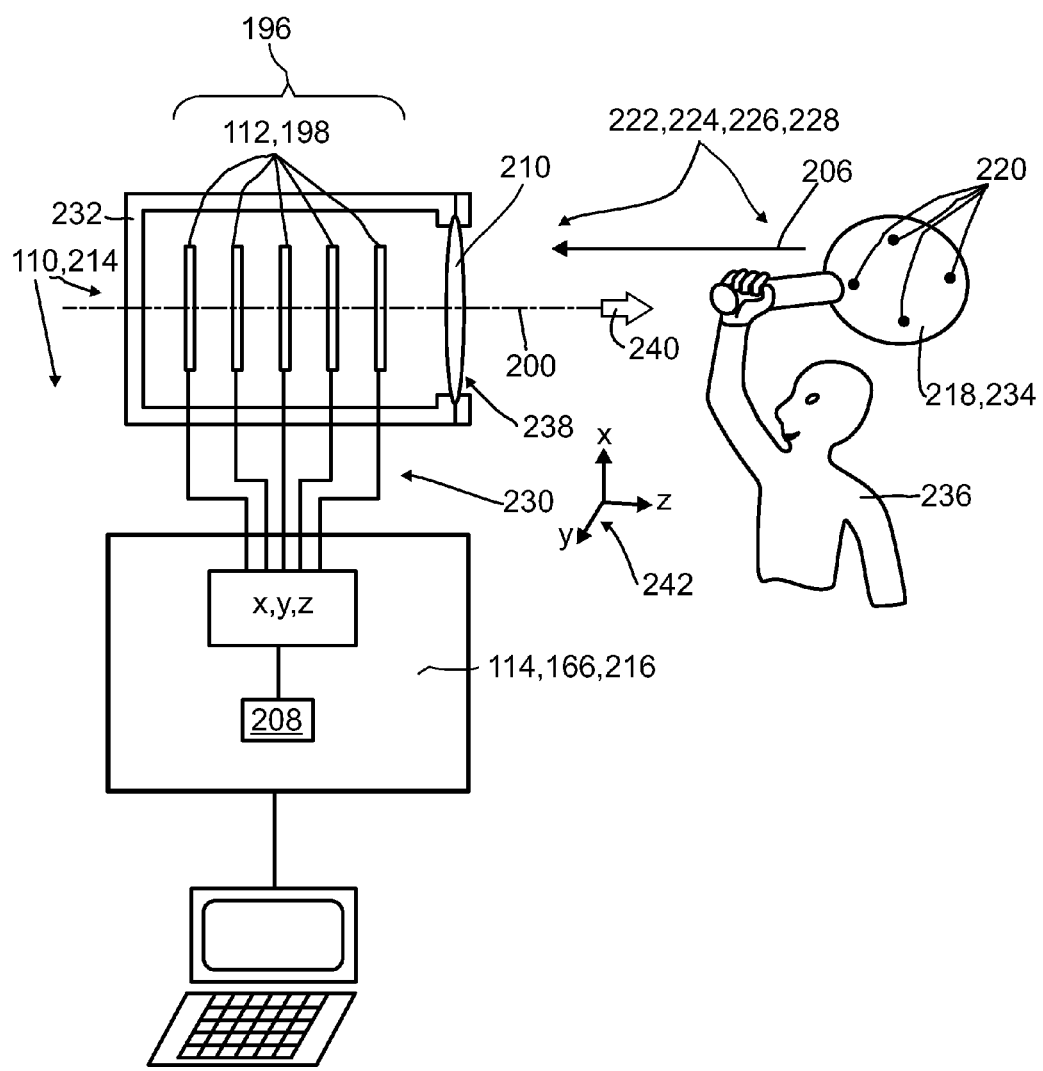
FIG. 5 shows a schematic setup of a detector system, a tracking system, a human-machine interface and an entertainment device using the optical detector according to the present invention.

As outlined above and as will be shown in further detail with reference to FIG. 5, the optical detector 110 according to the present invention, in one or more of the embodiments disclosed above, specifically may be part of one or more of: a camera 214, a detector system 222, a tracking system 224, a human-machine interface 226 or an entertainment device 228.

FIG. 5 shows, in a highly schematic illustration, an exemplary embodiment of the detector 110, having a plurality of the optical sensors 112. The detector 110 specifically may be embodied as a camera 214 or may be part of a camera 214. The camera 214 may be made for imaging, specifically for 3D imaging, and may be made for acquiring standstill images and/or image sequences such as digital video clips. Other embodiments are feasible. FIG. 5 further shows an embodiment of a detector system 222, which, besides the at least one detector 110, comprises one or more of the beacon devices 220, which, in this exemplary embodiment, are attached and/or integrated into an object 218, the position of which shall be detected by using the detector 110. FIG. 5 further shows an exemplary embodiment of a human-machine interface 226, which comprises the at least one detector system 222, and, further, an entertainment device 228, which comprises the human-machine interface 226. The figure further shows an embodiment of a tracking system 224 for tracking a position of the object 218, which comprises the detector system 222 and the controller 208 which, in this embodiment or other embodiments, may act as a track controller. The components of the devices and systems shall be explained in further detail in the following.

The detector 110, besides the one or more optical sensors 112, comprises the at least one readout device 114 which may be part of at least one evaluation device 216, as explained in detail above. The evaluation device 216 may be connected to the optical sensors 112 by one or more connectors 230 and/or one or more interfaces. Instead of using the at least one optional connector 230, the evaluation device 216 may fully or partially be integrated into the optical sensors 112 and/or into a housing 232 of the detector 110. Additionally or alternatively, the evaluation device 216 may fully or partially be designed as a separate device.

In this exemplary embodiment, the object 218, the position of which may be detected, may be designed as an article of sports equipment and/or may form a control element 234, the position of which may be manipulated by a user 236. As an example, the object 218 may be or may comprise a bat, a record, a club or any other article of sports equipment and/or fake sports equipment. Other types of objects 218 are possible. Further, the user 236 himself or herself may be considered as the object 218, the position of which shall be detected.

As outlined above, the detector 110 comprises the plurality of optical sensors 112. The optical sensors 112 may be located inside the housing 232 of the detector 110. Further, at least one optical element 210 may be comprised, such as one or more optical systems, preferably comprising one or more lenses. An opening 238 inside the housing 232, which, preferably, is located concentrically with regard to an optical axis 200 of the detector 110, preferably defines a direction of view 240 of the detector 110. A coordinate system 242 may be defined, in which a direction parallel or antiparallel to the optical axis 200 is defined as a longitudinal direction, whereas directions perpendicular to the optical axis 200 may be defined as transversal directions. In the coordinate system 242, symbolically depicted in FIG. 5, a longitudinal direction is denoted by z, and transversal directions are denoted by x and y, respectively. Other types of coordinate systems 242 are feasible.

The detector 110 may comprise one or more of the optical sensors 112. Preferably, as depicted in FIG. 5, a plurality of optical sensors 112 is comprised, which, more preferably, are stacked along the optical axis 200, in order to form a sensor stack 196. In the embodiment shown in FIG. 5, five optical sensors 112 are depicted. It shall be noted, however, that embodiments having a different number of optical sensors 112 are feasible.

Figure 6:
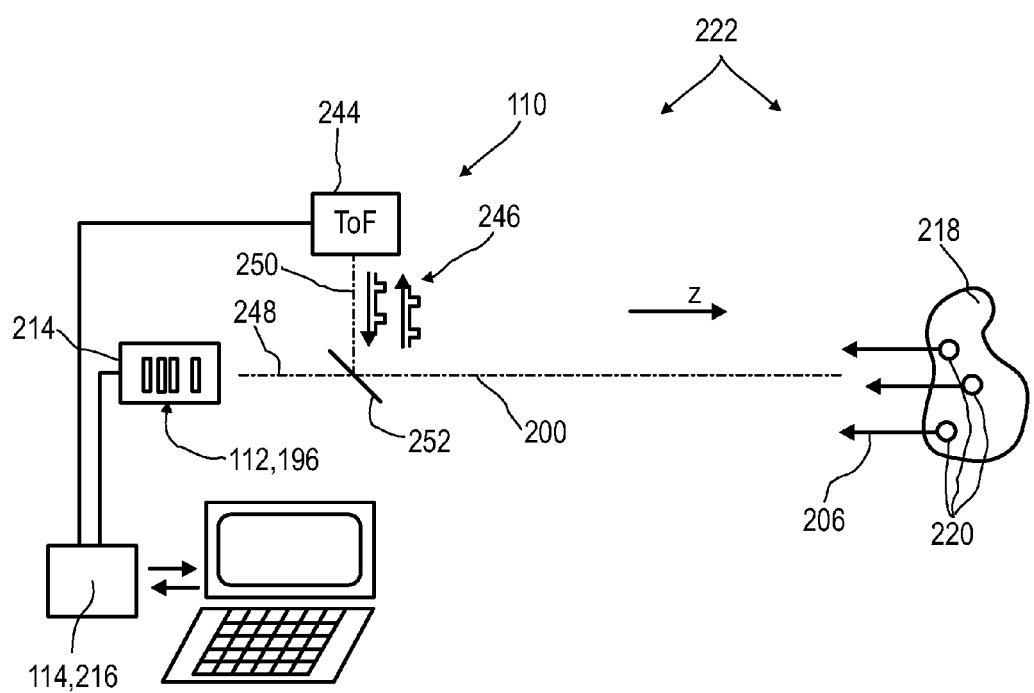
FIG. 6 shows an integration of at least one time-of-flight detector into the detector according to the present invention.

As outlined above, the detector 110 may further comprise one or more time-of-flight detectors. This possibility is shown in FIG. 6. The detector 110, firstly, comprises at least one component comprising the one or more pixelated optical sensors 112, such as a sensor stack 196. In the embodiment shown in FIG. 6, the at least one unit comprising the optical sensors 112 is denoted as a camera 214. It shall be noted, however, that other embodiments are feasible. For details of potential setups of the camera 214, reference may be made to the setups shown above, such as the embodiment shown in FIG. 3 or 5, or other embodiments of the detector 110. Basically any setup of the detector 110 as disclosed above may also be used in the context of the embodiment shown in FIG. 6.

Further, the detector 110 comprises at least one time-of-flight (ToF) detector 244. As shown in FIG. 6, the ToF detector 244 may be connected to the readout device 114 and/or the evaluation device 216 of the detector 110 or may be provided with a separate evaluation device. As outlined above, the ToF detector 244 may be adapted, by emitting and receiving pulses 246, as symbolically depicted in FIG. 6, to determine a distance between the detector 110 and the object 218 or, in other words, a z-coordinate along the optical axis 200.

The at least one optional ToF detector 244 may be combined with the at least one detector having the pixelated optical sensors 112 such as the camera 214 in various ways. Thus, as an example and as shown in FIG. 6, the at least one camera 214 may be located in a first partial beam path 248, and the ToF detector 244 may be located in a second partial beam path 250. The partial beam paths 248, 250 may be separated and/or combined by at least one beam-splitting element 252. As an example, the beam-splitting element 252 may be a wavelength-indifferent beam-splitting element 252, such as a semi-transparent mirror. Additionally or alternatively, a wavelength-dependency may be provided, thereby allowing for separating different wavelengths. As an alternative, or in addition to the setup shown in FIG. 6, other setups of the ToF detector 244 may be used. Thus, the camera 214 and the ToF detector 244 may be arranged in line, such as by arranging the ToF detector 244 behind the camera 214. In this case, preferably, no intransparent optical sensor is provided in the camera 214, and all optical sensors 112 are at least partially transparent. Again, as an alternative or in addition, the ToF detector 244 may also be arranged independently from the camera 214, and different light paths may be used, without combining the light paths. Various setups are feasible.

As outlined above, the ToF detector 244 and the camera 214 may be combined in a beneficial way, for various purposes, such as for resolving ambiguities, for increasing the range of weather conditions in which the optical detector 110 may be used, or for extending a distance range between the object 218 and the optical detector 110. For further details, reference may be made to the description above.

LIST OF REFERENCE NUMBERS 110 optical detector
112 optical sensor
114 readout device
116 substrate
118 photosensitive layer setup
120 first electrode
122 bottom electrode
124 first electrode stripes
126 bottom electrode stripes
128 contact pad
130 second electrode
132 top electrode
134 second electrode stripe
136 top electrode stripe
138 contact pad
140 photovoltaic material
142 matrix
144 pixel
146 row
148 column
150 first leads
152 second leads
154 electrical measurement devices
156 first port
158 second port
160 switching device
162 combined lead
164 analogue-digital-converter
166 data memory
168 data fields
170 image
172 encapsulation
174 dense layer of n-semiconducting metal oxide
176 layer of nano-porous n-semiconducting metal oxide
178 organic dye
180 p-semiconducting organic material
182 illumination
184 metal layer
186 layer of electrically conductive polymer
188 electrically conductive polymer stripes
190 metal electrode stripes
192 separation element, separator
194 sharp edge
196 stack
198 imaging device
200 optical axis
202 additional imaging device
204 entry opening
206 light beam
208 controller
210 optical element
212 housing
214 camera
216 evaluation device
218 object
220 beacon device
222 detector system
224 tracking system
226 human-machine interface
228 entertainment device
230 connector
232 housing
234 control element
236 user
238 opening
240 direction of view
242 coordinate system
244 time-of-flight detector
246 pulses
248 first partial beam path
250 second partial beam path
252 beam-splitting element The claims are as follows:

1. An optical detector, comprising:
an optical sensor, comprising a substrate and at least one solid photosensitive layer setup disposed thereon, the solid photosensitive layer setup comprising at least one first electrode, at least one second electrode and at least one solid photovoltaic material that, under illumination by light in one or more of the visible, ultraviolet, and infrared spectral range, generates an electrical signal, sandwiched in between the first electrode and the second electrode, wherein the solid photovoltaic material comprises at least one organic material, wherein the first electrode comprises a plurality of first electrode stripes and wherein the second electrode comprises a plurality of second electrode stripes, wherein the first electrode stripes and the second electrode stripes intersect such that a matrix of pixels is formed at intersections of the first electrode stripes and the second electrode stripes; and
at least one readout device, the readout device comprising a plurality of electrical measurement devices connected to the second electrode stripes and a switching device for subsequently connecting the first electrode stripes to the electrical measurement devices,
wherein the top electrode comprises a plurality of metal electrode stripes, and
wherein the metal electrode stripes are separated by electrically insulating separators.

2. The optical detector according to claim 1, wherein the matrix of pixels comprises rows defined by the first electrode stripes and columns defined by the second electrode stripes, wherein each electrical measurement device is connected to a column, such that electrical signals for the pixels of each row are measured simultaneously, wherein the switching device is configured to subsequently connect the rows to the electrical measurement devices.

3. The optical detector according to claim 1, wherein the electrical measurement devices are analogue measurement devices, wherein the electrical measurement devices further comprise analogue-digital converters.

4. The optical detector according to claim 1, wherein the readout device further comprises at least one data memory for storing measurement values for the pixels of the matrix of pixels.

5. A camera for imaging at least one object, the camera comprising at least one optical detector according to claim 1.

6. A method of taking at least one image of an object via the optical detector according to claim 1, the method comprising:
imaging the object onto the optical sensor,
subsequently connecting the first electrode stripes to the electrical measurement devices, wherein the electrical measurement devices, for each first electrode stripe, measure electrical signals for the pixels of the respective first electrode stripe, and
composing the electrical signals of the pixels to form an image.

7. The optical detector according to claim 1, suitable for a position measurement in traffic technology; an entertainment application; a security application; a safety application; a human-machine interface application; a tracking application; a photography application; or an application in combination with at least one time-of-flight detector.

8. The optical detector according to claim 1. wherein the solid photosensitive layer setup is a layer setup of a solid dye-sensitized solar cell.

9. The optical detector according to claim 1, wherein the optical sensor comprises an n-semiconducting metal oxide, wherein the electrically insulating separators are deposited on top of the n-semiconducting metal oxide.

10. The optical detector according to claim 9, wherein the optical sensor further comprises at least one solid p-semiconducting organic material deposited on top of the n-semiconducting metal oxide, the solid p-semiconducting organic material being sub-divided into a plurality of stripe-shaped regions by the electrically insulating separators.

11. The optical detector according to claim 9, wherein the n-semiconducting metal oxide is a nano-porous n-semiconducting metal oxide.

12. The optical detector according to claim 1, comprising a stack of at least two imaging devices, wherein at least one of the imaging devices is the optical sensor.

13. The optical detector according to claim 12, wherein the stack further comprises at least one additional imaging device.

14. The optical detector according to claim 12, wherein the stack comprises at least two imaging devices having different spectral sensitivities.

15. A detector system for determining a position of at least one object, the detector system comprising at least one optical detector according to claim 1, and at least one beacon device configured to direct at least one light beam towards the optical detector, wherein the beacon device is at least one of a device attachable to the object, a device holdable by the object and a device integratable into the object.

16. A tracking system for tracking a position of at least one movable object, the tracking system comprising at least one detector system according to claim 15, and at least one track controller, wherein the track controller is configured to track a series of positions of the object at specific points in time.

17. A human-machine interface for exchanging at least one item of information between a user and a machine, the human-machine interface comprising at least one detector system according to claim 15, wherein the at least one beacon device is configured to be at least one of directly or indirectly attached to the user and held by the user, wherein the human-machine interface is designed to determine at least one position of the user via the detector system, wherein the human-machine interface is designed to assign to the position at least one item of information.

18. An entertainment device for carrying out at least one entertainment function, the entertainment device comprising at least one human-machine interface according to claim 17, wherein the entertainment device is designed to enable at least one item of information to be input by a player via the human-machine interface, wherein the entertainment device is designed to vary the entertainment function in accordance with the information.

19. The optical detector according to claim 1, wherein one of the first electrode and the second electrode is a bottom electrode and wherein the other of the first electrode and the second electrode is a top electrode, wherein the bottom electrode is applied to the substrate, wherein the solid photovoltaic material is applied to the bottom electrode and at least partially covers the bottom electrode and wherein the top electrode is applied to the solid photovoltaic material.

20. The optical detector according to claim 19, wherein the top electrode is transparent.

21. The optical detector according to claim 20, wherein the top electrode comprises at least one metal layer.

22. The optical detector according to claim 21, wherein the top electrode further comprises at least one electrically conductive polymer embedded in between the solid photovoltaic material and the metal layer.

* * * * *